(12) United States Patent
Wang et al.

(10) Patent No.: US 12,302,691 B2
(45) Date of Patent: May 13, 2025

(54) OPTO-ELECTRONIC DEVICE INCLUDING AN AUXILIARY ELECTRODE AND A PARTITION

(71) Applicant: OTI Lumionics Inc., Mississauga (CA)

(72) Inventors: Zhibin Wang, Toronto (CA); Yi-Lu Chang, Scarborough (CA); Qi Wang, North York (CA)

(73) Assignee: OTI Lumionics Inc., Mississauga (CA)

( * ) Notice: Subject to any disclaimer, the term of this patent is extended or adjusted under 35 U.S.C. 154(b) by 415 days.

(21) Appl. No.: 17/634,232

(22) PCT Filed: Aug. 7, 2020

(86) PCT No.: PCT/IB2020/057458
§ 371 (c)(1),
(2) Date: Feb. 9, 2022

(87) PCT Pub. No.: WO2021/028800
PCT Pub. Date: Feb. 18, 2021

(65) Prior Publication Data
US 2022/0278299 A1 Sep. 1, 2022

Related U.S. Application Data

(60) Provisional application No. 62/885,171, filed on Aug. 9, 2019, provisional application No. 62/886,289, filed (Continued)

(51) Int. Cl.
*H10K 50/82* (2023.01)
*H10K 50/824* (2023.01)
(Continued)

(52) U.S. Cl.
CPC ......... *H10K 50/824* (2023.02); *H10K 59/122* (2023.02); *H10K 71/621* (2023.02)

(58) Field of Classification Search
CPC ... H10K 50/824; H10K 59/122; H10K 71/621
(Continued)

(56) References Cited

U.S. PATENT DOCUMENTS

| | | |
|---|---|---|
| 3,928,480 A | 12/1975 | Tabushi et al. |
| 4,022,928 A | 5/1977 | Piwcyzk |

(Continued)

FOREIGN PATENT DOCUMENTS

| | | |
|---|---|---|
| CA | 2890253 A1 | 5/2014 |
| CN | 101299419 A | 11/2008 |

(Continued)

OTHER PUBLICATIONS

Cite the machine translation. Qiu J (KR-20190141239-A).*

(Continued)

*Primary Examiner* — Phuc T Dang
(74) *Attorney, Agent, or Firm* — Foley & Lardner LLP

(57) ABSTRACT

An opto-electronic device having a plurality of layers, comprising a nucleation-inhibiting coating (MC) disposed on a first layer surface in a first portion of a lateral aspect thereof. In the first portion, the device comprises a first electrode, a second electrode and a semiconducting layer between them. The second electrode lies between the NIC and the semiconducting layer in the first portion. In the second portion, a conductive coating is disposed on a second layer surface. The first portion is substantially devoid of the conductive coating. The conductive coating is electrically coupled to the second electrode and to a third electrode in a sheltered region of a partition in the device.

33 Claims, 39 Drawing Sheets

Related U.S. Application Data on Aug. 13, 2019, provisional application No. 62/933,924, filed on Nov. 11, 2019, provisional application No. 63/013,501, filed on Apr. 21, 2020.

(51) Int. Cl.
*H10K 59/122* (2023.01)
*H10K 71/00* (2023.01)

(58) Field of Classification Search
USPC .......................................................... 257/99
See application file for complete search history.

(56) References Cited

U.S. PATENT DOCUMENTS

| | | |
|---|---|---|
| 4,832,983 A | 5/1989 | Nagatomi et al. |
| 5,015,758 A | 5/1991 | Pilgrim et al. |
| 5,399,936 A | 3/1995 | Namiki et al. |
| 6,016,033 A | 1/2000 | Jones et al. |
| 6,407,408 B1 | 6/2002 | Zhou et al. |
| 6,465,115 B2 | 10/2002 | Shi et al. |
| 6,472,468 B1 | 10/2002 | Omura |
| 6,538,374 B2 | 3/2003 | Hosokawa |
| 6,787,468 B2 | 9/2004 | Kim et al. |
| 6,835,950 B2 | 12/2004 | Brown et al. |
| 6,900,470 B2 | 5/2005 | Kobayashi et al. |
| 6,927,270 B2 | 8/2005 | Lichtenhan et al. |
| 6,995,035 B2 | 2/2006 | Cok et al. |
| 7,018,713 B2 | 3/2006 | Padiyath |
| 7,099,299 B2 | 8/2006 | Liang et al. |
| 7,105,298 B2 | 9/2006 | Liu et al. |
| 7,175,815 B2 | 2/2007 | Yamasaki et al. |
| 7,193,015 B1 | 3/2007 | Mabry et al. |
| 7,217,683 B1 | 5/2007 | Blanski et al. |
| 7,319,129 B2 | 1/2008 | Yoshida et al. |
| 7,363,308 B2 | 4/2008 | Dillon et al. |
| 7,402,948 B2 | 7/2008 | Yamazaki et al. |
| 7,427,783 B2 | 9/2008 | Lee et al. |
| 7,449,539 B2 | 11/2008 | Morimoto et al. |
| 7,491,975 B2 | 2/2009 | Kubota |
| 7,495,389 B2 | 2/2009 | Noguchi et al. |
| 7,701,132 B2 | 4/2010 | Oh |
| 7,728,510 B2 | 6/2010 | Oh |
| 7,816,861 B2 | 10/2010 | Choi et al. |
| 7,839,083 B2 | 11/2010 | Kubota |
| 7,897,667 B2 | 3/2011 | Mabry et al. |
| 7,947,519 B2 | 5/2011 | Lee et al. |
| 7,956,351 B2 | 6/2011 | Choi |
| 7,986,672 B2 | 7/2011 | Tiedemann et al. |
| 8,004,180 B2 | 8/2011 | Seo |
| 8,030,838 B2 | 10/2011 | Kwak et al. |
| 8,044,580 B2 | 10/2011 | Yamazaki et al. |
| 8,089,066 B2 | 1/2012 | Yamazaki et al. |
| 8,115,376 B2 | 2/2012 | Fujioka et al. |
| 8,232,350 B2 | 7/2012 | Fujita et al. |
| 8,237,351 B2 | 8/2012 | Sung et al. |
| 8,310,149 B2 | 11/2012 | Lifka et al. |
| 8,318,878 B2 | 11/2012 | Sudo et al. |
| 8,343,637 B2 | 1/2013 | Parham et al. |
| 8,362,469 B2 | 1/2013 | Suh |
| 8,679,647 B2 | 3/2014 | Pflumm et al. |
| 8,703,303 B2 | 4/2014 | Yamamoto et al. |
| 8,766,306 B2 | 7/2014 | Lifka et al. |
| 8,795,847 B2 | 8/2014 | Heil et al. |
| 8,809,838 B2 | 8/2014 | Jeong et al. |
| 8,852,756 B2 | 10/2014 | Vestweber et al. |
| 8,872,206 B2 | 10/2014 | Chung et al. |
| 8,895,972 B2 | 11/2014 | Chung et al. |
| 8,940,568 B2 | 1/2015 | Mohan et al. |
| 8,957,413 B2 | 2/2015 | Song et al. |
| 8,963,137 B2 | 2/2015 | Lee et al. |
| 8,963,414 B2 | 2/2015 | Sawabe |
| 8,986,852 B2 | 3/2015 | Stoessel et al. |
| 8,994,010 B2 | 3/2015 | Choi et al. |
| 9,018,621 B2 | 4/2015 | Park et al. |
| 9,024,307 B2 | 5/2015 | Lee |
| 9,040,962 B2 | 5/2015 | Adamovich et al. |
| 9,051,344 B2 | 6/2015 | Lin et al. |
| 9,064,755 B2 | 6/2015 | Park et al. |
| 9,076,993 B2 | 7/2015 | Kim et al. |
| 9,088,004 B2 | 7/2015 | Chung et al. |
| 9,093,403 B2 | 7/2015 | Kim et al. |
| 9,093,669 B2 | 7/2015 | Park et al. |
| 9,105,865 B2 | 8/2015 | Chung et al. |
| 9,105,867 B2 | 8/2015 | Verschuuren et al. |
| 9,117,402 B2 | 8/2015 | Lee et al. |
| 9,126,970 B2 | 9/2015 | Pflumm |
| 9,231,030 B2 | 1/2016 | Choi et al. |
| 9,245,934 B2 | 1/2016 | Chung et al. |
| 9,246,123 B2 | 1/2016 | Kim et al. |
| 9,287,339 B2 | 3/2016 | Lee et al. |
| 9,293,515 B2 | 3/2016 | Choi |
| 9,312,312 B1 | 4/2016 | Tsai et al. |
| 9,331,308 B2 | 5/2016 | Choi et al. |
| 9,444,064 B2 | 9/2016 | Kaiser et al. |
| 9,450,027 B2 | 9/2016 | Pang et al. |
| 9,450,033 B2 | 9/2016 | Suh et al. |
| 9,478,591 B2 | 10/2016 | Nam et al. |
| 9,570,471 B2 | 2/2017 | Heo et al. |
| 9,595,681 B2 | 3/2017 | Mujica-Fernaud |
| 9,624,193 B2 | 4/2017 | Aihara |
| 9,627,645 B2 | 4/2017 | Cui et al. |
| 9,660,195 B2 | 5/2017 | Kawamura et al. |
| 9,711,751 B2 | 7/2017 | Prushinskiy et al. |
| 9,748,318 B2 | 8/2017 | Shim et al. |
| 9,776,983 B2 | 10/2017 | Marchionni et al. |
| 9,859,520 B2 | 1/2018 | Kim |
| 9,892,672 B2 | 2/2018 | Lee et al. |
| 9,954,039 B2 | 4/2018 | Im et al. |
| 9,960,216 B2 | 5/2018 | Lee et al. |
| 9,966,554 B2 | 5/2018 | Lee et al. |
| 10,032,843 B2 | 7/2018 | Lee et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,177,206 B2 | 1/2019 | Jung et al. |
| 10,181,573 B2 | 1/2019 | Im |
| 10,186,568 B2 | 1/2019 | Kim et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,276,641 B2 | 4/2019 | Lou |
| 10,297,762 B2 | 5/2019 | Zeng et al. |
| 10,361,375 B2 | 7/2019 | Zeng et al. |
| 10,501,583 B2 | 12/2019 | Song et al. |
| 10,700,304 B2 | 6/2020 | Helander et al. |
| 11,145,702 B2 | 10/2021 | Chang et al. |
| 2002/0090811 A1 | 7/2002 | Kim et al. |
| 2002/0189392 A1 | 12/2002 | Molstad |
| 2003/0196987 A1 | 10/2003 | Kung et al. |
| 2006/0125390 A1 | 6/2006 | Oh |
| 2007/0077349 A1 | 4/2007 | Newman et al. |
| 2007/0178405 A1 | 8/2007 | Kanda et al. |
| 2009/0033208 A1 | 2/2009 | Nagayama et al. |
| 2009/0199903 A1 | 8/2009 | Oyamada et al. |
| 2010/0078628 A1 | 4/2010 | Chi et al. |
| 2010/0193768 A1 | 8/2010 | Habib |
| 2010/0244197 A1 | 9/2010 | Arena et al. |
| 2011/0006289 A1 | 1/2011 | Mizuki et al. |
| 2011/0094889 A1 | 4/2011 | Shin et al. |
| 2011/0102308 A1 | 5/2011 | Nakamura et al. |
| 2011/0175031 A1 | 7/2011 | Matsunami et al. |
| 2011/0186820 A1 | 8/2011 | Kim et al. |
| 2011/0203517 A1 | 8/2011 | Freudenberg et al. |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0146030 A1 | 6/2012 | You et al. |
| 2012/0187541 A1 | 7/2012 | Arena et al. |
| 2013/0049024 A1 | 2/2013 | Choi et al. |
| 2013/0056784 A1 | 3/2013 | Lee et al. |
| 2013/0112952 A1 | 5/2013 | Adamovich et al. |

(56) References Cited

U.S. PATENT DOCUMENTS

| | | |
|---|---|---|
| 2014/0070236 A1 | 3/2014 | Chen et al. |
| 2014/0103306 A1 | 4/2014 | Moon et al. |
| 2014/0110680 A1 | 4/2014 | Choe |
| 2014/0183483 A1 | 7/2014 | Kim et al. |
| 2014/0186983 A1 | 7/2014 | Kim et al. |
| 2014/0231761 A1 | 8/2014 | Kim et al. |
| 2014/0299866 A1 | 10/2014 | Ruske et al. |
| 2014/0353601 A1 | 12/2014 | Cho et al. |
| 2015/0076456 A1 | 3/2015 | Choi et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |
| 2015/0287846 A1 | 10/2015 | Helander et al. |
| 2015/0376768 A1 | 12/2015 | Veres et al. |
| 2016/0013438 A1 | 1/2016 | Im et al. |
| 2016/0104859 A1 | 4/2016 | Kim et al. |
| 2016/0149156 A1 | 5/2016 | Kim et al. |
| 2016/0163770 A1 | 6/2016 | Kim et al. |
| 2016/0180763 A1 | 6/2016 | Park et al. |
| 2016/0211454 A1 | 7/2016 | Kim et al. |
| 2016/0293888 A1 | 10/2016 | Shim et al. |
| 2016/0351638 A1 | 12/2016 | Im et al. |
| 2017/0018733 A1 | 1/2017 | Jin et al. |
| 2017/0033166 A1 | 2/2017 | Shim et al. |
| 2017/0062755 A1 | 3/2017 | Im et al. |
| 2017/0125495 A1 | 5/2017 | Lee et al. |
| 2017/0125506 A1 | 5/2017 | Kim |
| 2017/0155078 A1 | 6/2017 | Lee |
| 2017/0170246 A1 | 6/2017 | Im et al. |
| 2017/0186831 A1 | 6/2017 | Nam et al. |
| 2017/0256747 A1 | 9/2017 | Lee et al. |
| 2017/0317154 A1 | 11/2017 | Heo |
| 2017/0338438 A1 | 11/2017 | Kwon et al. |
| 2018/0006264 A1 | 1/2018 | Lee et al. |
| 2018/0040685 A1 | 2/2018 | Yeo et al. |
| 2018/0061323 A1 | 3/2018 | Kwon et al. |
| 2018/0083217 A1 | 3/2018 | Chung et al. |
| 2018/0090063 A1 | 3/2018 | Ying et al. |
| 2018/0102499 A1 | 4/2018 | Pyo et al. |
| 2018/0123078 A1 | 5/2018 | Byun et al. |
| 2018/0158881 A1 | 6/2018 | Lim et al. |
| 2018/0166518 A1 | 6/2018 | Kim |
| 2018/0198080 A1 | 7/2018 | Noh et al. |
| 2018/0212060 A1 | 7/2018 | Kang et al. |
| 2018/0219058 A1 | 8/2018 | Xiang et al. |
| 2018/0226455 A1 | 8/2018 | Kim et al. |
| 2018/0261797 A1 | 9/2018 | Lee |
| 2018/0294436 A1 | 10/2018 | Choi et al. |
| 2018/0309085 A1 | 10/2018 | Park et al. |
| 2018/0337219 A1 | 11/2018 | Rhee et al. |
| 2018/0366678 A1 | 12/2018 | Chi et al. |
| 2019/0081111 A1 | 3/2019 | Lee et al. |
| 2019/0088204 A1 | 3/2019 | Zhang et al. |
| 2019/0130822 A1 | 5/2019 | Jung et al. |
| 2019/0131365 A1 | 5/2019 | Jung |
| 2019/0207156 A1 | 7/2019 | Gil |
| 2019/0237517 A1 | 8/2019 | Hack |
| 2019/0250450 A1 | 8/2019 | Li |
| 2019/0253591 A1 | 8/2019 | Chen et al. |
| 2019/0273125 A1 | 9/2019 | Takechi |
| 2019/0317629 A1 | 10/2019 | Jung et al. |
| 2019/0325805 A1 | 10/2019 | Moon et al. |
| 2019/0340980 A1 | 11/2019 | Yum et al. |
| 2019/0341435 A1 | 11/2019 | Chang et al. |
| 2019/0341575 A1 | 11/2019 | Chung et al. |
| 2019/0348627 A1 | 11/2019 | Lee et al. |
| 2019/0355288 A1 | 11/2019 | Choi et al. |
| 2019/0386242 A1 | 12/2019 | Choi et al. |
| 2020/0035951 A1 | 1/2020 | Cheon et al. |
| 2020/0044197 A1 | 2/2020 | Shedletsky et al. |
| 2020/0064968 A1 | 2/2020 | Kim et al. |
| 2020/0075683 A1 | 3/2020 | Polyakov et al. |
| 2020/0075693 A1 | 3/2020 | Polyakov et al. |
| 2020/0075864 A1 | 3/2020 | Helander et al. |
| 2020/0099836 A1 | 3/2020 | Chao |
| 2020/0105843 A1 | 4/2020 | Baek et al. |
| 2020/0111401 A1 | 4/2020 | Zhao et al. |
| 2020/0124927 A1 | 4/2020 | Kim et al. |
| 2020/0133040 A1 | 4/2020 | Bang et al. |
| 2020/0136077 A1 | 4/2020 | Lee et al. |
| 2020/0159284 A1 | 5/2020 | Mathew et al. |
| 2020/0176530 A1 | 6/2020 | Baek |
| 2020/0194676 A1 | 6/2020 | Chang et al. |
| 2020/0194730 A1 | 6/2020 | Park et al. |
| 2020/0209729 A1 | 7/2020 | Chen et al. |
| 2020/0212130 A1 | 7/2020 | Kim et al. |
| 2020/0212131 A1 | 7/2020 | Kim et al. |
| 2020/0219915 A1 | 7/2020 | Kim et al. |
| 2020/0265798 A1 | 8/2020 | Choi et al. |
| 2020/0286972 A1 | 9/2020 | Seo et al. |
| 2020/0312926 A1 | 10/2020 | Bae et al. |
| 2020/0363894 A1 | 11/2020 | Park et al. |
| 2020/0365664 A1 | 11/2020 | Jeon et al. |
| 2020/0365667 A1 | 11/2020 | Jo et al. |
| 2020/0365674 A1 | 11/2020 | Jeon et al. |
| 2020/0381489 A1 | 12/2020 | Hwang et al. |
| 2020/0394964 A1 | 12/2020 | Hyun et al. |
| 2020/0403024 A1 | 12/2020 | Lin et al. |
| 2020/0409412 A1 | 12/2020 | Kim et al. |
| 2020/0411605 A1 | 12/2020 | Moon et al. |
| 2020/0411606 A1 | 12/2020 | Kim et al. |
| 2021/0020704 A1 | 1/2021 | Kim |
| 2021/0028244 A1 | 1/2021 | Jeong et al. |
| 2021/0028248 A1 | 1/2021 | Kim et al. |
| 2021/0036070 A1 | 2/2021 | Jeon et al. |
| 2021/0043875 A1 | 2/2021 | Lee et al. |
| 2021/0056884 A1 | 2/2021 | Choi et al. |
| 2021/0057494 A1 | 2/2021 | Chung et al. |
| 2021/0057496 A1 | 2/2021 | Bae et al. |
| 2021/0065620 A1 | 3/2021 | Yang et al. |
| 2021/0066648 A1 | 3/2021 | Chung et al. |
| 2021/0091157 A1 | 3/2021 | Oh et al. |
| 2021/0118961 A1 | 4/2021 | Lee et al. |
| 2021/0126059 A1 | 4/2021 | Chang et al. |
| 2021/0134901 A1 | 5/2021 | Sung et al. |
| 2021/0134926 A1 | 5/2021 | Song |
| 2021/0143231 A1 | 5/2021 | Chae et al. |
| 2021/0143244 A1 | 5/2021 | Kim et al. |
| 2021/0151544 A1 | 5/2021 | Kim et al. |
| 2021/0167320 A1 | 6/2021 | Kim et al. |
| 2021/0175297 A1 | 6/2021 | Kim |
| 2021/0175298 A1 | 6/2021 | Park |
| 2021/0183983 A1 | 6/2021 | Bang et al. |
| 2021/0183986 A1 | 6/2021 | Shin et al. |
| 2021/0183991 A1 | 6/2021 | Shin et al. |
| 2021/0184155 A1 | 6/2021 | Chae et al. |
| 2021/0191552 A1 | 6/2021 | Bok et al. |
| 2021/0193688 A1 | 6/2021 | Shin et al. |
| 2021/0193765 A1 | 6/2021 | Kim et al. |
| 2021/0193769 A1 | 6/2021 | Bok et al. |
| 2021/0193781 A1 | 6/2021 | Shim et al. |
| 2021/0200366 A1 | 7/2021 | Bok et al. |
| 2021/0202532 A1 | 7/2021 | Kim et al. |
| 2021/0202595 A1 | 7/2021 | Lee et al. |
| 2021/0202617 A1 | 7/2021 | Cho |
| 2021/0202628 A1 | 7/2021 | Kim et al. |
| 2021/0202641 A1 | 7/2021 | Shin et al. |
| 2021/0202680 A1 | 7/2021 | Shin et al. |
| 2021/0202683 A1 | 7/2021 | Lee et al. |
| 2021/0202880 A1 | 7/2021 | Kim et al. |
| 2021/0210564 A1 | 7/2021 | Chae et al. |
| 2021/0210584 A1 | 7/2021 | Youn et al. |
| 2021/0225292 A1 | 7/2021 | Park et al. |
| 2021/0225958 A1 | 7/2021 | Ko et al. |
| 2021/0225970 A1 | 7/2021 | Ryu et al. |
| 2021/0233976 A1 | 7/2021 | Lee |
| 2021/0240026 A1 | 8/2021 | Yeke Yazdandoost et al. |
| 2021/0241671 A1 | 8/2021 | Lee et al. |
| 2021/0241719 A1 | 8/2021 | Choi et al. |
| 2021/0249492 A1 | 8/2021 | Choi et al. |
| 2021/0249635 A1 | 8/2021 | Cho et al. |
| 2021/0257419 A1 | 8/2021 | Jang et al. |
| 2021/0257594 A1 | 8/2021 | Kim et al. |
| 2021/0265431 A1 | 8/2021 | Yun et al. |

(56) References Cited

U.S. PATENT DOCUMENTS

| | | |
|---|---|---|
| 2021/0280825 A1 | 9/2021 | Beon et al. |
| 2021/0313410 A1 | 10/2021 | Kim et al. |
| 2021/0320278 A1 | 10/2021 | Chung et al. |
| 2021/0351261 A1 | 11/2021 | Kim et al. |
| 2021/0359025 A1 | 11/2021 | Jung et al. |
| 2021/0376007 A1 | 12/2021 | Choi et al. |
| 2021/0376300 A1 | 12/2021 | Moon et al. |
| 2021/0376301 A1 | 12/2021 | Kim et al. |
| 2021/0408167 A1 | 12/2021 | Kim et al. |
| 2022/0013749 A1 | 1/2022 | Kim et al. |
| 2022/0045144 A1 | 2/2022 | Lee et al. |
| 2022/0123260 A1 | 4/2022 | Chung et al. |
| 2022/0223667 A1 | 7/2022 | Choi et al. |
| 2022/0392963 A1 | 12/2022 | Chen et al. |
| 2022/0398759 A1 | 12/2022 | Schindler et al. |
| 2023/0043940 A1 | 2/2023 | Bae et al. |

FOREIGN PATENT DOCUMENTS

| | | |
|---|---|---|
| CN | 101617064 A | 12/2009 |
| CN | 101730938 A | 6/2010 |
| CN | 102456713 A | 5/2012 |
| CN | 102738409 A | 10/2012 |
| CN | 104037359 A | 9/2014 |
| CN | 104769149 A | 7/2015 |
| CN | 204651324 U | 9/2015 |
| CN | 105094451 A | 11/2015 |
| CN | 105097877 A | 11/2015 |
| CN | 105206650 A | 12/2015 |
| CN | 106206995 A | 12/2016 |
| CN | 106992267 A | 7/2017 |
| CN | 107564945 A | 1/2018 |
| CN | 107808895 A | 3/2018 |
| CN | 108364967 A | 8/2018 |
| CN | 108376019 A | 8/2018 |
| CN | 108389878 A | 8/2018 |
| CN | 108418928 A | 8/2018 |
| CN | 108630830 A | 10/2018 |
| CN | 108767136 A | 11/2018 |
| CN | 108881531 A | 11/2018 |
| CN | 108900659 A | 11/2018 |
| CN | 109299631 A | 2/2019 |
| CN | 109461758 A | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 110061014 A | 7/2019 |
| CN | 110112182 A | 8/2019 |
| CN | 110144551 A | 8/2019 |
| CN | 110265474 A | 9/2019 |
| CN | 110275358 A | 9/2019 |
| CN | 110323259 A | 10/2019 |
| CN | 110365819 A | 10/2019 |
| CN | 110391348 A | 10/2019 |
| CN | 110416269 A | 11/2019 |
| CN | 110429117 A | 11/2019 |
| CN | 110444125 A | 11/2019 |
| CN | 110459175 A | 11/2019 |
| CN | 110473898 A | 11/2019 |
| CN | 110473988 A | 11/2019 |
| CN | 110491917 A | 11/2019 |
| CN | 110491918 A | 11/2019 |
| CN | 110492018 A | 11/2019 |
| CN | 110518034 A | 11/2019 |
| CN | 110570774 A | 12/2019 |
| CN | 110619813 A | 12/2019 |
| CN | 110620129 A | 12/2019 |
| CN | 110634930 A | 12/2019 |
| CN | 110649179 A | 1/2020 |
| CN | 110660823 A | 1/2020 |
| CN | 110718580 A | 1/2020 |
| CN | 110727142 A | 1/2020 |
| CN | 110752249 A | 2/2020 |
| CN | 110767662 A | 2/2020 |
| CN | 110767682 A | 2/2020 |
| CN | 110767708 A | 2/2020 |
| CN | 110767709 A | 2/2020 |
| CN | 110767713 A | 2/2020 |
| CN | 110767720 A | 2/2020 |
| CN | 110767736 A | 2/2020 |
| CN | 110767739 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110780375 A | 2/2020 |
| CN | 110782807 B | 2/2020 |
| CN | 110783384 A | 2/2020 |
| CN | 110783390 A | 2/2020 |
| CN | 110783394 A | 2/2020 |
| CN | 110783484 A | 2/2020 |
| CN | 110783485 A | 2/2020 |
| CN | 110783486 A | 2/2020 |
| CN | 110828533 A | 2/2020 |
| CN | 110828699 A | 2/2020 |
| CN | 110854176 A | 2/2020 |
| CN | 210052743 U | 2/2020 |
| CN | 110867527 A | 3/2020 |
| CN | 110890412 A | 3/2020 |
| CN | 110914891 A | 3/2020 |
| CN | 110923625 A | 3/2020 |
| CN | 110928453 A | 3/2020 |
| CN | 110931538 A | 3/2020 |
| CN | 110943116 A | 3/2020 |
| CN | 107887404 B | 4/2020 |
| CN | 110956925 A | 4/2020 |
| CN | 110970480 A | 4/2020 |
| CN | 110989861 A | 4/2020 |
| CN | 111009619 A | 4/2020 |
| CN | 111020489 A | 4/2020 |
| CN | 111028678 A | 4/2020 |
| CN | 111029381 A | 4/2020 |
| CN | 111029382 A | 4/2020 |
| CN | 111029391 A | 4/2020 |
| CN | 111046599 A | 4/2020 |
| CN | 111048564 A | 4/2020 |
| CN | 210272432 U | 4/2020 |
| CN | 111129100 A | 5/2020 |
| CN | 111129102 A | 5/2020 |
| CN | 111142180 A | 5/2020 |
| CN | 111155055 A | 5/2020 |
| CN | 111180490 A | 5/2020 |
| CN | 111192902 A | 5/2020 |
| CN | 210467844 U | 5/2020 |
| CN | 210575958 U | 5/2020 |
| CN | 111046599 B | 6/2020 |
| CN | 111223908 A | 6/2020 |
| CN | 111261641 A | 6/2020 |
| CN | 111292617 A | 6/2020 |
| CN | 111293235 A | 6/2020 |
| CN | 111293236 A | 6/2020 |
| CN | 111312795 A | 6/2020 |
| CN | 111341936 A | 6/2020 |
| CN | 112928147 A | 6/2020 |
| CN | 111383543 A | 7/2020 |
| CN | 111383579 A | 7/2020 |
| CN | 111403621 A | 7/2020 |
| CN | 111435952 A | 7/2020 |
| CN | 111435953 A | 7/2020 |
| CN | 111490069 A | 8/2020 |
| CN | 111554716 A | 8/2020 |
| CN | 109449178 B | 9/2020 |
| CN | 111668240 A | 9/2020 |
| CN | 111863911 A | 10/2020 |
| CN | 110783484 B | 11/2020 |
| CN | 111883559 A | 11/2020 |
| CN | 111883560 A | 11/2020 |
| CN | 111987120 A | 11/2020 |
| CN | 110783386 B | 12/2020 |
| CN | 108807487 B | 3/2021 |

(56) References Cited

FOREIGN PATENT DOCUMENTS

| | | |
|---|---|---|
| CN | 109728048 B | 3/2021 |
| CN | 109860237 B | 3/2021 |
| CN | 112436029 A | 3/2021 |
| CN | 112436030 A | 3/2021 |
| CN | 112436031 A | 3/2021 |
| CN | 112436032 A | 3/2021 |
| CN | 112562518 A | 3/2021 |
| CN | 112703615 B | 4/2021 |
| CN | 112864186 A | 5/2021 |
| CN | 112952021 A | 6/2021 |
| CN | 111341817 B | 8/2021 |
| CN | 113383611 A | 9/2021 |
| CN | 113451524 A | 9/2021 |
| CN | 113497206 A | 10/2021 |
| CN | 113745271 A | 12/2021 |
| EP | 1 850 368 A1 | 10/2007 |
| EP | 1 873 162 A1 | 1/2008 |
| EP | 2 998 997 A1 | 3/2016 |
| EP | 3 182 477 A1 | 6/2017 |
| EP | 2 248 849 B1 | 7/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 3 406 752 A1 | 11/2018 |
| EP | 3 499 576 A1 | 6/2019 |
| EP | 4 141 944 A1 | 3/2023 |
| JP | 2004-352815 A | 12/2004 |
| JP | 2006-318910 A | 11/2006 |
| JP | 2007-188854 A | 7/2007 |
| JP | 2007-273261 | 10/2007 |
| JP | 2008-091323 A | 4/2008 |
| JP | 2010-258410 A | 11/2010 |
| JP | 2012-182121 | 9/2012 |
| JP | 2012-253015 A | 12/2012 |
| JP | 5233074 B2 | 7/2013 |
| JP | 2013-219278 A | 10/2013 |
| JP | 2021-523524 | 9/2021 |
| KR | 1020100054630 A | 5/2010 |
| KR | 1020100123735 A | 11/2010 |
| KR | 1020140062258 A | 5/2014 |
| KR | 1020150127368 A | 11/2015 |
| KR | 101640772 B1 | 7/2016 |
| KR | 20170024182 A | 3/2017 |
| KR | 1020170030168 A | 3/2017 |
| KR | 1020170075865 A | 7/2017 |
| KR | 10-2018-0075589 A | 7/2018 |
| KR | 1020180115655 A | 10/2018 |
| KR | 1020180121304 A | 11/2018 |
| KR | 10-2019-0086756 A | 7/2019 |
| KR | 20190141239 A * | 12/2019 ........... H10K 71/621 |
| KR | 20200126463 A | 11/2020 |
| KR | 20210002829 A | 1/2021 |
| KR | 20210075549 A | 6/2021 |
| KR | 20210079850 A | 6/2021 |
| KR | 20210083043 A | 7/2021 |
| KR | 20210084869 A | 7/2021 |
| KR | 20210085263 A | 7/2021 |
| KR | 20210086033 A | 7/2021 |
| TW | 201929219 A | 7/2019 |
| WO | WO-2011/012212 A1 | 2/2011 |
| WO | WO-2011/049284 A1 | 4/2011 |
| WO | WO-2014/104703 A1 | 7/2014 |
| WO | WO-2016/056364 A1 | 4/2016 |
| WO | WO-2017/072678 A1 | 5/2017 |
| WO | WO-2018100559 A1 * | 7/2018 ........... H10K 50/824 |
| WO | WO-2018/206575 A1 | 11/2018 |
| WO | WO-2019/002198 A1 | 1/2019 |
| WO | WO-2019/006749 A1 | 1/2019 |
| WO | WO-2019/047126 A1 | 3/2019 |
| WO | WO-2019/062221 A1 | 4/2019 |
| WO | WO-2019/062236 A1 | 4/2019 |
| WO | WO-2019/088594 A2 | 5/2019 |
| WO | WO-2019/141198 A1 | 7/2019 |
| WO | WO-2019/147012 A1 | 8/2019 |
| WO | WO-2019/178782 A1 | 9/2019 |
| WO | WO-2019/199131 A1 | 10/2019 |
| WO | WO-2019/199139 A1 | 10/2019 |
| WO | WO-2019/199693 A1 | 10/2019 |
| WO | WO-2019/200862 A1 | 10/2019 |
| WO | WO-2019/215591 A1 | 11/2019 |
| WO | WO-2019/233298 A1 | 12/2019 |
| WO | WO-2019/242510 A1 | 12/2019 |
| WO | WO-2020/029559 A1 | 2/2020 |
| WO | WO-2020/029612 A1 | 2/2020 |
| WO | WO-2020/029621 A1 | 2/2020 |
| WO | WO-2020/045262 A1 | 3/2020 |
| WO | WO-2020/052232 A1 | 3/2020 |
| WO | WO-2020/057208 A1 | 3/2020 |
| WO | WO-2020/079456 A1 | 4/2020 |
| WO | WO-2020/105015 A1 | 5/2020 |
| WO | WO-2020/134914 A1 | 7/2020 |
| WO | WO-2020/195917 A1 | 10/2020 |
| WO | WO-2020/219267 A1 | 10/2020 |
| WO | WO-2020/221633 A1 | 11/2020 |
| WO | WO-2020/243740 A1 | 12/2020 |
| WO | WO-2020/261191 A1 | 12/2020 |
| WO | WO-2021/055547 A2 | 3/2021 |

OTHER PUBLICATIONS

Cite the machine translation. Helander M (WO-2018100559-A1).*
Foreign Search Report on PCT PCT/IB2020/057458 Dtd Nov. 5, 2020.
Abroshan, H. et al. "66-3: Active Learning for the Design of Novel OLED Materials." SID Symposium Digest of Technical Papers. 53.1 (2022).
Alhadid A. et al., "Design of Deep Eutectic Systems: A Simple Approach for Preselecting Eutectic Mixture Constituents", Molecules, 25.5 (2020): 1077.
Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.
Allcock, H.R. "Phosphorus-nitrogen Compounds", pp. 400-407, Academic Press (1972).
Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.
Allcock, Harry R., and Dawn E. Smith. "Surface studies of poly (organophosphazenes) containing dimethylsiloxane grafts." Chemistry of materials 7.8 (1995): 1469-1474.
Allcock, Harry R., and Michael L. Turner. "Ring expansion and polymerization of transannular bridged cyclotriphosphazenes and their spirocyclic analogs." Macromolecules 26.1 (1993): 3-10.
Allcock, Harry R., Gayann S. McDonnell, and James L. Desorcie. "Ring expansion and equilibration in organophosphazenes and the relationship to polymerization." Inorganic chemistry 29.19 (1990): 3839-3844.
Allcock, Harry R., Michael L. Turner, and Karyn B. Visscher. "Synthesis of transannular- and spiro-substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]." Inorganic chemistry 31.21 (1992): 4354-4364.
Araki, H. and Naka, K., "Syntheses and Properties of Dumbbell-Shaped POSS Derivatives Linked by Luminescent p-Conjugated Units", Polymer Chemistry, 50.20 (2012): 4170-4181.
Araki, H. and Naka, K., "Syntheses and Properties of Star- and Dumbbell-Shaped POSS Derivatives Containing Isobutyl Groups", Polymer Journal, 44 (2012):340-346.
Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.
Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.

(56) References Cited

OTHER PUBLICATIONS

Bae, J. et al. "Optically recoverable, deep ultraviolet (UV) stable and transparent sol-gel fluoro siloxane hybrid material for a UV LED encapsulant." RSC advances 6.32 (2016): 26826-26834.
Baradie, B. et al. "Synthesis and characterization of novel polysiloxane-grafted fluoropolymers." Canadian journal of chemistry 83.6-7 (2005): 553-558.
Barry, B., "Routes to Silsesquioxanes Functionalization—Capping of DDSQs for the Synthesis of Asymmetric POSS Compounds", Masters Thesis, Michigan State University (2019).
Bertolucci, M. et al. "Wetting Behavior of Films of New Fluorinated Styrene—Siloxane Block Copolymers." Macromolecules 37.10 (2004): 3666-3672.
Besli, S. et al., "Bridged Cyclophosphazenes Resulting From Deprotonation Reactions of Cyclotriphophazenes Bearing a P—NH Group", 40.19 (2011):5307.
Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.
Biederman, H. et al., "The Properties of Fluorocarbon Films Prepared by R.F .Sputtering and Plasma Polymerization in Inert and Active Gas", Thin Solid Films, 41.3 (1977):329-339.
Blanchet, G.B., "Deposition of Amorphous Fluoropolymers Thin Films by Laser Ablation", Appl. Phys. Lett. 62 (1993):479-481.
Blanco, I., "The Rediscovery of POSS: A Molecule Rather than a Filler", Polymers, 10.8 (2018):904-914.
Boyne, D. et al., "Vacuum Thermal Evaporation of Polyaniline Doped with Camphor Sulfonic Acid", Journal of Vacuum Science & Technology A, 33.3 (2015):031510.
Brickley, J.F. et al., "Supramolecular Variations on a Molecular Theme: the Structural Diversity of Phosphazenes (RNH)6P3N3 in the Solid State", Dalton Trans., 7 (2003):1235-1244.
Brown, Douglas E., et al. "Poly [(vinyloxy) cyclophosphazenes]." Macromolecules 34.9 (2001): 2870-2875.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "P-13.10: A New Color Space Model for AMOLED Display Based on IR Drop" SID Symposium Digest of Technical Papers 54 (2023).
Camino, G. et al., "Polydimethylsiloxane Thermal Degradation Part 1. Kinetic Aspects", Polymer, 42.6 (2001):2395-2402.
Chaiprasert, T. et al. "Vinyl-functionalized Janus ring siloxane: potential precursors to hybrid functional materials." Materials 14.8 (2021): 2014.
Chan, E.P. et al., "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007): 1045-1074.
Chaudhury, M. and Pocius, A. V. "Adhesion science and engineering-2: Surfaces, Chemistry and Applications" Elsevier (2002).
Chen, G. K. J., and J. Chen. "Flexible displays: Flexible AMOLED manufacturing." Handbook of Visual Display Technology; Chen, J., Cranton, W., Fihn, M., Eds (2016).
Chen, W. et al., "Highly Thermal Stable Phenolic Resin Based on Double-Decker-Shaped POSS Nanocomposites for Supercapacitors", Polymers, 12.9 (2020):2151-2165.
Cho, H.U. et al. "17-1: Invited Paper: Enhancement of Current Efficiency for OLED Devices Using Meta-Heuristic Algorithm." SID Symposium Digest of Technical Papers. 52.1 (2021).

Choi, B. K. et al. "48-1: Invited Paper: Next Generation Highly Efficient and Stable Phosphorescent Emitting Materials For OLEDs." SID Symposium Digest of Technical Papers 51.1 (2020).
Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.
Cordes, D.B. et al., "Recent Developments in the Chemistry of Cubic Polyhedral Oligosilsesquioxanes", Chem. Rev., 110 (2010):2081-2173.
Dalvi, V.H. and Rossky, P.J., "Molecular Origins of Fluorocarbon Hydrophobicity", PNAS, 107.31 (2010):13603-13607.
Dash, P. and Y. C.H. "How much battery does dark mode save? An accurate OLED display power profiler for modern smartphones." Proceedings of the 19th Annual International Conference on Mobile Systems, Applications, and Services (2021).
De Wilde, W., "Evaporation of Polytetrafluoroethylene by Electron Bombardment of the Bulk Material", Thin Solid Films, 24.1 (1974):101-111.
Dong, H. et al., "Surface Properties and Thermal Stability of a Novel Low-Surface-Energy Polybenzoxazine/Clay Nanocomposites", Polymer Composites, 33.8 (2012): 1313-1320.
Drelich, J. et al., "Hydrophilic and Superhydrophilic Surfaces and Materials", Soft Matter, 7.21 (2011):9804-9828.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019):504-542.
Dutkiewicz, M. et al., "New Fluorocarbofunctional Spherosilicates: Synthesis and Characterization", Organometallics, 30.8 (2011):2149-2153.
Ellison, A. H., H. W. Fox, and W. A. Zisman. "Wetting of fluorinated solids by hydrogen-bonding liquids." The Journal of Physical Chemistry 57.7 (1953): 622-627.
Feher, F.J. and Budzichowski, T.A., "Silasesquioxanes as Ligands in Inorganic and Organometallic Chemistry", Polyhedron, 14.22 (1995):3239-3253.
Fox, H.W. et al., "Polyorganosiloxanes Surface Active Properties", Ind. Eng. Chem., 39.11 (1947):1401-1409.
Gabler, D.G. and Haw, J.F., "Hydrolysis Chemistry of the Chlorophosphazene Cyclic Trimer", Inorganic Chemistry, 29.20 (1990):4018-4021.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Giebink, C. "Catastrophic OLED failure and pathways to address it" Department of Energy, url:https://www.energy.gov/sites/prod/files/2018/02/f48/giebink_oled-failure_nashville18_0.pdf (2018).
Glüge, J. et al., An Overview of the Uses of Per- and Polyfluoroalkyl Substances (PFAS), Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014):1212-1220.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Grant Norton, M. et al., "Pulsed Laser Ablation and Deposition of Fluorocarbon Polymers", Applied Surface Science, 96-98 (1996):617-620.
Gritsenko, K.P. and Krasovsky, A.M., "Thin-Film Deposition of Polymers by Vacuum Degradation", Chem. Rev., 103.9 (2003):3607-3649.

(56) References Cited

OTHER PUBLICATIONS

Grytsenko, K. "Vacuum-deposited fluoropolymer films for organic electronics" International Symposium on Plastics Electronics (Part of Semicon Europe—2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016):139-148.
Hoge, J. "Novel Benzoxazine Resin System for Flame Retardant Aircraft Interior Applications" The Sixth Triennial International Aircraft Fire and Cabin Safety Research (2010).
Holland, L. et al., "Sputtered and Plasma Polymerized Fluorocarbon Films", Thin Solid Films, 35 (1976): L19-L21.
Hwang, S. et al., "ChemInform Abstract: Dendritic Macromolecules for Organic Light-Emitting Diodes", Chemical Society Reviews, 37.11 (2008):2543-2557.
Iacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).
Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.
Ikonnikov, D.A., "Controlling Multiple Diffraction with Quasiperiodic Gratings", Laser Phys. Lett., 16.12 (2019):126202.
Imoto, H. et al., "Corner- and Side-Opened Cage Silsesquioxanes: Structural Effects on the Materials Properties", European Journal of Inorganic Chemistry, Sep. 2020 (2020):737-742.
Imoto, H. et al., "Tripodal Polyhedral Oligomeric Silsesquioxanes as a Novel Class of Three-Dimensional Emulsifiers", Polymer Journal, 47 (2015):609-615.
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1-yl)alkyl]acetamides", Russian Journal of Organic Chemistry, 52.11 (2016):1558-1564.
Iwamori, S. et al., "Adsorption Properties of Fluorocarbon Thin Films Prepared by Physical Vapor Deposition Methods", Surface & Coatings Technology, 204:16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jarvis, N.L. and Zisman, W.A., "Surface Chemistry of Fluorochemicals", Defense Technical Information Center (1965):1-37.
Jin, Y. et al. "Two-Tier Ensemble Deep Learning Model for Anomaly Detection in OLED Encapsulation Process" The 21st International Meeting on Information Display, Seoul, Korea (2021).
Jung, W. et al. "High-precision laser glass cutting for future display" Journal of the Society for Information Display 30.5 (2022): 462-470.
Kaesler, K., "The hidden defenders: Silane and siloxane impregnation protects construction materials", European coatings journal, 3 (2006):36-41.
Khanin, D.A., et al. "New hybrid materials based on cyclophosphazene and polysiloxane precursors: Synthesis and properties." Polymer 186 (2020): Dec. 2011.
Kim, Chiwoo, et al. "Fine metal mask material and manufacturing process for high-resolution active-matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, S. et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Invited Paper: Prolonging Device Lifetime of Blue Organic Light-Emitting Diodes." SID Symposium Digest of Technical Papers 53.1 (2022).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scentific Reports, 8.6391 (2018): 1-7.
Kim, T. et al., "Electrical Injection and Transport in Teflon-Diluted Hole Transport Materials", Organic Electronics, 83 (2020):105754.
Kim, Y. "AI & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
Kiskan, B., "Adapting Benzoxazine Chemistry for Unconventional Applications", Reactive and Functional Polymers, 129 (2018):76-88.
Koh, K. et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005):1264-1270.
Kota, Arun K., Gibum Kwon, and Anish Tuteja. "The design and applications of superomniphobic surfaces." NPG Asia Materials 6.7 (2014): e109.
Kovacik, P. et al., "Vacuum-Deposited Planar Heterojunction Polymer Solar Cells", ACS Appl. Mater. Interfaces, 3.1 (2011):11-15.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Lanoux, S. and Mas, R.H., "Reactions of the Hydrolyzed Phosphazene N3P3(OCH2CF3)5ONa", Phosphorus and Sulfur and the Related Elements, 26.2 (1986):139-142.
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).
Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Lee, S. et al. "20-2: High Efficiency and Long Device Lifetime Green Organic Light Emitting Diodes using a Pt Complex." SID Symposium Digest of Technical Papers 51.1 (2020).
Li, L. et al. "Synthesis and Properties of Microporous Organic Polymers Based on Adamantane", Progress in Chemistry, 32 (2020):190-203.

(56) References Cited

OTHER PUBLICATIONS

Li, P. et al. "Preparation and application of fluorinated-siloxane protective surface coating material for stone inscriptions." Journal of Polymer Engineering 35.6 (2015): 511-522.

Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).

Liu, C. et al., "Mechanistic Studies on Ring-Opening Polymerization of Benzoxazines: A Mechanistically Based Catalyst Design", Macromolecules, 44.12 (2011):4616-4622.

Liu, F. et al. "Syntheses and structure of the first eight-membered fluoro and chloro hafnium siloxane complexes" Zeitschrift für anorganische und allgemeine Chemie 622.5 (1996): 819-822.

Liu, Z. et al., "Two-Dimensional Gratings of Hexagonal Holes for High Order Diffraction Suppression", Optics Express, 25.2 (2017): 1339-1349.

Lowe, R.D. et al., "Deposition of Dense Siloxane Monolayers from Water and Trimethoxyorganosilane Vapor", Langmuir, 27.16 (2011):9928-9935.

Lu, H. and Nutt, S., "Restricted Relaxation in Polymer Nanocomposites near the Glass Transition", Macromolecules, 36.11 (2003):4010-4016.

Lu, T. et al., "Blended Hybrids Based on Silsesquioxane—OH and Epoxy Resins", Journal of Applied Polymer Science, 106.6 (2007):4117-4123.

Lysien, M. et al. "55-1: Deposition of Conductive and Insulating Materials at Micrometer Scale for Display-Component Prototyping." SID Symposium Digest of Technical Papers 53.1 (2022).

Mabry, J.M. et al., "Fluorinated Polyhedral Oligomeric Silsesquioxanes (F-POSS)", Angew. Chem. Int. Ed., 47.22 (2008):4137-4140.

Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.

Mackus, A.J.M. et al. "From the bottom-up: toward area-selective atomic layer deposition with high selectivity" Chemistry of Materials 31.1 (2018): 2-12.

Majhy, B. et al., "Facile Fabrication and Mechanistic Understanding of a Transparent Reversible Superhydrophobic—Superhydrophilic Surface", Scientific Reports, 8 (2018):18018.

Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.

Marzari, N. et al. "Electronic-structure methods for materials design." Nature materials 20.6 (2021): 736-749.

Mikhaylov, D.Y. and Budnikova, Y.H., "Fluoroalkylation of Organic Compounds", Russian Chemical Reviews, 82.9 (2013):835-864.

Mugisawa, M. et al., "Synthesis and Application of Novel Fluoroalkyl End-Capped Cooligomers Having Adamantane as a Pendant Group", Colloid Polym Sci, 285 (2007):737-744.

Murray, M. et al., "NMR Studies of Hydrolysis and Rearrangement Reactions of Cyclophosphazenes", Phosphorus, Sulfur, and Silicon and the Related Elements, 65.1-4 (1992):83-86.

Nason, T.C. et al., "Deposition of Amorphous Fluoropolymer Thin Films by Thermolysis of Teflon Amorphous Fluoropolymer", Appl. Phys. Lett. 60 (1992):1866-1868.

Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.

Nicolas, G. and Spiegelmann, F., "Theoretical Study of Ethylene-Noble Metal Complexes", J. Am. Chem. Soc., 112 (1990):5410-5419.

Nishino, T. et al., "The Lowest Surface Free Energy Based on—$CF_3$ Alignment", Langmuir, 15 (1999):4321-4323.

Niu, J. et al., "High Order Diffraction Suppression by Quasi-Periodic Two-Dimensional Gratings", Optical Materials Express, 7.2 (2017):366-375.

Ohnishi Y. et al., "Optical Characteristics of Poly(tetrafluoroethylene) Thin Film Prepared by a Vacuum Evaporation", Jpn. J. Appl. Phys., 55:2S (2016):02BB04.

Oka, M. and Satoshi, H. "Synthesis of photoresponsive cyclic poly (dimethyl siloxane) s from monodisperse linear precursors" Reactive and functional polymers 158 (2021): 104800.

Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.

Olejnik, A. et al., "Silsesquioxanes in the Cosmetics Industry—Applications and Perspectives", Materials, 15.3 (2022):1126-1143.

Owen, M. J. "A review of significant directions in fluorosiloxane coatings" Surface Coatings International Part B: Coatings Transactions 87:B2 (2004).

Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.

Pham, J.Q. and Green, P.F., "The Glass Transition of Thin Film Polymer/Polymer Blends: Interfacial Interactions and Confinement", J. Chem. Phys., 116.13 (2002):5801-5806.

Pocius, A. V. and Dillard, D.A. "Adhesion science and engineering—1: The Mechanics of Adhesion" Elsevier (2002).

Pu, T. et al., "Effects of Structure Parameters on High-Order Diffraction Suppression of Quasi-Periodic Gratings", Journal of the Optical Society of America B, 35.4 (2018):711-717.

Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.

Reichert, V.R. and Mathias, L.J., "Expanded Tetrahedral Molecules from 1,3,5,7-Tetraphenyladarnantane", Macromolecules, 27.24 (1994):7015-7023.

Riberiro, P et al., "Optics, Photonics and Laser Technology 2017", Chapters 2 and 3, Springer (2019).

Ringe, E., "Shapes, Plasmonic Properties, and Reactivity of Magnesium Nanoparticles", J. Phys, Chem. C, 124 (2020):15665.

Roy, M.R., "Surface Properties of Hard Fluorinated Amorphous Carbon Films Deposited by Pulsed-DC Discharges", Doctoral Thesis, Universitat de Barcelona (2012).

Schilling, C.I. et al., "Fourfold Suzuki-Miyaura and Sonogashira Cross-Coupling Reactions on Tetrahedral Methane and Adamantane Derivatives", Eur. J. Org. Chem., 2011.9 (2011):1743-1754.

Seebauer, E.G. and Allen, C.E., "Estimating Surface Diffusion Coefficients", Progress in Surface Science, 49.3 (1995): 265-330.

Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.

Senchyk, G.A. et al., "Functionalized Adamantane Tectons Used in the Design of Mixed-Ligand Copper (II) 1,2,4-Triazolyl/Carboxylate Metal-Organic Frameworks", Inorganic Chemistry, 52.2 (2013):863-872.

Sessler, G. et al., "CF2H, a Hydrogen Bond Donor", J. Am. Chem. Soc., 139.27 (2017):9325-9332.

Shen. Y, et al. "32.1: Research of Nanocomposite Materials with High Refractive Index for HLEMS Application" SID Symposium Digest of Technical Papers 54 (2023).

Shevlin, S. et al. "Computational materials design." Nature Materials 20.6 (2021): 727-727.

Shih, H. et al., "A Cross-Linkable Triphenylamine Derivative as a Hole Injection/Transporting Material in Organic Light-Emitting Diodes", Polym. Chem., 6 (2015): 6227-6237.

Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.

Sohn, I. et al. "Improved modeling of material deposition during OLED manufacturing using direct simulation monte carlo method on GPU Architecture." International Journal of Precision Engineering and Manufacturing-Green Technology 6 (2019): 861-873.

Sohn, I. et al. "Numerical Experiment Using Direct Simulation Monte Carlo for Improving Material Deposition Uniformity During OLED Manufacturing." International Journal of Precision Engineering and Manufacturing—Green Technology (2021): 1-14.

(56) References Cited

OTHER PUBLICATIONS

Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.
Spoljaric, S. et al., "Novel Elastomer-Dumbbell Functionalized POSS Composites: Thermomechanical and Morphological Properties", Journal of Applied Polymer Science, 123.1 (2012):585-600.
Starr, F.W. et al., "Bound Layers 'Cloak' Nanoparticles in Strongly Interacting Polymer Nanocomposites", ACS Nano, 10.12 (2016):10960-10965.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, T. et al., "Reversible Switching between Superhydrophilicity and Superhydrophobicity", Angew. Chem. Int. Ed., 43.3 (2004):357-360.
Svorcik, V. et al., "Deposition of Polystyrene Films by Vacuum Evaporation", Journal of Materials Science Letters, 16 (1997):1564-1566.
Takele, H. et al., "Plasmonic Properties of Ag Nanoclusters in Various Polymer Matrices", Nanotechnology, 17.14 (2006):3499-3505.
Tao, C. et al., "Highly Icephobic Properties on Slippery Surfaces Formed From Polysiloxane and Fluorinated POSS", Progress in Organic Coatings, 103 (2017):48-59.
Thran, A., et al. "Condensation coefficients of Ag on polymers." Physical review letters 82.9 (1999): 1903-1906.
Tokuchi. S. et al. "8-4: Oxide Semiconductor In—Zn—O-X system with High Electron Mobility." SID Symposium Digest of Technical Papers 54.1 (2023).
Tong, T. et al., "Adhesion in Organic Electronics Structures", Journal of Applied Physics, 106.8 (2009): 083708.
Töpper, T. et al. "Siloxane-based thin films for biomimetic low-voltage dielectric actuators." Sensors and Actuators A: Physical 233 (2015): 32-41.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsujioka, Tsuyoshi, Rie Takagi, and Takahiro Shiozawa. "Light-controlled metal deposition on photochromic polymer films." Journal of Materials Chemistry 20.43 (2010): 9623-9627.
Tuteja, A. et al., "Designing Superoleophobic Surfaces", Science, 318.5856 (2007):1618-1622.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by Ionized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by Ionization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Van de Grampel, R.D., "Surfaces of Fluorinated Polymer Systems", Doctoral Thesis, Technische Universiteit Eindhoven (2002).
Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).

Vogelsang, D.F. et al., "Separation of Asymmetrically Capped Double-Decker Silsesquioxanes Mixtures", Polyhedron, 155 (2018): 189-193.
Von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3-Dimethyl-adamantane", ACS Omega, 5.26 (2020):16085-16088.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.
Wang, Y. et al., "Substrate Effect on the Melting Temperature of Thin Polyethylene Films", Physical Review Letters, 96.2 (2006):028303.
Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.
Weigel, W.K. et al., "Direct Radical Functionalization Methods to Access Substituted Adamantanes and Diamondoids", Org. Biomol. Chem., 20 (2022):10-36.
Weiss, F.M. et al., "Molecular Beam Deposition of High-Permittivity Polydimethylsiloxane for Nanometer-Thin Elastomer Films in Dielectric Actuators", Materials and Design, 105 (2016):106-113.
Winget, P. et al. "57-1: Accelerating Next-Generation Display Materials Development with a Smart Digital Chemistry Platform." SID Symposium Digest of Technical Papers 54.1 (2023).
Wojtczak, L., "The Melting Point of Thin Films", Phys. Stat. Sol., 23.2 (1967):K163-K166.
Wu, Y. et al. "P-13.5: Investigation on Chromatic Dispersion of Reflection for CFOT Display" SID Symposium Digest of Technical Papers 54 (2023).
Xie, J. et al., "Regioselective Synthesis of Methyl-Substituted Adamantanes for Promoting Oxidation Stability of High-Density Fuels", Energy Fuels, 34.4 (2020):4516-4524.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).
Yang, H. et al., "Catalyst-Controlled C—H Functionalization of Adamantanes Using Selective H-Atom Transfer", ACS Catal., 9.6 (2019):5708-5715.
Yang, J. et al. "25-4: Methodology and Correlation of AI-Based Design for OLED Materials." SID Symposium Digest of Technical Papers 52.1 (2021).
Yao, Y. et al. "P-7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.

(56) References Cited

OTHER PUBLICATIONS

Yoo, D. et al. "Retrosynthesis Planning for Thermally Activated Delayed Fluorescence Molecules" The 21st International Meeting on Information Display, Seoul, Korea (2021).
Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zalewski, K. et al., "A Review of Polysiloxanes in Terms of Their Application in Explosives", Polymers, 13.7 (2021):1080-1090.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018):5641-5646.
Zhu, C. et al. "A novel synthetic UV-curable fluorinated siloxane resin for low surface energy coating." Polymers 10.9 (2018): 979.
Zibarov, A. et al., "AB5 Derivatives of Cyclotriphosphazene for the Synthesis of Dendrons and Their Applications", Molecules, 26.13 (2021):4017-4040.
Foreign Action other than Search Report on JP 2022-507829 dated Feb. 14, 2024.
"Forrest, James A. ""Reductions of the glass transition temperature in thin polymer films: Probing the length scale of cooperative dynamics."" Physical Review E 61.1 (2000): R53-6."
Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.
Aqra, Fathi, and Ahmed Ayyad. "Surface free energy of alkali and transition metal nanoparticles." Applied surface science 314 (2014): 308-313.
Baek, Seungin, et al. "74-2: Diffracted Image Retrieving with Deep Learning." ?SID Symposium Digest of Technical Papers. vol. 51. No. 1. 2020.
Bechtolsheim, C. V., V. Zaporojtchenko, and F. Faupel. "Interface structure and formation between gold and trimethylcyclohexane polycarbonate." Journal of materials research 14.9 (1999): 3538-3543.
Chen, Yu-Hung, et al. "58.2: High-Performance Large-Size OLED TV with Ultra Hd Resolution." SID Symposium Digest of Technical Papers. vol. 46. No. 1. 2015.
Ching, Suet Ying. "Plasmonic properties of silver-based alloy thin films." (2015). Open Access Theses and Dissertations. 194.
Ching, Suet Ying. "Plasmonic properties of silver-based alloy thin films." (2016).
David, Robert, Neumann, A. Wilhelm. "A Theory for the Surface Tensions and Contact Angles of HydrogenBonding Liquids." Langmuir 30.39 (2014):11634-11639.
Dubrovskii, Vladimir. "Fundamentals of Nucleation Theory." Nucleation Theory and Growth of Nanostructures. Springer, Berlin, Heidelberg, 2014. 1-73.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Emerton, Neil, David Ren, and Tim Large. "28-1: Image Capture Through TFT Arrays." SID Symposium Digest of Technical Papers. vol. 51. No. 1. 2020.
Faupel, F., et al. "Nucleation, growth, interdiffusion, and adhesion of metal films on polymers." ?AIP Conference Proceedings. vol. 491. No. 1. American Institute of Physics, 1999.
Feng, Zhengyu, et al. "28-3: Pixel Design for Transparent MicroLED Display with Low Blurring." ?SID Symposium Digest of Technical Papers. vol. 51. No. 1. 2020.
Flores-Camacho, Jose Manuel, et al. "Growth and optical properties of Ag clusters deposited on poly (ethylene terephthalate)." Nanotechnology 22.27 (2011): 275710.
Fowkes, Frederick M. "Attractive Forces at Interfaces." Industrial and Engineering Chemistry 56.12 (1964): 40-52.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness." ?Macromolecules?34.16 (2001): 5627-5634.
Fusella, Michael A., et al. "Plasmonic enhancement of stability and brightness in organic light-emitting devices." Nature 585.7825 (2020): 379-382.
Heaney, James B. "Evaluation of commercially supplied silver coated Teflon for spacecraft temperature control usage." (1974).
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Jiao, Zhiqiang, et al. "61-2: Weakening Micro-Cavity Effects in White Top-Emitting WOLEDs with Semitransparent Metal Top Electrode." ?SID Symposium Digest of Technical Papers. vol. 49. No. 1. 2018.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning." ?SID Symposium Digest of Technical Papers. vol. 46. No. 1. 2015.
Kim, Haewon, et al. "Analysis of Semi-Transparent Cathode Performance Based on Fabrication Methods." IDW '19. 2019.
Kim, Hyun-Chang, et al. "39-4: A Method of Panel-Current Limitation for Automotive OLED Displays." ?SID Symposium Digest of Technical Papers. vol. 51. No. 1. 2020.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kisin, Srdjan.?Adhesion changes at metal-polymer interfaces: Study of the copper-(acrylonitrile-butadiene-styrene) system. Diss. Dissertation, Technische Universiteit Eindhoven, 2007.
Knight Jr, L. B., et al. "Unusual behavior of vaporized magnesium under low pressure conditions." ?The Journal of Physical Chemistry? 79.12 (1975): 1183-1190.
Koma, N. et al. "44.2: Novel Front-light System Using Fine-pitch Patterned OLED." SID Symposium Digest of Technical Papers, 39: 655-658. 2008.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs." ?SID Symposium Digest of Technical Papers. vol. 46. No. 1. 2015.
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.

(56) References Cited

OTHER PUBLICATIONS

Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.

Liu, Yang, et al. "P-168: Top Emission WOLED for High Resolution OLED TV." SID Symposium Digest of Technical Papers. vol. 49. No. 1. 2018.

Liu, Yunfei, et al. "P-202: High Transmittance Top Conductive Electrodes of OLEDs by Using Conductive Interface Layer." SID Symposium Digest of Technical Papers. vol. 51. No. 1. 2020.

Lund, L. G., et al. "514. Phosphonitrilic derivatives. Part I. The preparation of cyclic and linear phosphonitrilic chlorides." Journal of the Chemical Society (Resumed) (1960): 2542-2547.

Maissel, Leon I., and Maurice H. Francombe. An introduction to thin films. CRC Press, 1973. pp. 61-83, 198, 199.

Meinders, Marcel BJ, William Kloek, and Ton van Vliet. "Effect of surface elasticity on Ostwald ripening in emulsions." Langmuir 17.13 (2001): 3923-3929.

Michele Ricks. Advanced OLED Materials Enabling Large-Size OLED Displays by Ink Jet Printing. OLEDs World Summit, Sep. 2020.

Mittal, Kashmiri Lal, ed. Metallized plastics 3: fundamental and applied aspects. Springer Science & Business Media, 2012.

Morgenstern, Karina, Georg Rosenfeld, and George Comsa. "Decay of two-dimensional Ag islands on Ag (111)." Physical review letters 76.12 (1996): 2113.

Murano, Sven, et al. "30.3: Invited Paper: AMOLED Manufacturing—Challenges and Solutions from a Material Makers Perspective." ?SID Symposium Digest of Technical Papers. vol. 45. No. 1. 2014.

Nakamura, Daiki, et al. "68-4: Top-emission OLED Kawara-type Multidisplay with Auxiliary Electrode." SID Symposium Digest of Technical Papers. vol. 49. No. 1. 2018.

Nittler, Laurent, et al. "Morphology study of small amounts of evaporated gold on polymers." Surface and interface analysis 44.8 (2012): 1072-1075.

Ohring, Milton. Materials science of thin films. Elsevier, 2001.

Okuyama, Kentaro, et al.?"79-4L:?Late-News Paper: Highly Transparent LCD using New Scattering-type Liquid Crystal with Field Sequential Color Edge Light." ?SID Symposium Digest of Technical Papers,?48, 2017.

Pandharkar, Riddhish, et al. "A Computational Study of AlF3 and ACF Surfaces." Inorganics 6.4 (2018): 124.

Park, Chan II, et al. "54-1: Distinguished Paper: World 1st Large Size 77-inch Transparent Flexible OLED Display." ?SID Symposium Digest of Technical Papers. vol. 49. No. 1. 2018.

Park, Jongwoong, et al. "8-1: The Method to Compensate IR-Drop of AMOLED Display." SID Symposium Digest of Technical Papers. vol. 50. No. 1. 2019.

Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.

Peters, Richard D., et al. "Using Self-Assembled Monolayers Exposed to X-rays To Control the Wetting Behavior of Thin Films of Diblock Copolymers." Langmuir 16.10 (2000): 4625-4631.

Quan, Wei, et al. "69-2: Transparent Conductive Hybrid Cathode Structure for Top-Emitting Organic Light-Emitting Devices." ?SID Symposium Digest of Technical Papers. vol. 51. No. 1. 2020.

Rokni-Fard, Mahroo, and Quanmin Guo. "Biased Ostwald ripening in site-selective growth of two-dimensional gold clusters." The Journal of Physical Chemistry C 122.14 (2018): 7801-7805.

Safonov, Alexey I., et al. "Deposition of thin composite films consisting of fluoropolymer and silver nanoparticles having surface plasmon resonance." Thin Solid Films 603 (2016): 313-316.

Satulu, Veronica, et al. "Combining fluorinated polymers with Ag nanoparticles as a route to enhance optical properties of composite materials." Polymers 12.8 (2020): 1640.

Scharnberg, M., et al. "Radiotracer measurements as a sensitive tool for the detection of metal penetration in molecular-based organic electronics." Applied Physics Letters 86.2 (2005): 024104.

Schissel, Paul, and Alvin Warren Czanderna. "Reactions at the silver/polymer interface: a review." Solar Energy Materials 3.1-2 (1980): 225-245.

Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.

Shen, Mingmin, et al. "Destabilization of Ag nanoislands on Ag (100) by adsorbed sulfur." The Journal of chemical physics 135.15 (2011): 154701.

Shi, Shiming, et al. "56-1: Invited Paper: Research on Commercial Foldable AMOLED and Relevant Technologies." ?SID Symposium Digest of Technical Papers. vol. 51. No. 1. 2020.

Shin, Dong-Youn, and Inyoung Kim. "Self-patterning of fine metal electrodes by means of the formation of isolated silver nanoclusters embedded in polyaniline." ?Nanotechnology?20.41 (2009): 415301.

Smithson, Robert LW, Donald J. McClure, and D. Fennell Evans. "Effects of polymer substrate surface energy on nucleation and growth of evaporated gold films." Thin Solid Films 307.1-2 (1997): 110-112.

Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.

Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.

Sonoda, Tohru, et al. "84-1: Invited Paper: 30-inch 4K Rollable OLED Display." SID Symposium Digest of Technical Papers. vol. 51. No. 1. 2020.

Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.

Spelt, J. K., Neumann, A. W. "Solid Surface Tension: The Equation of State Approach and the Theory of Surface Tension Components. Theoretical and Conceptual Considerations." Langmuir 3 (1987): 588-591.

Tang, Quan, et al. "28-2: Study of the Image Blur through FFS LCD Panel Caused by Diffraction for Camera under Panel." SID Symposium Digest of Technical Papers. vol. 51. No. 1. 2020.

Tarasevich, Y. I. "Surface energy of oxides and silicates." Theoretical and Experimental Chemistry 42 (2006): 145-161.

Thran, A., et al. "Condensation coefficients of Ag on polymers." Physical review letters 82.9 (1999): 1903.

Tsai, Yu-Hsiang, et al. "P-202: A Flexible Transparent OLED Display with FlexUPTM Technology." ?SID Symposium Digest of Technical Papers. vol. 48. No. 1. 2017.

Tsujioka, Tsuyoshi, and Kosuke Tsuji. "Metal-vapor deposition modulation on soft polymer surfaces." Applied Physics Express 5.2 (2012): 021601.

Tsujioka, Tsuyoshi, et al. "Selective metal deposition on photoswitchable molecular surfaces." Journal of the American Chemical Society 130.32 (2008): 10740-10747.

Varagnolo, Silvia, et al. "Embedded-grid silver transparent electrodes fabricated by selective metal condensation." ?Journal of Materials Chemistry C?8.38 (2020): 13453-13457.

Varagnolo, Silvia, et al. "Selective deposition of silver and copper films by condensation coefficient modulation." Electronic Supplementary Material (ESI) for Materials Horizons. (2020).

Varagnolo, Silvia, et al. "Selective deposition of silver and copper films by condensation coefficient modulation." Materials Horizons 7.1 (2020): 143-148.

Vitos, Levente, et al. "The surface energy of metals." Surface science 411.1-2 (1998): 186-202.

Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.

(56) References Cited

OTHER PUBLICATIONS

Wang, Hailiang, et al. "P-132: An Under-Display Camera Optical Structure for Full-Screen LCD." ?SID Symposium Digest of Technical Papers. vol. 51. No. 1. 2020.

Wang, Zhibin, et al. "55-1: Invited Paper: Self-Assembled Cathode Patterning in AMOLED for Under-Display Camera.'"?SID Symposium Digest of Technical Papers. vol. 51. No. 1. 2020.

Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.

Weimer, P. K. "Physics of Thin Films, vol. 2.". Academic Press, (1964).

Wolfgang Decker, VAST Films, Ltd. "Pattern Metallization: Selective Deposition of Metals on Polymer Films for Functional Applications" AIMCAL Fall Conference 2005.

Wu, Zhongyuan, et al. "34-2: Distinguished Paper: Development of 55inch 8K AMOLED TV by Inkjet Printing Process." ?SID Symposium Digest of Technical Papers. vol. 51. No. 1. 2020.

Xu, Hua, et al. "Transparent AMOLED Display Derived by Metal Oxide Thin Film Transistor with Praseodymium Doping." Proceedings of the International Display Workshops vol. 26 (IDW '19). 2019.

Yamada, Toshikazu, et al. "Nanoparticle chemisorption printing technique for conductive silver patterning with submicron resolution." Nature communications 7.1 (2016): 1-9.

Yang, Jun-Yu, et al. "32-3: AMOLED IR Drop Compensation for Channel Length Modulation." SID Symposium Digest of Technical Papers. vol. 51. No. 1. 2020.

Yu, Jun Ho, et al. "64-2: Fabrication of Auxiliary Electrodes using Ag Inkjet Printing for OLED Lighting." SID Symposium Digest of Technical Papers. vol. 49. No. 1. 2018.

Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.

Zaporojtchenko, V., et al. "Controlled growth of nano-size metal clusters on polymers by using VPD method." ?Surface science?532 (2003): 300-305.

Zaporojtchenko, V., et al. "Determination of condensation coefficients of metals on polymer surfaces." ?Surface science?454 (2000): 412-416.

Zaporojtchenko, V., et al. "Formation of metal-polymer interfaces by metal evaporation: influence of deposition parameters and defects." Microelectronic engineering 50.1-4 (2000): 465-471.

Zaporojtchenko, V., et al. "Metal/polymer interfaces with designed morphologies." Journal of Adhesion Science and Technology 14.3 (2000): 467-490.

Zeng, Yang, et al. "28-4: Investigation of Moir? Interference in Pinhole Matrix Fingerprint on Display Technology." SID Symposium Digest of Technical Papers. vol. 51. No. 1. 2020.

Zhang, Bing, et al. "P-124: A 17.3-inch WQHD Top-Emission Foldable AMOLED Display with Outstanding Optical Performance and Visual Effects." ?SID Symposium Digest of Technical Papers. vol. 51. No. 1. 2020.

Zhang, Hao, et al. "P-131: A Design of Under-screen Face Recognition based on Screen Miniature Blind Apertures." SID Symposium Digest of Technical Papers. vol. 51. No. 1. 2020.

Zhang, Zhenhua. "74-3: Image Deblurring of Camera Under Display by Deep Learning." ?SID Symposium Digest of Technical Papers. vol. 51. No. 1. 2020.

Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.

Zhao, Xuan, et al. "P-233: Late-News-Poster: Color Shift Improvement of AMOLED Device with Color Filter." SID Symposium Digest of Technical Papers. vol. 51. No. 1. 2020.

English translation of Office Action for Korean Application No. 10-2022-7007834 dated Jul. 5, 2024.

Office Action for Korean Application No. 10-2022-7007834 dated Jul. 5, 2024.

\* cited by examiner

US 12,302,691 B2

OPTO-ELECTRONIC DEVICE INCLUDING AN AUXILIARY ELECTRODE AND A PARTITION

RELATED APPLICATIONS

The present application is an application filed under 35 U.S.C. § 371 of PCT International Patent Application PCT/IB2020/057458, filed 7 Aug. 2020, which claims the benefit of priority to each of U.S. Provisional Patent Application No. 62/885,171, filed 9 Aug. 2019, U.S. Provisional Patent application No. 62/886,289 filed 13 Aug. 2019, U.S. Provisional Patent Application No. 62/993,924 filed 11 Nov. 2019 and U.S. Provisional Patent Application No. 63/013,501 filed 21 Apr. 2020, the contents of each of which are incorporated herein by reference in their entirety.

TECHNICAL FIELD

The present disclosure relates to opto-electronic devices and in particular to an opto-electronic device having first and second electrodes separated by a semiconductor layer and having a conductive coating and/or electrode coating deposited thereon patterned using a patterning coating, which may act as and/or be a nucleation-inhibiting coating (NIC).

BACKGROUND

In an opto-electronic device such as an organic light emitting diode (OLED), at least one semiconducting layer is disposed between a pair of electrodes, such as an anode and a cathode. The anode and cathode are electrically coupled to a power source and respectively generate holes and electrons that migrate toward each other through the at least one semiconducting layer. When a pair of holes and electrons combine, a photon may be emitted.

OLED display panels may comprise a plurality of (sub-)pixels, each of which has an associated pair of electrodes. Various layers and coatings of such panels are typically formed by vacuum-based deposition techniques.

In some applications, it may be desirable to provide a conductive coating in a pattern for each (sub-) pixel of the panel across either or both of a lateral and a cross-sectional aspect thereof, by selective deposition of the conductive coating to form a device feature, such as, without limitation, an electrode and/or a conductive element electrically coupled thereto, during the OLED manufacturing process.

One method for doing so, in some non-limiting applications, involves the interposition of a fine metal mask (FMM) during deposition of an electrode material and/or a conductive element electrically coupled thereto. However, materials typically used as electrodes have relatively high evaporation temperatures, which impacts the ability to re-use the FMM and/or the accuracy of the pattern that may be achieved, with attendant increases in cost, effort and complexity.

One method for doing so, in some non-limiting examples, involves depositing the electrode material and thereafter removing, including by a laser drilling process, unwanted regions thereof to form the pattern. However, the removal process often involves the creation and/or presence of debris, which may affect the yield of the manufacturing process.

Further, such methods may not be suitable for use in some applications and/or with some devices with certain topographical features.

It would be beneficial to provide an improved mechanism for providing selective deposition of a conductive coating.

BRIEF DESCRIPTION OF THE DRAWINGS

Examples of the present disclosure will now be described by reference to the following figures, in which identical reference numerals in different figures indicate identical and/or in some non-limiting examples, analogous and/or corresponding elements and in which.

Figure 1:
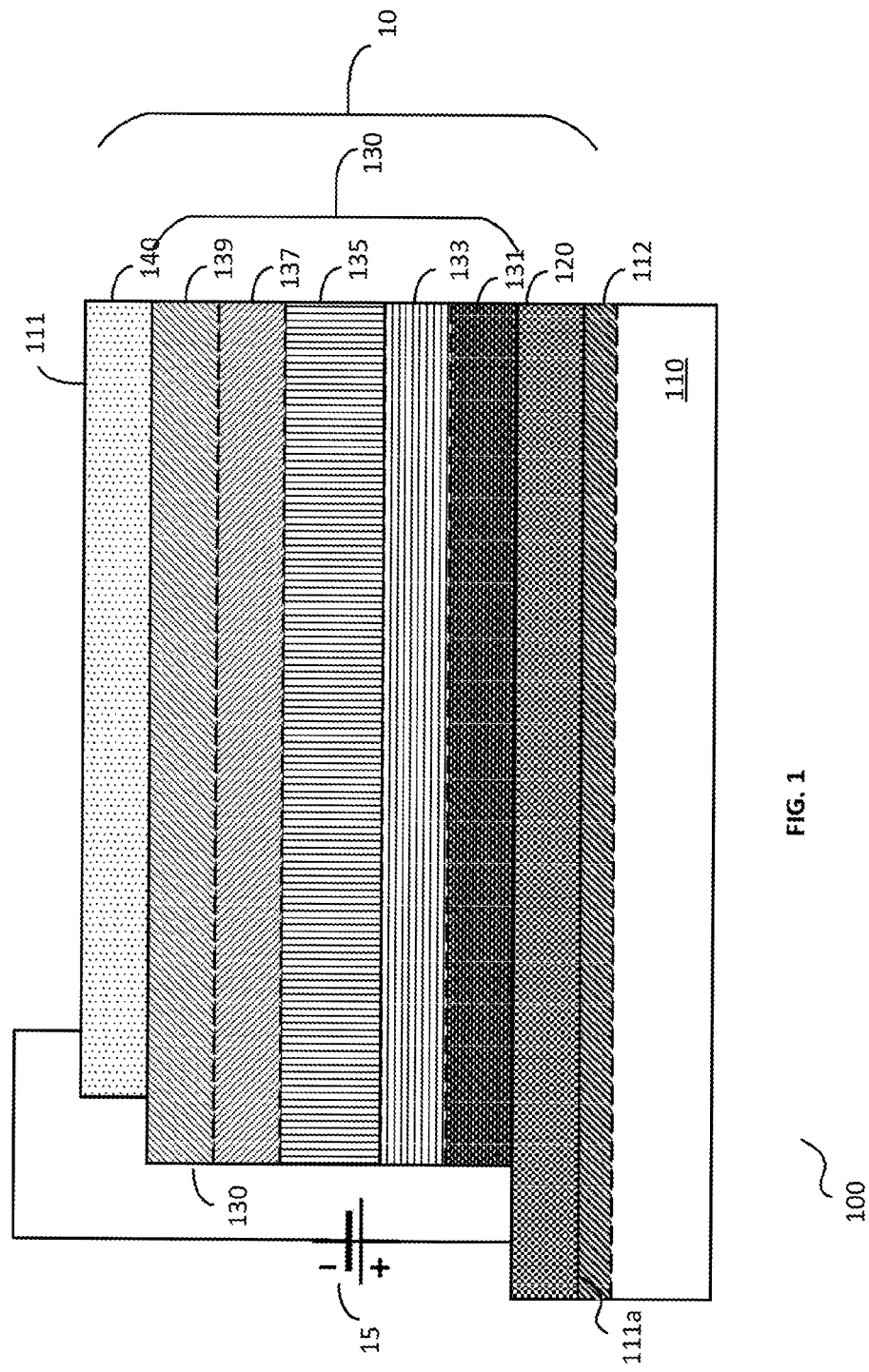
FIG. 1 is a block diagram from a cross-sectional aspect, of an example electro-luminescent device according to an example in the present disclosure.

In the present disclosure, for purposes of explanation and not limitation, specific details are set forth in order to provide a thorough understanding of the present disclosure, including, without limitation, particular architectures, interfaces and/or techniques. In some instances, detailed descriptions of well-known systems, technologies, components, devices, circuits, methods and applications are omitted so as not to obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, so as not to obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses an opto-electronic device having a plurality of layers, comprising, a nucleation-inhibiting coating (NIC) disposed on a first layer surface in a first portion of a lateral aspect. In the first portion, the device comprises a first electrode, a second electrode and a semiconducting layer between them. The second electrode lies between the NIC and the semiconducting layer in the first portion. In the second portion, a conductive coating is disposed on a second layer surface. The first portion is substantially devoid of the conductive coating. The conductive coating is electrically coupled to the second electrode and to a third electrode in a sheltered region of a partition in the device.

According to a broad aspect of the present disclosure, there is disclosed an opto-electronic device having a plurality of layers, comprising: a nucleation-inhibiting coating (NIC) disposed on a first layer surface in a first portion of a lateral aspect thereof, the first portion comprising a first electrode, a second electrode and a semiconducting layer between the first electrode and the second electrode, wherein the second electrode lies between the NIC and the semiconducting layer in the first portion; a conductive coating disposed on a second layer surface in a second portion of the lateral aspect thereof; wherein the first portion is substantially devoid of the conductive coating; and wherein the conductive coating is electrically coupled to the second electrode and to a third electrode in a sheltered region of a partition in the device.

In some non-limiting examples, the first portion can comprise at least one emissive region. In some non-limiting examples, the second portion can comprise at least a part of a non-emissive region.

In some non-limiting examples, the sheltered region can be substantially devoid of the NIC. In some non-limiting examples, the sheltered region can comprise a recess defined by the partition. In some non-limiting examples, the recess can extend substantially laterally within the partition. In some non-limiting examples, the recess can have a ceiling, a side and a floor. In some non-limiting examples, the third electrode can be provided on at least one of the ceiling, the side, the floor and any combination of any of these. In some non-limiting examples, at least one of the ceiling and the side can be defined by the partition. In some non-limiting examples, the conductive coating can be disposed within the recess.

In some non-limiting examples, the partition can comprise a lower section and an upper section. In some non-limiting examples, the lower section can be laterally recessed relative to the upper section to form the recess. In some non-limiting examples, the lower section can comprise the third electrode.

In some non-limiting examples, the third electrode can be integrally formed within the partition. In some non-limiting examples, the conductive coating can be in physical contact with the third electrode. In some non-limiting examples, the conductive coating can be electrically coupled to the second electrode in a coupling region (CR). In some non-limiting examples, the NIC can be disposed between the conductive coating and the second electrode in the CR.

In some non-limiting examples, the sheltered region can comprise an aperture defined by the partition. In some non-limiting examples, the aperture can open into a recess defined by the partition. In some non-limiting examples, the aperture can be angled relative to an axis extending normally away from a surface of the device. In some non-limiting examples, the aperture can have an annular conic profile. In some non-limiting examples, the aperture can expose a surface of the third electrode. In some non-limiting examples, the third electrode can be provided on a surface of the device. In some non-limiting examples, the third electrode can be integrally formed within a substrate of the device.

In some non-limiting examples, the device can further comprise an undercut portion that overlaps a layer surface of the third electrode in a cross-sectional aspect.

In some non-limiting examples, the third electrode can be an auxiliary electrode electrically coupled to a busbar.

In some non-limiting examples, the device can further comprise a further NIC disposed on a third layer surface of the device in a third portion of a lateral aspect thereof; and a further conductive coating disposed on a fourth layer surface of the device in a fourth portion of the lateral aspect thereof.

In some non-limiting examples, the third portion can comprise at least one emissive region. In some non-limiting examples, the fourth portion can comprise at least a part of a non-emissive region.

In some non-limiting examples, the fourth portion can comprise at least one emissive region. In some non-limiting examples, the third portion can comprise at least a part of a non-emissive region. In some non-limiting examples, the third portion can be substantially light-transmissive therethrough.

In some non-limiting examples, the device can further comprise a fourth electrode, a fifth electrode and a further semiconducting layer between the fourth electrode and the fifth electrode, wherein the fifth electrode extends between the further NIC and the further semiconducting layer in the third portion.

Examples have been described above in conduction with aspects of the present disclosure upon which they can be implemented. Those having ordinary skill in the relevant art will appreciate that examples may be implemented in conjunction with the aspect with which they are described but may also be implemented with other examples of that or another aspect. When examples are mutually exclusive, or are otherwise incompatible with each other, it will be apparent to those having ordinary skill in the relevant art. Some examples may be described in relation to one aspect, but may also be applicable to other aspects, as will be apparent to those having ordinary skill in the relevant art.

Some aspects or examples of the present disclosure may provide an opto-electronic device having an NIC disposed on a first layer surface in a first portion of a lateral aspect, which has first and second electrodes and a semiconducting layer between them, in which the second electrode lies between the NIC and the semiconducting layer in the first portion, a conductive coating disposed on a second layer surface in the second portion, where the conductive coating is electrically coupled to the second electrode and to a third electrode in a sheltered region of a partition in the device, such that the first portion is substantially devoid of the conductive coating.

DESCRIPTION

Opto-Electronic Device

The present disclosure relates generally to electronic devices, and more specifically, to opto-electronic devices. An opto-electronic device generally encompasses any device that converts electrical signals into photons and vice versa.

In the present disclosure, the terms "photon" and "light" may be used interchangeably to refer to similar concepts. In the present disclosure, photons may have a wavelength that lies in the visible light spectrum, in the infrared (IR) and/or ultraviolet (UV) region thereof.

In the present disclosure, the term "visible light spectrum" as used herein, generally refers to at least one wavelength in the visible portion of the electromagnetic spectrum. As would be appreciated by those having ordinary skill in the relevant art, such visible portion may correspond to any wavelength from about 380 nm to about 740 nm. In general, electro-luminescent devices are configured to emit and/or transmit light having wavelengths in a range from about 425 nm to about 725 nm, and more specifically, in some non-limiting examples, light having peak emission wavelengths of 456 nm, 528 nm, and 624 nm, corresponding to B(lue), G(reen), and R(ed) sub-pixels, respectively. Accordingly, in the context of such electro-luminescent devices, the visible portion may refer to any wavelength from about 425 nm to about 725 nm, or from about 456 nm to about 624 nm.

An organic opto-electronic device can encompass any opto-electronic device where one or more active layers and/or strata thereof are formed primarily of an organic (carbon-containing) material, and more specifically, an organic semiconductor material.

In the present disclosure, it will be appreciated by those having ordinary skill in the relevant art that an organic material, may comprise, without limitation, a wide variety of organic molecules, and/or organic polymers. Further, it will be appreciated by those having ordinary skill in the relevant art that organic materials that are doped with various inorganic substances, including without limitation, elements and/or inorganic compounds, may still be considered to be organic materials. Still further, it will be appreciated by those having ordinary skill in the relevant art that various organic materials may be used, and that the processes described herein are generally applicable to an entire range of such organic materials.

In the present disclosure, an inorganic substance may refer to a substance that primarily includes an inorganic material. In the present disclosure, an inorganic material may comprise any material that is not considered to be an organic material, including without limitation, metals, glasses and/or minerals.

Where the opto-electronic device emits photons through a luminescent process, the device may be considered an electro-luminescent device. In some non-limiting examples, the electro-luminescent device may be an organic light-emitting diode (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor and/or a television set.

In some non-limiting examples, the opto-electronic device may be an organic photo-voltaic (OPV) device that converts photons into electricity. In some non-limiting examples, the opto-electronic device may be an electro-luminescent quantum dot device. In the present disclosure, unless specifically indicated to the contrary, reference will be made to OLED devices, with the understanding that such disclosure could, in some examples, equally be made applicable to other opto-electronic devices, including without limitation, an OPV and/or quantum dot device in a manner apparent to those having ordinary skill in the relevant art.

The structure of such devices will be described from each of two aspects, namely from a cross-sectional aspect and/or from a lateral (plan view) aspect.

In the present disclosure, the terms "layer" and "strata" may be used interchangeably to refer to similar concepts.

In the context of introducing the cross-sectional aspect below, the components of such devices are shown in substantially planar lateral strata. Those having ordinary skill in the relevant art will appreciate that such substantially planar representation is for purposes of illustration only, and that across a lateral extent of such a device, there may be localized substantially planar strata of different thicknesses and dimension, including, in some non-limiting examples, the substantially complete absence of a layer, and/or layer(s) separated by non-planar transition regions (including lateral gaps and even discontinuities). Thus, while for illustrative purposes, the device is shown below in its cross-sectional aspect as a substantially stratified structure, in the plan view aspect discussed below, such device may illustrate a diverse topography to define features, each of which may substantially exhibit the stratified profile discussed in the cross-sectional aspect.

Cross-Sectional Aspect

FIG. 1 is a simplified block diagram from a cross-sectional aspect, of an example electro-luminescent device according to the present disclosure. The electro-luminescent device, shown generally at 100 comprises a substrate 110, upon which a frontplane 10, comprising a plurality of layers, respectively, a first electrode 120, at least one semiconducting layer 130, and a second electrode 140, is disposed. In some non-limiting examples, the frontplane 10 may provide mechanisms for photon emission and/or manipulation of emitted photons.

For purposes of illustration, an exposed layer surface of underlying material is referred to as 111. In FIG. 1, the exposed layer surface 111 is shown as being of the second electrode 140. Those having ordinary skill in the relevant art will appreciate that, at the time of deposition of, by way of non-limiting example, the first electrode 120, the exposed layer surface 111 would have been shown as 111*a*, of the substrate 110.

Those having ordinary skill in the relevant art will appreciate that when a component, a layer, a region and/or portion thereof is referred to as being "formed", "disposed" and/or "deposited" on another underlying material, component, layer, region and/or portion, such formation, disposition and/or deposition may be directly and/or indirectly on an exposed layer surface 111 (at the time of such formation, disposition and/or deposition) of such underlying material, component, layer, region and/or portion, with the potential of intervening material(s), component(s), layer(s), region(s) and/or portion(s) therebetween.

In the present disclosure, a directional convention is followed, extending substantially normally relative to the lateral aspect described above, in which the substrate 110 is considered to be the "bottom" of the device 100, and the layers 120, 130, 140 are disposed on "top" of the substrate 11. Following such convention, the second electrode 140 is at the top of the device 100 shown, even if (as may be the case in some examples, including without limitation, during a manufacturing process, in which one or more layers 120, 130, 140 may be introduced by means of a vapor deposition process), the substrate 110 is physically inverted such that the top surface, on which one of the layers 120, 130, 140, such as, without limitation, the first electrode 120, is to be disposed, is physically below the substrate 110, so as to allow the deposition material (not shown) to move upward and be deposited upon the top surface thereof as a thin film.

In some non-limiting examples, the device 100 may be electrically coupled to a power source 15. When so coupled, the device 100 may emit photons as described herein.

In some non-limiting examples, the device 100 may be classified according to a direction of emission of photons generated therefrom. In some non-limiting examples, the device 100 may be considered to be a bottom-emission device if the photons generated are emitted in a direction toward and through the substrate 100 at the bottom of the device 100 and away from the layers 120, 130, 140 disposed on top of the substrate 110. In some non-limiting examples, the device 100 may be considered to be a top-emission device if the photons are emitted in a direction away from the substrate 110 at the bottom of the device 100 and toward and/or through the top layer 140 disposed, with intermediate layers 120, 130, on top of the substrate 110. In some non-limiting examples, the device may be a double-sided emission device if it is configured to emit photons in both the bottom (toward and through the substrate 110) and top (toward and through the top layer 140).

Thin Film Formation

The frontplane 10 layers 120, 130, 140 may be disposed in turn on a target exposed layer surface 111 (and/or, in some non-limiting examples, including without limitation, in the case of selective deposition disclosed herein, at least one target region and/or portion of such surface) of an underlying material, which in some non-limiting examples, may be, from time to time, the substrate 110 and intervening lower layers 120, 130, 140, as a thin film. In some non-limiting examples, an electrode 120, 140, 1750 (FIG. 5), 4150 (FIG. 14A) may be formed of at least one thin conductive film layer of a conductive coating 830.

The thickness of each layer, including without limitation, layers 120, 130, 140, and of the substrate 110, shown in FIG. 1, and throughout the figures, is illustrative only and not necessarily representative of a thickness relative to another layer 120, 130, 140 (and/or of the substrate 110).

The formation of thin films during vapor deposition on an exposed layer surface 111 of an underlying material involves processes of nucleation and growth. During initial stages of film formation, a sufficient number of vapor monomers, which in some non-limiting examples may be molecules and/or atoms typically condense from a vapor phase to form initial nuclei on the surface 111 presented, whether of the substrate 110 (or of an intervening lower layer 120, 130, 140). As vapor monomers continue to impinge on such surface, a size and density of these initial nuclei increase to form small clusters or islands. After reaching a saturation island density, adjacent islands typically will start to coalesce, increasing an average island size, while decreasing an island density. Coalescence of adjacent islands may continue until a substantially closed film is formed.

While the present disclosure discusses thin film formation, in reference to at least one layer or coating, in terms of vapor deposition, those having ordinary skill in the relevant art will appreciate that, in some non-limiting examples, various components of the electro-luminescent device 100 may be selectively deposited using a wide variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), physical vapor deposition (PVD) (including without limitation, sputtering), chemical vapor deposition (CVD) (including without limitation, plasma-enhanced CVD (PECVD) and/or organic vapor phase deposition (OVPD)), laser annealing, laser-induced thermal imaging (LITI) patterning, atomic-layer deposition (ALD), coating (including without limitation, spin coating, dip coating, line coating and/or spray coating) and/or combinations thereof. Some processes may be used in combination with a shadow mask, which may, in some non-limiting examples, be an open mask and/or fine metal mask (FMM), during deposition of any of various layers and/or coatings to achieve various patterns by masking and/or precluding deposition of a deposited material on certain parts of a surface of an underlying material exposed thereto.

In the present disclosure, the terms "evaporation" and/or "sublimation" may be used interchangeably to refer generally to deposition processes in which a source material is converted into a vapor, including without limitation by heating, to be deposited onto a target surface in, without limitation, a solid state. As will be understood, an evaporation process is a type of PVD process where one or more source materials are evaporated and/or sublimed under a low pressure (including without limitation, a vacuum) environment and deposited on a target surface through de-sublimation of the one or more evaporated source materials. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source) and/or any other type of evaporation source.

In some non-limiting examples, a deposition source material may be a mixture. In some non-limiting examples, at least one component of a mixture of a deposition source material may not be deposited during the deposition process (or, in some non-limiting examples, be deposited in a relatively small amount compared to other components of such mixture).

In the present disclosure, a reference to a layer thickness of a material, irrespective of the mechanism of deposition thereof, refers to an amount of the material deposited on a target exposed layer surface 111, which corresponds to an amount of the material to cover the target surface with a uniformly thick layer of the material having the referenced layer thickness. By way of non-limiting example, depositing a layer thickness of 10 nanometers (nm) of material indicates that an amount of the material deposited on the surface corresponds to an amount of the material to form a uniformly thick layer of the material that is 10 nm thick. It will be appreciated that, having regard to the mechanism by which thin films are formed discussed above, by way of non-limiting example, due to possible stacking or clustering of monomers, an actual thickness of the deposited material may be non-uniform. By way of non-limiting example, depositing a layer thickness of 10 nm may yield some parts of the deposited material having an actual thickness greater than 10 nm, or other parts of the deposited material having an actual thickness less than 10 nm. A certain layer thickness of a material deposited on a surface may thus correspond, in some non-limiting examples, to an average thickness of the deposited material across the target surface.

In the present disclosure, a reference to a reference layer thickness refers to a layer thickness of a material for forming the conductive coating 830 (FIG. 4), that is deposited on a reference surface exhibiting a high initial sticking probability or initial sticking coefficient $S_0$ (that is, a surface having an initial sticking probability $S_0$ that is about and/or close to 1). The reference layer thickness does not indicate an actual thickness of the material for forming the conductive coating 830 deposited on a target surface (such as, without limitation, a surface of a nucleation-inhibiting coating (NIC) 810 (FIG. 4)). Rather, the reference layer thickness refers to a layer thickness of the material for forming the conductive coating 830 that would be deposited on a reference surface, in some non-limiting examples, a surface of a quartz crystal positioned inside a deposition chamber for monitoring a deposition rate and the reference layer thickness, upon subjecting the target surface and the reference surface to identical vapor flux of the material for forming the conductive coating 830 for the same deposition period. Those having ordinary skill in the relevant art will appreciate that if the target surface and the reference surface are not subjected to identical vapor flux simultaneously during deposition, an appropriate tooling factor may be used to determine and/or to monitor the reference layer thickness.

In the present disclosure, a reference to depositing a number X of monolayers of material refers to depositing an amount of the material to cover a desired area of an exposed layer surface 111 with X single layer(s) of constituent monomers of the material. In the present disclosure, a reference to depositing a fraction 0.X monolayer of a material refers to depositing an amount of the material to cover a fraction 0.X of a desired area of a surface with a single layer of constituent monomers of the material. Those having ordinary skill in the relevant art will appreciate that due to, by way of non-limiting example, possible stacking and/or clustering of monomers, an actual local thickness of a deposited material across a desired area of a surface may be non-uniform. By way of non-limiting example, depositing 1 monolayer of a material may result in some local regions of the desired area of the surface being uncovered by the material, while other local regions of the desired area of the surface may have multiple atomic and/or molecular layers deposited thereon.

In the present disclosure, a target surface (and/or target region(s) thereof) may be considered to be "substantially devoid of", "substantially free of" and/or "substantially uncovered by" a material if there is a substantial absence of the material on the target surface as determined by any suitable determination mechanism.

In some non-limiting examples, one measure of an amount of a material on a surface is a percentage coverage of the surface by such material. In some non-limiting examples surface coverage may be assessed using a variety of imaging techniques, including without limitation, transmission electron microscopy (TEM), atomic force microscopy (AFM) and/or scanning electron microscopy (SEM).

In some non-limiting examples, one measure of an amount of an electrically conductive material on a surface is a (light) transmittance, since in some non-limiting examples, electrically conductive materials, including without limitation, metals, including without limitation silver (Ag), magnesium (Mg), and/or ytterbium (Yb), attenuate and/or absorb photons.

In the present disclosure, for purposes of simplicity of description, the terms "coating film" or "closed film", as used herein, refer to a thin film structure and/or coating of a material used for a conductive coating 830, in which a relevant portion of a surface is substantially coated thereby, such that such surface is not substantially exposed by or through the coating film deposited thereon. In some non-limiting examples, a coating film of a conductive coating 830 may be disposed to cover a portion of an underlying surface, such that, within such portion, less than about 40%, less than about 30%, less than about 25%, less than about 20%, less than about 15%, less than about 10%, less than about 5%, less than about 3%, or less than about 1% of the underlying surface therewithin is exposed by or through the coating film.

In the present disclosure, for purposes of simplicity of description, the term "discontinuous coating" as used herein, refers to a thin film structure and/or coating of a material used for a conductive coating 830, in which a relevant portion of a surface coated thereby, is neither substantially devoid of such material, or forms a coating film thereof. In some non-limiting examples, a discontinuous coating of a conductive coating 830 may manifest as a plurality of discrete islands deposited on such surface.

In the present disclosure, for purposes of simplicity of illustration, details of deposited materials, including without limitation, thickness profiles and/or edge profiles of layer(s) have been omitted.

Substrate

In some examples, the substrate 110, and in some non-limiting examples, a base substrate 112 thereof, may be formed of material suitable for use therefor, including without limitation, an inorganic material, including without limitation, silicon (Si), glass, metal (including without limitation, a metal foil), sapphire, and/or other suitable inorganic material, and/or an organic material, including without limitation, a polymer, including without limitation, a polyimide and a silicon-based polymer. In some non-limiting examples, the substrate 110 may includes one or more layers of organic and/or inorganic materials formed on a base substrate 112. Non-limiting examples of such materials include, but are not limited to, those used to form electron injection layer(s) (EIL(s)) 139 and/or transport layer(s) (ETL(s)) 137.

In some non-limiting examples, additional layers may be provided. Such additional layers may, in some non-limiting examples, comprise and/or be formed of and/or as a backplane layer 20. In some non-limiting examples, the backplane layer 20 contains power circuity and/or switching elements for driving the device 100, including without limitation, one or more electronic and/or opto-electronic components, including without limitation, thin-film transistor (TFT) transistors, resistors and/or capacitors (collectively TFT structure 200 (FIG. 2)), that, in some non-limiting examples, may be formed by a photolithography process. In some non-limiting examples, such TFT structures 200 may comprise a semiconductor active area 220 (FIG. 2) formed over a part of buffer layer 210 (FIG. 2), with a gate insulating layer 230 (FIG. 2) is deposited on substantially cover the semiconductor active area 220. In some non-limiting examples, a gate electrode 240 (FIG. 2) is formed on top of the gate insulating layer 230 and an interlayer insulating layer 250 (FIG. 2) is deposited thereon. In some non-limiting examples, a TFT source electrode 260 (FIG. 2) and a TFT drain electrode 270 (FIG. 2) are formed such that they extend through openings formed through both the interlayer insulating layer 250 and the gate insulating layer 230 such that they are electrically coupled to the semiconductor active area 220. In some non-limiting examples, a TFT insulating layer 280 (FIG. 2) is then formed over the TFT structure 200.

First Electrode

The first electrode 120 is deposited over the substrate 110. In some non-limiting examples, the first electrode 120 is electrically coupled to a terminal of the power source 15 and/or to ground. In some non-limiting examples, the first electrode 120 is so coupled through at least one driving circuit, which in some non-limiting examples, may incorporate at least one TFT structure 200 in the backplane 20 of the substrate 110.

In some non-limiting examples, the first electrode 120 may comprise an anode and/or a cathode. In some non-limiting examples, the first electrode 120 is an anode.

In some non-limiting examples, the first electrode 120 may be formed by depositing at least one thin conductive film, over (a part of) the substrate 110. In some non-limiting examples, there may be a plurality of first electrodes 120, disposed in a spatial arrangement over a lateral aspect of the substrate 110. In some non-limiting examples, one or more of such at least one first electrodes 120 may be electrically coupled to an electrode of the TFT structure 200 in the backplane 20.

In some non-limiting examples, the at least one first electrode 120 and/or at least one thin film thereof, may comprise various materials, including without limitation, one or more metallic materials, including without limitation, Mg, aluminum (Al), calcium (Ca), Zn, Ag, cadmium (Cd), barium (Ba) and/or Yb, and/or combinations thereof, including without limitation, alloys containing any of such materials, one or more metal oxides, including without limitation, a transparent conducting oxide (TCO), including without limitation, ternary compositions such as, without limitation, fluorine tin oxide (FTO), indium zinc oxide (IZO), and/or indium tin oxide (ITO) and/or combinations thereof and/or in varying proportions, and/or combinations thereof in at least one layer, any one or more of which may be, without limitation, a thin film.

Second Electrode

The second electrode 140 is deposited over the at least one semiconducting layer 130. In some non-limiting examples, the second electrode 140 is electrically coupled to a terminal of the power source 15 and/or to ground. In some non-limiting examples, the second electrode 140 is so coupled through at least one driving circuit, which in some non-limiting examples, may incorporate at least one TFT structure 200 in the backplane 20 of the substrate 110.

In some non-limiting examples, the second electrode 140 may comprise an anode and/or a cathode. In some non-limiting examples, the second electrode 140 is a cathode.

In some non-limiting examples, the second electrode 140 may be formed by depositing a conductive coating 830, in some non-limiting examples, as at least one thin film, over (a part of) the at least one semiconducting layer 130. In some non-limiting examples, there may be a plurality of second electrodes 140, disposed in a spatial arrangement over a lateral aspect of the at least one semiconducting layer 130.

In some non-limiting examples, the at least one second electrode 140 may comprise various materials, including without limitation, one or more metallic materials, including without limitation, Mg, Al, Ca, Zn, Ag, Cd, Ba and/or Yb, and/or combinations thereof, including without limitation, alloys containing any of such materials, one or more metal oxides, including without limitation, a TCO, including without limitation, ternary compositions such as, without limitation, FTO, IZO, and/or ITO and/or combinations thereof and/or in varying proportions, and/or zinc oxide (ZnO) and/or other oxides containing indium (In) and/or Zn, and/or combinations thereof in at least one layer, and/or one or more non-metallic materials, any one or more of which may be, without limitation, a thin conductive film.

For purposes of simplicity of description, in the present disclosure, a combination of a plurality of elements in a single layer is denoted by separating two such elements by a colon ":", while a plurality of (combination(s) of) elements comprising a plurality of layers in a multi-layer coating are denoted by separating two such layers by a slash "/". In some non-limiting examples, the layer after the slash may be deposited on the layer preceding the slash.

In some non-limiting examples, for a Mg:Ag alloy, such alloy composition may range from about 1:10 to about 10:1 by volume.

In some non-limiting examples, the second electrode 140 may comprise a plurality of such layers and/or coatings. In some non-limiting examples, such layers and/or coatings may be distinct layers and/or coatings disposed on top of one another.

In some non-limiting examples, the second electrode 140 may comprise a Yb/Ag bi-layer coating. By way of non-limiting examples, such bi-layer coating may be formed by depositing a Yb coating, followed by an Ag coating. A thickness of such Ag coating may be greater than a thickness of the Yb coating.

In some non-limiting examples, the second electrode 140 may be a multi-layer electrode 140 comprising at least one metallic layer and/or at least one oxide layer.

Semiconducting Layer

In some non-limiting examples, the at least one semiconducting layer 130 may comprise a plurality of layers 131, 133, 135, 137, 139, any of which may be disposed, in some non-limiting examples, in a thin film, in a stacked configuration, which may include, without limitation, any one or more of a hole injection layer (HIL) 131, a hole transport layer (HTL) 133, an emissive layer (EML) 135, an electron transport layer (ETL) 137 and/or an electron injection layer (EIL) 139. In the present disclosure, the term "semiconducting layer(s)" may be used interchangeably with "organic layer(s)" since the layers 131, 133, 135, 137, 139 in an OLED device 100 may in some non-limiting examples, may comprise organic semiconducting materials.

Those having ordinary skill in the relevant art will readily appreciate that the structure of the device 100 may be varied by omitting and/or combining one or more of the semiconductor layers 131, 133, 135, 137, 139 and/or by introducing one or more additional layers (not shown) at appropriate position(s) within the semiconducting layer 130 stack.

In some non-limiting examples, the EML 135 may be formed, by way of non-limiting example, by doping a host material with at least one emitter material. In some non-limiting examples, the emitter material may be a fluorescent emitter, a phosphorescent emitter, a thermally activated delayed fluorescence (TADF) emitter and/or a plurality of any combination of these.

In some non-limiting examples, the device 100 may be an OLED in which the at least one semiconducting layer 130 comprises at least an EML 135 interposed between conductive thin film electrodes 120, 140, whereby, When a potential difference is applied across them, holes are injected through the anode and electrons are through the cathode into the at least one semiconducting layer 130 until they combine to form a bound state electron-hole pair referred to as an exciton. Especially if the exciton is formed in the EML 135, the exciton may decay through a radiative recombination process, in which a photon is emitted.

In some non-limiting examples, an exciton may decay through a non-radiative process, in which no photon is released, especially if the exciton is not formed in the EML 135.

Lateral Aspect

In some non-limiting examples, including where the OLED device 100 comprises a lighting panel, an entire lateral aspect of the device 100 may correspond to a single lighting element. As such, the substantially planar cross-sectional profile shown in FIG. 1 may extend substantially along the entire lateral aspect of the device 100, such that photons are emitted from the device 100 substantially along the entirety of the lateral extent thereof. In some non-limiting examples, such single lighting element may be driven by a single driving circuit of the device 100.

In some non-limiting examples, including where the OLED device 100 comprises a display module, the lateral aspect of the device 100 may be sub-divided into a plurality of emissive regions 1910 (FIG. 5) of the device 100, in which the cross-sectional aspect of the device structure 100, within each of the emissive region(s) 1910 shown, without limitation, in FIG. 1 causes photons to be emitted therefrom when energized.

Emissive Regions

In some non-limiting examples, individual emissive regions 1910 of the device 100 may be laid out in a lateral pattern. In some non-limiting examples, the pattern may extend along a first lateral direction. In some non-limiting examples, the pattern may also extend along a second lateral direction, which in some non-limiting examples, may be substantially normal to the first lateral direction. In some non-limiting examples, each emissive region 1910 of the device 100 corresponds to a single display pixel. In some non-limiting examples, each pixel emits light at a given wavelength spectrum. In some non-limiting examples, the wavelength spectrum corresponds to a colour in, without limitation, the visible light spectrum.

In some non-limiting examples, each emissive region 1910 of the device 100 corresponds to a sub-pixel of a display pixel. In some non-limiting examples, a plurality of sub-pixels may combine to form, or to represent, a single display pixel.

In some non-limiting examples, a single display pixel may be represented by three sub-pixels. In some non-limiting examples, the three sub-pixels may be denoted as, respectively, R(ed) sub-pixels, G(reen) sub-pixels and/or B(lue) sub-pixels.

In the present disclosure, the concept of a pixel may be discussed on conjunction with the concept of at least one sub-pixel thereof. For simplicity of description only, such composite concept is referenced herein as a "(sub-) pixel" and such term is understood to suggest either or both of a pixel and/or at least one sub-pixel thereof, unless the context dictates otherwise.

In some non-limiting examples, the emission spectrum of the light emitted by a given sub-pixel corresponds to the colour by which the sub-pixel is denoted. In some non-limiting examples, a sub-pixel is associated with a first set of other sub-pixels to represent a first display pixel and also with a second set of other sub-pixels to represent a second display pixel, so that the first and second display pixels may have associated therewith, the same sub-pixel(s).

The pattern and/or organization of sub-pixels into display pixels continues to develop. All present and future patterns and/or organizations are considered to fall within the scope of the present disclosure.

Non-Emissive Regions

In some non-limiting examples, the various emissive regions 1910 of the device 100 are substantially surrounded and separated by, in at least one lateral direction, one or more non-emissive regions 1920 (FIG. 5), in which the structure and/or configuration along the cross-sectional aspect, of the device structure 100 shown, without limitation, in FIG. 1, is varied, so as to substantially inhibit photons to be emitted therefrom. In some non-limiting examples, the non-emissive regions 1920 comprise those regions in the lateral aspect, that are substantially devoid of an emissive region 1910.

Figure 2:
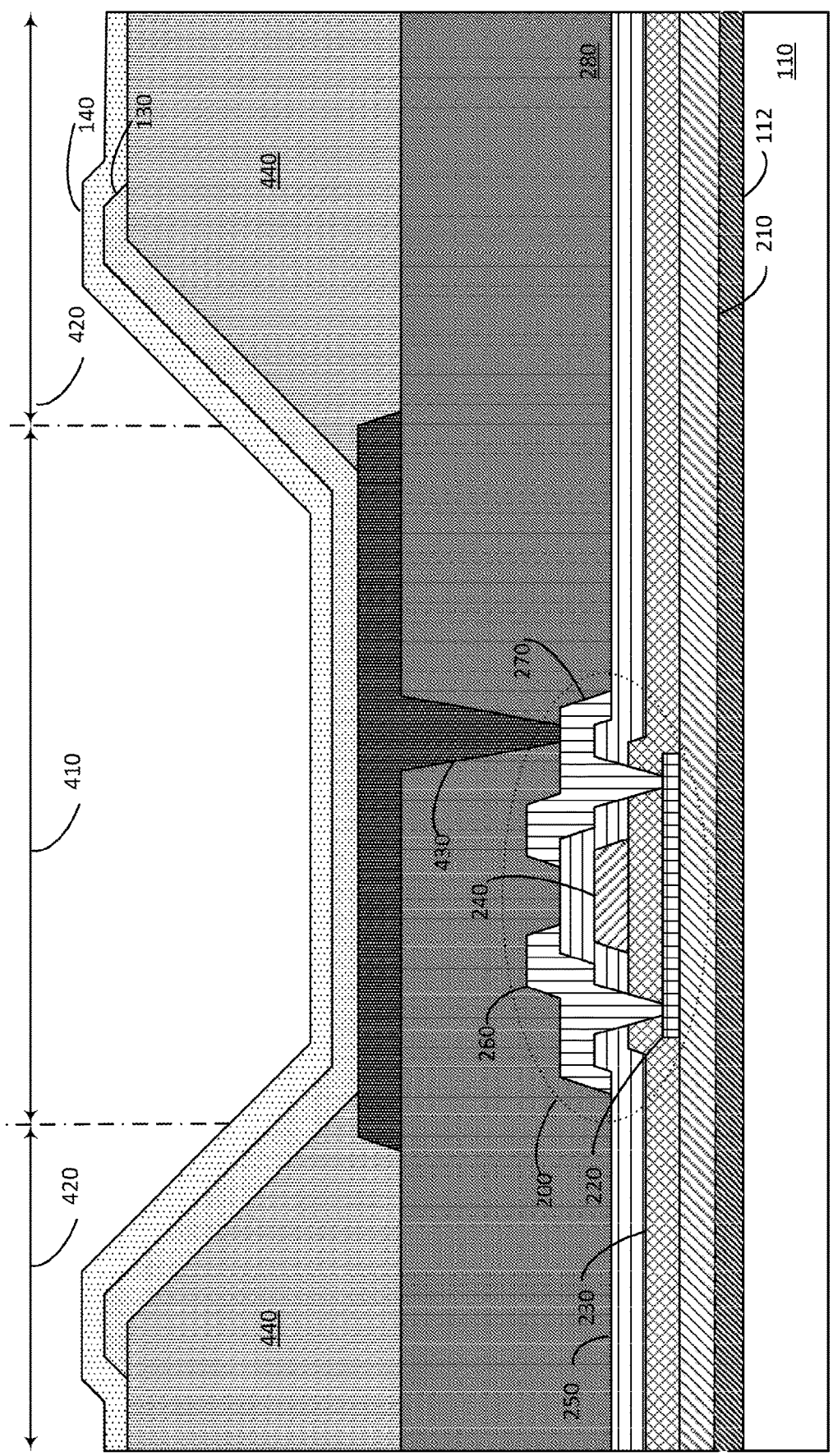
FIG. 2 is a cross-sectional view of the device of FIG. 1.

Thus, as shown in the cross-sectional view of FIG. 2, the lateral topology of the various layers of the at least one semiconducting layer 130 may be varied to define at least one emissive region 1910, surrounded (at least in one lateral direction) by at least one non-emissive region 1920.

In some non-limiting examples, the emissive region 1910 corresponding to a single display (sub-) pixel may be understood to have a lateral aspect 410, surrounded in at least one lateral direction by at least one non-emissive region 1920 having a lateral aspect 420.

A non-limiting example of an implementation of the cross-sectional aspect of the device 100 as applied to an emissive region 1910 corresponding to a single display (sub-) pixel of an OLED display 100 will now be described. While features of such implementation are shown to be specific to the emissive region 1910, those having ordinary skill in the relevant art will appreciate that in some non-limiting examples, more than one emissive region 1910 may encompass common features.

In some non-limiting examples, the first electrode 120 may be disposed over an exposed layer surface 111 of the device 100, in some non-limiting examples, within at least a part of the lateral aspect 410 of the emissive region 1910. In some non-limiting examples, at least within the lateral aspect 410 of the emissive region 1910 of the (sub-) pixel(s), the exposed layer surface 111, may, at the time of deposition of the first electrode 120, comprise the TFT insulating layer 280 of the various TFT structures 200 that make up the driving circuit for the emissive region 1910 corresponding to a single display (sub-) pixel.

In some non-limiting examples, the TFT insulating layer 280 may be formed with an opening 430 extending therethrough to permit the first electrode 120 to be electrically coupled to one of the TFT electrodes 240, 260, 270, including, without limitation, by way of the non-limiting example shown in FIG. 2, the TFT drain electrode 270.

In FIG. 2, for purposes of simplicity of illustration, only one TFT structure 200 is shown, but it will be appreciated by those having ordinary skill in the relevant art, that such TFT structure 200 is representative of such plurality thereof that comprise the driving circuit.

In a cross-sectional aspect, the configuration of each emissive region 1910 may, in some non-limiting examples, be defined by the introduction of at least one pixel definition layer (PDL) 440 substantially throughout the lateral aspects 420 of the surrounding non-emissive region(s) 1920. In some non-limiting examples, the PDLs 440 may comprise an insulating organic and/or inorganic material.

In some non-limiting examples, the PDLs 440 are deposited substantially over the TFT insulating layer 280, although, as shown, in some non-limiting examples, the PDLs 440 may also extend over at least a part of the deposited first electrode 120 and/or its outer edges.

In some non-limiting examples, as shown in FIG. 2, the cross-sectional thickness and/or profile of the PDLs 440 may impart a substantially valley-shaped configuration to the emissive region 1910 of each (sub-) pixel by a region of increased thickness along a boundary of the lateral aspect 420 of the surrounding non-emissive region 1920 with the lateral aspect 410 of the surrounded emissive region 1910, corresponding to a (sub-) pixel.

In some non-limiting examples, the profile of the PDLs 440 may have a reduced thickness beyond such valley-shaped configuration, including without limitation, away from the boundary between the lateral aspect 420 of the surrounding non-emissive region 1920 and the lateral aspect 410 of the surrounded emissive region 1910, in some non-limiting examples, substantially well within the lateral aspect 420 of such non-emissive region 1920.

In some non-limiting examples, the at least one semiconducting layer 130 may be deposited over the exposed layer surface 111 of the device 100, including at least a part of the lateral aspects 410 of such emissive region 1910 of the (sub-) pixel(s). In some non-limiting examples, at least within the lateral aspects 410 of the emissive region 1910 of the (sub-) pixel(s), such exposed layer surface 111, may, at the time of deposition of the at least one semiconducting layer 130 (and/or layers 131, 133, 135, 137, 139 thereof), comprise the first electrode 120.

In some non-limiting examples, the second electrode 140 may be disposed over an exposed layer surface 111 of the device 100, including at least a part of the lateral aspects 410 of the emissive regions 1910 of the (sub-) pixel(s). In some non-limiting examples, at least within the lateral aspects 410 of the emissive region 1910 of the (sub-) pixel(s), such exposed layer surface 111, may, at the time of deposition of the second electrode 140, comprise the at least one semiconducting layer 130.

In some non-limiting examples, the second electrode 140 may also extend beyond the lateral aspects 410 of the emissive regions 1910 of the (sub-) pixel(s) and at least partially within the lateral aspects 420 of the surrounding non-emissive region(s) 1920. In some non-limiting examples, such exposed layer surface 111 of such surrounding non-emissive region(s) 1920 may, at the time of deposition of the second electrode 140, comprise the PDL(s) 440.

In some non-limiting examples, the second electrode 140 may extend throughout substantially all or a substantial part of the lateral aspects 420 of the surrounding non-emissive region(s) 1920.

Transmissivity

In some non-limiting examples, it may be desirable to make either or both of the first electrode 120 and/or the second electrode 140 substantially photon- (or light)-transmissive ("transmissive"), in some non-limiting examples, at least across a substantial part of the lateral aspect 410 of the emissive region(s) 1910 of the device 100. In the present disclosure, such a transmissive element, including without limitation, an electrode 120, 140, a material from which such element is formed, and/or property of thereof, may comprise an element, material and/or property thereof that is substantially transmissive ("transparent"), and/or, in some non-limiting examples, partially transmissive ("semi-transparent"), in some non-limiting examples, in at least one wavelength range.

In some non-limiting examples, a mechanism to make the first electrode 120, and/or the second electrode 140 transmissive is to form such electrode 120, 140 of a transmissive thin film.

In some non-limiting examples, an electrically conductive coating 830, in a thin film, including without limitation, those formed by a depositing a thin conductive film layer of a metal, including without limitation, Ag, Mg, Yb, and/or by depositing a thin layer of a metallic alloy, including without limitation, an Mg:Ag alloy and/or a Yb:Ag alloy, may exhibit light-transmissive characteristics. In some non-limiting examples, the alloy may comprise a composition ranging from between about 1:10 to about 10:1 by volume. In some non-limiting examples, the electrode 120, 140 may be formed of a plurality of thin conductive film layers of any combination of conductive coatings 830, any one or more of which may be comprised of TCOs, thin metal films, thin metallic alloy films and/or any combination of any of these.

In some non-limiting examples, especially in the case of such thin conductive films, a relatively thin layer thickness may be up to substantially a few tens of nm so as to contribute to enhanced transmissive qualities but also favorable optical properties (including without limitation, reduced microcavity effects) for use in an OLED device 100.

In some non-limiting examples, a reduction in the thickness of an electrode 120, 140 to promote transmissive qualities may be accompanied by an increase in the sheet resistance of the electrode 120, 140.

In some non-limiting examples, a device 100 having at least one electrode 120, 140 with a high sheet resistance creates a large current-resistance (IR) drop when coupled to the power source 15, in operation. In some non-limiting examples, such an IR drop may be compensated for, to some extent, by increasing a level (VDD) of the power source 15. However, in some non-limiting examples, increasing the level of the power source 15 to compensate for the IR drop due to high sheet resistance, for at least one (sub-) pixel may call for increasing the level of a voltage to be supplied to other components to maintain effective operation of the device 100.

In some non-limiting examples, to reduce power supply demands for a device 100 without significantly impacting an ability to make an electrode 120, 140 substantially transmissive (by employing at least one thin film layer of any combination of TCOs, thin metal films and/or thin metallic alloy films), an auxiliary electrode 1750 and/or busbar structure 4150 may be formed on the device 100 to allow current to be carried more effectively to various emissive region(s) of the device 100, while at the same time, reducing the sheet resistance and its associated IR drop of the transmissive electrode 120, 140.

By way of non-limiting example, the second electrode 140 may be made transmissive. On the other hand, in some non-limiting examples, such auxiliary electrode 1750 and/or busbar 4150 may not be substantially transmissive but may be electrically coupled to the second electrode 140, including without limitation, by deposition of a conductive coating 830 therebetween, to reduce an effective sheet resistance of the second electrode 140.

In some non-limiting examples, such auxiliary electrode 1750 may be positioned and/or shaped in either or both of a lateral aspect and/or cross-sectional aspect so as not to interfere with the emission of photons from the lateral aspect 410 of emissive region(s) 1910 of a (sub-) pixel.

In some non-limiting examples, a mechanism to make the first electrode 120, and/or the second electrode 140, is to form such electrode 120, 140 in a pattern across at least a part of the lateral aspect 410 of the emissive region(s) 1910 thereof and/or in some non-limiting examples, across at least a part of the lateral aspect 420 of the non-emissive region(s) 1920 surrounding them. In some non-limiting examples, such mechanism may be employed to form the auxiliary electrode 1750 and/or busbar 4150 in a position and/or shape in either or both of a lateral aspect and/or cross-sectional aspect so as not to interfere with the emission of photons from the lateral aspect 410 of emissive region(s) 1910 of a (sub-) pixel, as discussed above.

In some non-limiting examples, the device 100 may be configured such that it is substantially devoid of a conductive oxide material in an optical path of photons emitted by the device 100. By way of non-limiting example, in the lateral aspect 410 of at least one emissive region 1910 corresponding to a (sub-) pixel, at least one of the layers and/or coatings deposited after the at least one semiconducting layer 130, including without limitation, the second electrode 140, the NIC 810 and/or any other layers and/or coatings deposited thereon, may be substantially devoid of any conductive oxide material. In some non-limiting examples, being substantially devoid of any conductive oxide material may reduce absorption and/or reflection of light emitted by the device 100. By way of non-limiting example, conductive oxide materials, including without limitation, ITO and/or IZO, may absorb light in at least the B (lue) region of the visible spectrum, which may, in generally, reduce efficiency and/or performance of the device 100.

In some non-limiting examples, a combination of these and/or other mechanisms may be employed.

Additionally, in some non-limiting examples, in addition to rendering one or more of the first electrode 120, the second electrode 140, the auxiliary electrode 1750 and/or the busbar 4150, substantially transmissive across at least across a substantial part of the lateral aspect 410 of the emissive region(s) 1910 corresponding to the (sub-) pixel(s) of the device 100, in order to allow photons to be emitted substantially across the lateral aspect(s) 410 thereof, it may be desired to make at least one of the lateral aspect(s) 420 of the non-emissive region(s) 1920 of the device 100 substantially transmissive in both the bottom and top directions, so as to render the device 100 substantially transmissive relative to light incident on an external surface thereof, such that a substantial part such externally-incident light may be transmitted through the device 100, in addition to the emission (in a top-emission, bottom-emission and/or double-sided emission) of photons generated internally within the device 100 as disclosed herein.

Conductive Coating

In the present disclosure, the terms "conductive coating" and "electrode coating" may be used interchangeably to refer to similar concepts and references to a conductive coating 830 herein, in the context of being patterned by selective deposition of an NIC 810 may, in some non-limiting examples, be applicable to an electrode coating in the context of being patterned by selective deposition of a patterning coating. In some non-limiting examples, reference to an electrode coating may signify a coating having a specific composition as described herein.

In some non-limiting examples, the conductive coating 830 includes Zn, Mg, Yb, lithium (Li), calcium (Ca), indium (In), Ba, manganese (Mn), Ag, Al, copper (Cu), gold (Au), iron (Fe), cobalt (Co), nickel (Ni), palladium (Pd), platinum (Pt), yttrium (Y), and/or lanthanum (La).

In some non-limiting examples, the conductive coating 830 includes at least one of: Ag, Au, Pt, Cu, and Pd. In some non-limiting examples, the conductive coating 830 includes at least one of: Fe, Co, and Ni. In some non-limiting examples, the conductive coating 830 includes Al. In some non-limiting examples, the conductive coating includes at least one of: Li, Ca, In, Ba, Mn, Y, and La. In some non-limiting examples, the conductive coating 830 includes at least one of: Ag, Mg, Yb, and Zn. In some non-limiting examples, the conductive coating 830 includes Ag, Mg, and/or Yb.

In some non-limiting examples, the conductive coating material 831 used to deposit a conductive coating 830 onto an exposed layer surface 111, may be a substantially pure element. In some further non-limiting examples, the conductive coating 830 includes a substantially pure element. In some other non-limiting examples, the conductive coating 830 includes two or more elements, which may for example be provided as an alloy or a mixture.

In some non-limiting examples, the conductive coating 830 includes one or more additional elements to the element(s) described above. Non-limiting examples of such additional elements include oxygen (O), sulfur (S), nitrogen (N), and carbon (C). It will be appreciated by those having ordinary skill in the relevant art that such one or more additional elements may be incorporated into the conductive coating 830 intentionally, or as a contaminant due to the presence of such additional element(s) in the source material, equipment used for deposition, and/or the vacuum chamber environment. In some non-limiting examples, such additional elements may form a compound together with the element(s) of the conductive coating 830.

In some non-limiting examples, the conductive coating 830 in an opto-electronic device according to various example includes Ag. In some non-limiting examples, the conductive coating 830 comprises substantially pure Ag. In some non-limiting examples, the conductive coating 830 includes other metals in place of and/or in combination with Ag. In some non-limiting examples, the conductive coating 830 includes an alloy of Ag with one or more other metals. In some non-limiting examples, the conductive coating 830 includes an alloy of Ag with Mg, Yb, and/or Zn. In some non-limiting examples, such alloy may be a binary alloy having a composition from about 5 vol. % Ag to about 95 vol. % Ag, with the remainder being the other metal. In some non-limiting examples, the conductive coating 830 includes Ag and Mg. Non-limiting examples of such conductive coating 830 includes an Mg:Ag alloy having a composition from about 1:10 to about 10:1 by volume. In some non-limiting examples, the conductive coating 830 includes Ag and Yb. Non-limiting examples of such conductive coating 830 includes a Yb:Ag alloy having a composition from about 1:20 to about 10:1 by volume. In some non-limiting examples, the conductive coating 830 includes Mg and Yb, for example as an Mg:Yb alloy. In some non-limiting examples, the conductive coating 830 includes Ag, Mg, and Yb, for example as an Ag:Mg:Yb alloy.

In some non-limiting examples, the conductive coating 830 includes two or more layers having different compositions from one another. In some non-limiting examples, two or more layers of the conductive coating 830 include a different element from one another. Non-limiting examples of such conductive coating 830 include multilayer coatings formed by: Yb/Ag, Yb/Mg, Yb/Mg:Ag, Mg/Ag, Yb/Yb:Ag, Yb/Ag/Mg, and/or Yb/Mg/Ag.

In some non-limiting examples, the material used to deposit a conductive coating 830 onto an exposed layer surface 111, including without limitation, Mg, may be substantially pure.

Patterning

As a result of the foregoing, it may be desirable to selectively deposit, across the lateral aspect 410 of the emissive region(s) 1910 of a (sub-) pixel and/or the lateral aspect 420 of the non-emissive region(s) 1920 surrounding the emissive region(s) 1910, a device feature, including without limitation, at least one of the first electrode 120, the second electrode 140, the auxiliary electrode 1750 and/or busbar 4150 and/or a conductive element electrically coupled thereto, in a pattern, on an exposed layer surface 111 of a frontplane 10 layer of the device 100. In some non-limiting examples, the first electrode 120, the second electrode 140, the auxiliary electrode 1750 and/or the busbar 4150 may be deposited in at least one of a plurality of conductive coatings 830.

However, it may not be feasible to employ a shadow mask such as a fine metal mask (FMM) that may, in some non-limiting examples, be used to form relatively small features, with a feature size on the order of tens of microns or smaller to achieve such patterning of a conductive coating 830, since, in some non-limiting examples:

- an FMM may be deformed during a deposition process, especially at high temperatures, such as may be employed for deposition of a thin conductive film;
- limitations on the mechanical (including, without limitation, tensile) strength of the FMM and/or shadowing effects, especially in a high-temperature deposition process, may impart a constraint on an aspect ratio of features that may be achievable using such FMMs;
- the type and number of patterns that may be achievable using such FMMs may be constrained since, by way of non-limiting example, each part of the FMM will be physically supported so that, in some non-limiting examples, some patterns may not be achievable in a single processing stage, including by way of non-limiting example, where a pattern specifies an isolated feature;
- FMMs may exhibit a tendency to warp during a high-temperature deposition process, which may, in some non-limiting examples, distort the shape and position of apertures therein, which may cause the selective deposition pattern to be varied, with a degradation in performance and/or yield;
- FMMs that may be used to produce repeating structures spread across the entire surface of a device 100, may call for many apertures to be formed in the FMM, which may compromise the structural integrity of the FMM;
- repeated use of FMMs in successive depositions, especially in a metal deposition process, may cause the deposited material to adhere thereto, which may obfuscate features of the FMM, and which may cause the selective deposition pattern to be varied, with a degradation in performance and/or yield;
- while FMMs may be periodically cleaned to remove adhered non-metallic material, such cleaning procedures may not be suitable for use with adhered metal, and even so, in some non-limiting examples, may be time-consuming and/or expensive; and
- irrespective of any such cleaning processes, continued use of such FMMs, especially in a high-temperature deposition process, may render them ineffective at producing a desired patterning, at which point they may be discarded and/or replaced, in a complex and expensive process.

Nucleation-Inhibiting and/or Promoting Material Properties

In some non-limiting examples, a conductive coating 830, that may be employed as, or as at least one of a plurality of layers of thin conductive films to form a device feature, including without limitation, at least one of the first electrode 120, the first electrode 140, an auxiliary electrode 1750 and/or a busbar 4150 and/or a conductive element electrically coupled thereto, may exhibit a relatively low affinity towards being deposited on an exposed layer surface 111 of an underlying material, so that the deposition of the conductive coating 830 is inhibited.

The relative affinity or lack thereof of a material and/or a property thereof to having a conductive coating 830 deposited thereon may be referred to as being "nucleation-promoting" or "nucleation-inhibiting" respectively.

In the present disclosure, "nucleation-inhibiting" refers to a coating, material and/or a layer thereof that has a surface that exhibits a relatively low affinity for (deposition of) a conductive coating 830 thereon, such that the deposition of the conductive coating 830 on such surface is inhibited.

In the present disclosure, "nucleation-promoting" refers to a coating, material and/or a layer thereof that has a surface that exhibits a relatively high affinity for (deposition of) a conductive coating 830 thereon, such that the deposition of the conductive coating 830 on such surface is facilitated.

The term "nucleation" in these terms references the nucleation stage of a thin film formation process, in which monomers in a vapor phase condense onto the surface to form nuclei.

Without wishing to be bound by a particular theory, it is postulated that the shapes and sizes of such nuclei and the subsequent growth of such nuclei into islands and thereafter into a thin film may depend upon a number of factors, including without limitation, interfacial tensions between the vapor, the surface and/or the condensed film nuclei.

In the present disclosure, such affinity may be measured in several fashions.

One measure of a nucleation-inhibiting and/or nucleation-promoting property of a surface is the initial sticking probability $S_0$ of the surface for a given electrically conductive material, including without limitation, Mg. In the present disclosure, the terms "sticking probability" and "sticking coefficient" may be used interchangeably.

In some non-limiting examples, the sticking probability S may be given by:

$$S = \frac{N_{ads}}{N_{total}}$$

where $N_{ads}$ is a number of adsorbed monomers ("adatoms") that remain on an exposed layer surface 111 (that is, are incorporated into a film) and $N_{total}$ is a total number of impinging monomers on the surface. A sticking probability S equal to 1 indicates that all monomers that impinge on the surface are adsorbed and subsequently incorporated into a growing film. A sticking probability S equal to 0 indicates that all monomers that impinge on the surface are desorbed and subsequently no film is formed on the surface. A sticking probability S of metals on various surface can be evaluated using various techniques of measuring the sticking probability S, including without limitation, a dual quartz crystal microbalance (QCM) technique as described by Walker et al., *J. Phys. Chem. C* 2007, 111, 765 (2006).

As the density of islands increases (e.g., increasing average film thickness), a sticking probability S may change. By way of non-limiting example, a low initial sticking probability $S_0$ may increase with increasing average film thickness. This can be understood based on a difference in sticking probability S between an area of a surface with no islands, by way of non-limiting example, a bare substrate 110, and an area with a high density of islands. By way of non-limiting example, a monomer that impinges on a surface of an island may have a sticking probability S that approaches 1.

An initial sticking probability $S_0$ may therefore be specified as a sticking probability S of a surface prior to the formation of any significant number of critical nuclei. One measure of an initial sticking probability $S_0$ can involve a sticking probability S of a surface for a material during an initial stage of deposition of the material, where an average thickness of the deposited material across the surface is at or below a threshold value. In the description of some non-limiting examples a threshold value for an initial sticking probability $S_0$ can be specified as, by way of non-limiting example, 1 nm. An average sticking probability S may then be given by:

$$\overline{S} = S_0(1 - A_{nuc}) + S_{nuc}(A_{nuc})$$

where $S_{nuc}$ is a sticking probability S of an area covered by islands, and $A_{nuc}$ is a percentage of an area of a substrate surface covered by islands.

Figure 3:
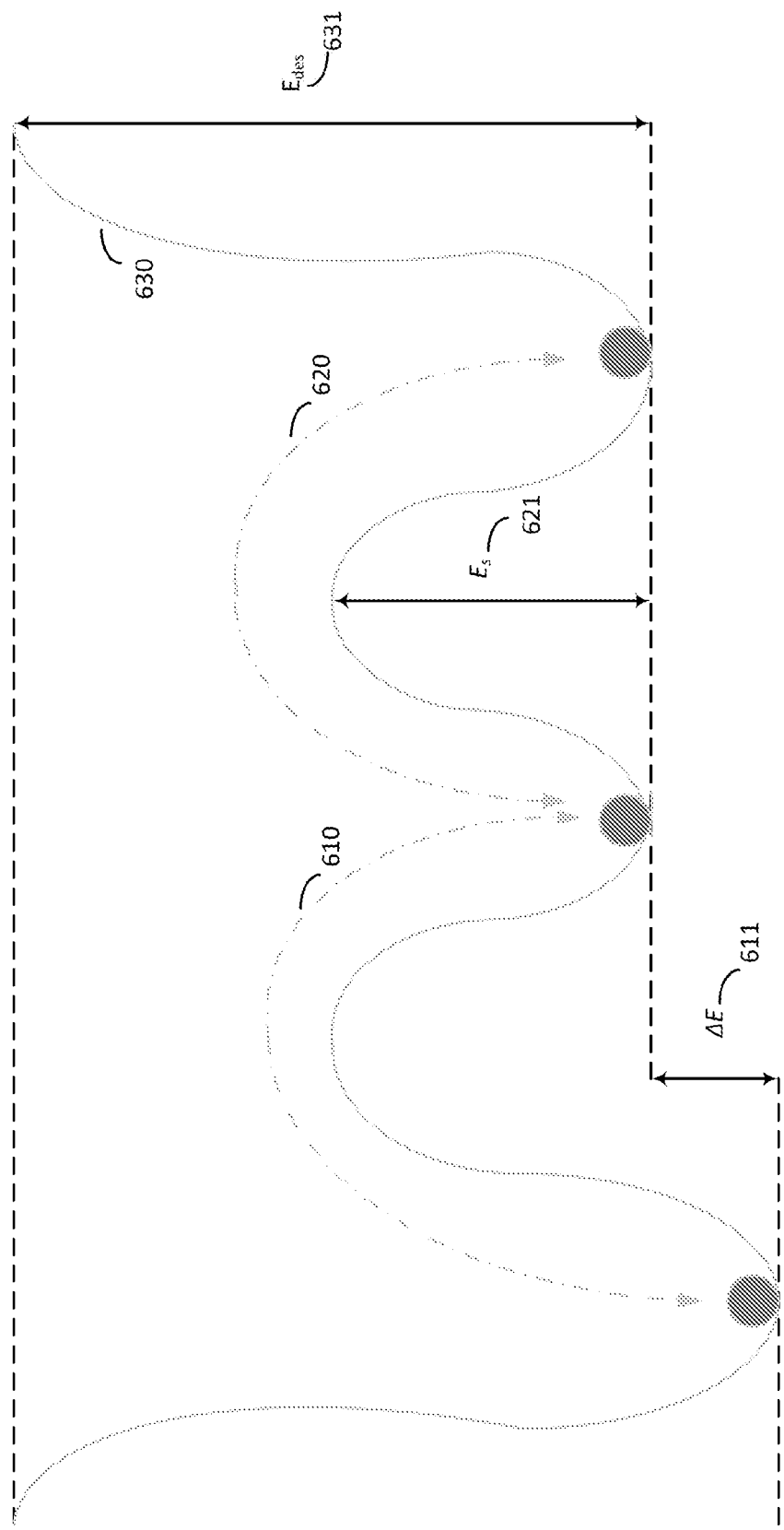
FIG. 3 is an example energy profile illustrating relative energy states of an adatom absorbed onto a surface according to an example in the present disclosure.

An example of an energy profile of an adatom adsorbed onto an exposed layer surface 111 of an underlying material (in the figure, the substrate 110) is illustrated in FIG. 3. Specifically, FIG. 3 illustrates example qualitative energy profiles corresponding to: an adatom escaping from a local low energy site (610); diffusion of the adatom on the exposed layer surface 111 (620); and desorption of the adatom (630).

In 610, the local low energy site may be any site on the exposed layer surface 111 of an underlying material, onto which an adatom will be at a lower energy. Typically, the nucleation site may comprise a defect and/or an anomaly on the exposed layer surface 111, including without limitation, a step edge, a chemical impurity, a bonding site and/or a kink. Once the adatom is trapped at the local low energy site, there may in some non-limiting examples, typically be an energy barrier before surface diffusion takes place. Such energy barrier is represented as ΔE 611 in FIG. 3. In some non-limiting examples, if the energy barrier ΔE 611 to escape the local low energy site is sufficiently large the site may act as a nucleation site.

In 620, the adatom may diffuse on the exposed layer surface 111. By way of non-limiting example, in the case of localized absorbates, adatoms tend to oscillate near a minimum of the surface potential and migrate to various neighboring sites until the adatom is either desorbed, and/or is incorporated into a growing film and/or growing islands formed by a cluster of adatoms. In FIG. 3, the activation energy associated with surface diffusion of adatoms is represented as $E_s$ 621.

In 630, the activation energy associated with desorption of the adatom from the surface is represented as $E_{des}$ 631. Those having ordinary skill in the relevant art will appreciate that any adatoms that are not desorbed may remain on the exposed layer surface 111. By way of non-limiting example, such adatoms may diffuse on the exposed layer surface 111, be incorporated as part of a growing film and/or coating, and/or become part of a cluster of adatoms that form islands on the exposed layer surface 111.

Based on the energy profiles 610, 620, 630 shown in FIG. 3, it may be postulated that NIC 810 materials exhibiting relatively low activation energy for desorption ($E_{des}$ 631) and/or relatively high activation energy for surface diffusion ($E_s$ 631) may be particularly advantageous for use in various applications.

One measure of a nucleation-inhibiting and/or nucleation-promoting property of a surface is an initial deposition rate of a given electrically conductive material, on the surface, relative to an initial deposition rate of the same conductive material on a reference surface, where both surfaces are subjected to and/or exposed to an evaporation flux of the conductive material.

In some non-limiting examples, suitable materials for use to form an NIC 810, may include those exhibiting and/or characterized as having an initial sticking probability $S_0$ for a material of a conductive coating 830 of no greater than and/or less than about 0.3 (or 30%), no greater than and/or less than about 0.2, no greater than and/or less than about 0.15, no greater than and/or less than about 0.1, no greater than and/or less than about 0.08, no greater than and/or less than about 0.05, no greater than and/or less than 0.03, no greater than and/or less than 0.02, no greater than and/or less than 0.01, no greater than and/or less than about 0.008, no greater than and/or less than about 0.005, no greater than and/or less than about 0.003, no greater than and/or less than about 0.001, no greater than and/or less than about 0.0008, no greater than and/or less than about 0.0005, and/or no greater than and/or less than about 0.0001.

In some non-limiting examples, suitable materials for use to form an NIC 810 include those exhibiting and/or characterized has having initial sticking probability $S_0$ for a material of a conductive coating 830 of between about 0.15 and about 0.0001, between about 0.1 and about 0.0003, between about 0.08 and about 0.0005, between about 0.08 and about 0.0008, between about 0.05 and about 0.001, between about 0.03 and about 0.005, between about 0.03 and about 0.008, between about 0.03 and about 0.01, between about 0.02 and about 0.0001, between about 0.02 and about 0.0003, between about 0.02 and about 0.0005, between about 0.02 and about 0.0008, between about 0.02 and about 0.0005, between about 0.02 and about 0.0008, between about 0.02 and about 0.001, between about 0.02 and about 0.005, between about 0.02 and about 0.008, between about 0.02 and about 0.01, between about 0.01 and about 0.0001, between about 0.01 and about 0.0003, between about 0.01 and about 0.0005, between about 0.01 and about 0.0008, between about 0.01 and about 0.001, between about 0.01 and about 0.005, between about 0.01 and about 0.008, between about 0.008 and about 0.0001, between about 0.008 and about 0.0003, between about 0.008 and about 0.0005, between about 0.008 and about 0.0008, between about 0.008 and about 0.001, between about 0.008 and about 0.005, between about 0.005 and about 0.0001, between about 0.005 and about 0.0003, between about 0.005 and about 0.0005, between about 0.005 and about 0.0008, and/or between about 0.005 and about 0.001.

In some non-limiting examples, suitable materials for use to form an NIC 810 include those exhibiting and/or characterized has having initial sticking probability $S_0$ of or below a threshold value for two or more different elements. In some non-limiting examples, the NIC 810 exhibits $S_0$ of or below a threshold value for two or more elements selected from: Ag, Mg, Yb, Cd, and Zn. In some further non-limiting examples, the NIC 810 exhibits $S_0$ of or below a threshold value for two or more elements selected from: Ag, Mg, and Yb. In some non-limiting examples, the threshold value may be about 0.3, about 0.2, about 0.18, about 0.15, about 0.13, about 0.1, about 0.08, about 0.05, about 0.03, about 0.02, about 0.01, about 0.08, about 0.005, about 0.003, or about 0.001.

Selective Coatings for Impacting Nucleation-Inhibiting and/or Promoting Material Properties In some non-limiting examples, one or more selective coatings may be selectively deposited on at least a first portion 1001 (FIG. 4) of an exposed layer surface 111 of an underlying material to be presented for deposition of a thin film conductive coating 830 thereon. Such selective coating(s) have a nucleation-inhibiting property (and/or conversely a nucleation-promoting property) with respect to the conductive coating 830 that differs from that of the exposed layer surface 111 of the underlying material. In some non-limiting examples, there may be a second portion 1002 (FIG. 4) of the exposed layer surface 111 of an underlying material to which no such selective coating(s), has been deposited.

Such a selective coating may be an NIC 810 and/or a nucleation-promoting coating (NPC).

In the present disclosure, the terms "NIC" and "patterning coating" may be used interchangeably to refer to similar concepts, and references to an NIC 810 herein, in the context of being selectively deposited to pattern a conductive coating 830 may, in some non-limiting examples, be applicable to a patterning coating in the context of selective deposition thereof to pattern an electrode coating. In some non-limiting examples, reference to a patterning coating may signify a coating having a specific composition as described herein.

It will be appreciated by those having ordinary skill in the relevant art that the use of such a selective coating may, in some non-limiting examples, facilitate and/or permit the selective deposition of the conductive coating 830 without employing an FMM during the stage of depositing the conductive coating 830.

In some non-limiting examples, such selective deposition of the conductive coating 830 may be in a pattern. In some non-limiting examples, such pattern may facilitate providing and/or increasing transmissivity of at least one of the top and/or bottom of the device 100, within the lateral aspect 410 of one or more emissive region(s) 1910 of a (sub-) pixel and/or within the lateral aspect 420 of one or more non-emissive region(s) 1920 that may, in some non-limiting examples, surround such emissive region(s) 1910.

In some non-limiting examples, the conductive coating 830 may be deposited on a conductive structure and/or in some non-limiting examples, form a layer thereof, for the device 100, which in some non-limiting examples may be the first electrode 120 and/or the second electrode 140 to act as one of an anode and/or a cathode, and/or an auxiliary electrode 1750 and/or busbar 4150 to support conductivity thereof and/or in some non-limiting examples, be electrically coupled thereto.

In some non-limiting examples, an NIC 810 for a given conductive coating 830, may refer to a coating having a surface that exhibits a relatively low initial sticking probability $S_0$ for the conductive coating 830 in vapor form, such that deposition of the conductive coating 830 onto the exposed layer surface 111 is inhibited. Thus, in some non-limiting examples, selective deposition of an NIC 810 may reduce an initial sticking probability $S_0$ of an exposed layer surface 111 (of the NIC 810) presented for deposition of the conductive coating 830 thereon.

In some non-limiting examples, an NPC, for a given conductive coating 830, may refer to a coating having an exposed layer surface 111 that exhibits a relatively high initial sticking probability $S_0$ for the conductive coating 830 in vapor form, such that deposition of the conductive coating 830 onto the exposed layer surface 111 is facilitated. Thus, in some non-limiting examples, selective deposition of an NPC may increase an initial sticking probability $S_0$ of an exposed layer surface 111 (of the NPC) presented for deposition of the conductive coating 830 thereon.

When the selective coating is an NIC 810, the first portion 1001 of the exposed layer surface 111 of the underlying material, upon which the NIC 810 is deposited, will thereafter present a treated surface (of the NIC 810) whose nucleation-inhibiting property has been increased or alternatively, whose nucleation-promoting property has been reduced (in either case, the surface of the NIC 810 deposited on the first portion 1001), such that it has a reduced affinity for deposition of the conductive coating 830 thereon relative to that of the exposed layer surface 111 of the underlying material upon which the NIC 810 has been deposited. By contrast the second portion 1002, upon which no such NIC 810 has been deposited, will continue to present an exposed layer surface 111 (of the underlying substrate 110) whose nucleation-inhibiting property or alternatively, whose nucleation-promoting property (in either case, the exposed layer surface 111 of the underlying substrate 110 that is substantially devoid of the selective coating), has an affinity for deposition of the conductive coating 830 thereon that has not been substantially altered.

When the selective coating is an NPC, the first portion 1001 of the exposed layer surface 111 of the underlying material, upon which the NPC is deposited, will thereafter present a treated surface (of the NPC) whose nucleation-inhibiting property has been reduced or alternatively, whose nucleation-promoting property has been increased (in either case, the surface of the NPC deposited on the first portion 1001), such that it has an increased affinity for deposition of the conductive coating 830 thereon relative to that of the exposed layer surface 111 of the underlying material upon which the NPC has been deposited. By contrast, the second portion 1002, upon which no such NPC has been deposited, will continue to present an exposed layer surface 111 (of the underlying substrate 110) whose nucleation-inhibiting property or alternatively, whose nucleation-promoting property (in either case, the exposed layer surface 111 of the underlying substrate 110 that is substantially devoid of the NPC), has an affinity for deposition of the conductive coating 830 thereon that has not been substantially altered.

In some non-limiting examples, both an NIC 810 and an NPC may be selectively deposited on respective first portions 1001 and NPC portions of an exposed layer surface 111 of an underlying material to respectively alter a nucleation-inhibiting property (and/or conversely a nucleation-promoting property) of the exposed layer surface 111 to be presented for deposition of a conductive coating 830 thereon. In some non-limiting examples, there may be a second portion 1002 of the exposed layer surface 111 of an underlying material to which no selective coating has been deposited, such that the nucleation-inhibiting property (and/or conversely its nucleation-promoting property) to be presented for deposition of the conductive coating 830 thereon is not substantially altered.

In some non-limiting examples, the first portion 1001 and NPC portion may overlap, such that a first coating of an NIC 810 and/or an NPC may be selectively deposited on the exposed layer surface 111 of the underlying material in such overlapping region and the second one of the NIC 810 and/or the NPC may be selectively deposited on the treated exposed layer surface 111 of the first coating. In some non-limiting examples, the first coating is an NIC 810. In some non-limiting examples, the first coating is an NPC.

In some non-limiting examples, the first portion 1001 (and/or NPC portion) to which the selective coating has been, may comprise a removal region, in which the deposited selective coating 710 has been removed, to present the uncovered surface of the underlying material for deposition of the conductive coating 830 thereon, such that the nucleation-inhibiting property (and/or conversely its nucleation-promoting property) to be presented for deposition of the conductive coating 830 thereon is not substantially altered.

In some non-limiting examples, the underlying material may be at least one layer selected from the substrate 110 and/or at least one of the frontplane 10 layers, including without limitation, the first electrode 120, the second electrode 140, the at least one semiconducting layer 130 (and/or at least one of the layers thereof) and/or any combination of any of these.

In some non-limiting examples, the conductive coating 830 may have specific material properties. In some non-limiting examples, the conductive coating 830 may comprise Mg, whether alone or in a compound and/or alloy.

By way of non-limiting example, pure and/or substantially pure Mg may not be readily deposited onto some organic surfaces due to a low sticking probability S of Mg on some organic surfaces.

Deposition of Selective Coatings

In some non-limiting examples, a thin film comprising the selective coating, may be selectively deposited and/or processed using a variety of techniques, including without limitation, evaporation (including without limitation), thermal evaporation and/or electron beam evaporation), photolithography, printing (including without limitation, ink jet and/or vapor jet printing, reel-to-reel printing and/or microcontact transfer printing), PVD (including without limitation, sputtering), CVD (including without limitation, PECVD and/or OVPD), laser annealing, LITI patterning, ALD, coating (including without limitation, spin coating, dip coating, line coating and/or spray coating) and/or combinations thereof.

It will be appreciated by those having ordinary skill in the relevant art that, contrary to that of an FMM, the feature size of an open mask is generally comparable to the size of a device 100 being manufactured. In some non-limiting examples, such an open mask may have an aperture that may generally correspond to a size of the device 100, which in some non-limiting examples, may correspond, without limitation, to about 1 inch for micro-displays, about 4-6 inches for mobile displays, and/or about 8-17 inches for laptop and/or tablet displays, so as to mask edges of such device 100 during manufacturing. In some non-limiting examples, the feature size of an open mask may be on the order of about 1 cm and/or greater. In some non-limiting examples, an aperture formed in an open mask may in some non-limiting examples be sized to encompass the lateral aspect(s) 410 of a plurality of emissive regions 1910 each corresponding to a (sub-) pixel and/or surrounding and/or the lateral aspect(s) 420 of surrounding and/or intervening non-emissive region(s) 1920.

It will be appreciated by those having ordinary skill in the relevant art that, in some non-limiting examples, the use of an open mask may be omitted, if desired. In some non-limiting examples, an open mask deposition process described herein may alternatively be conducted without the use of an open mask, such that an entire target exposed layer surface 111 may be exposed.

Selective deposition of at least one conductive coating 830 may be employed in various combinations to form a device feature, including without limitation, a patterned electrode 120, 140, 1750, 4150 and/or a conductive element electrically coupled thereto, without employing an FMM within the conductive coating 830 deposition process. In some non-limiting examples, such patterning may permit and/or enhance the transmissivity of the device 100.

In some non-limiting examples, the selective coating, which may be an NIC 810 and/or an NPC may be applied a plurality of times during the manufacturing process of the device 100, in order to pattern a device feature comprising a plurality of electrodes 120, 140, 1750, 4150 and/or various layers thereof and/or a conductive coating 830 electrically coupled thereto.

In some non-limiting examples, a thickness of the selective coating, such as an NIC 810, and of the conductive coating 830 deposited thereafter may be varied according to a variety of parameters, including without limitation, a desired application and desired performance characteristics. In some non-limiting examples, the thickness of the NIC 810 may be comparable to and/or substantially less than a thickness of conductive coating 830 deposited thereafter. Use of a relatively thin NIC 810 to achieve selective patterning of a conductive coating deposited thereafter may be suitable to provide flexible devices 100, including without limitation, PMOLED devices. In some non-limiting examples, a relatively thin NIC 810 may provide a relatively planar surface on which a barrier coating or other thin film encapsulation (TFE) layer, may be deposited. In some non-limiting examples, providing such a relatively planar surface for application of the barrier coating may increase adhesion of the barrier coating to such surface.

Figure 4:
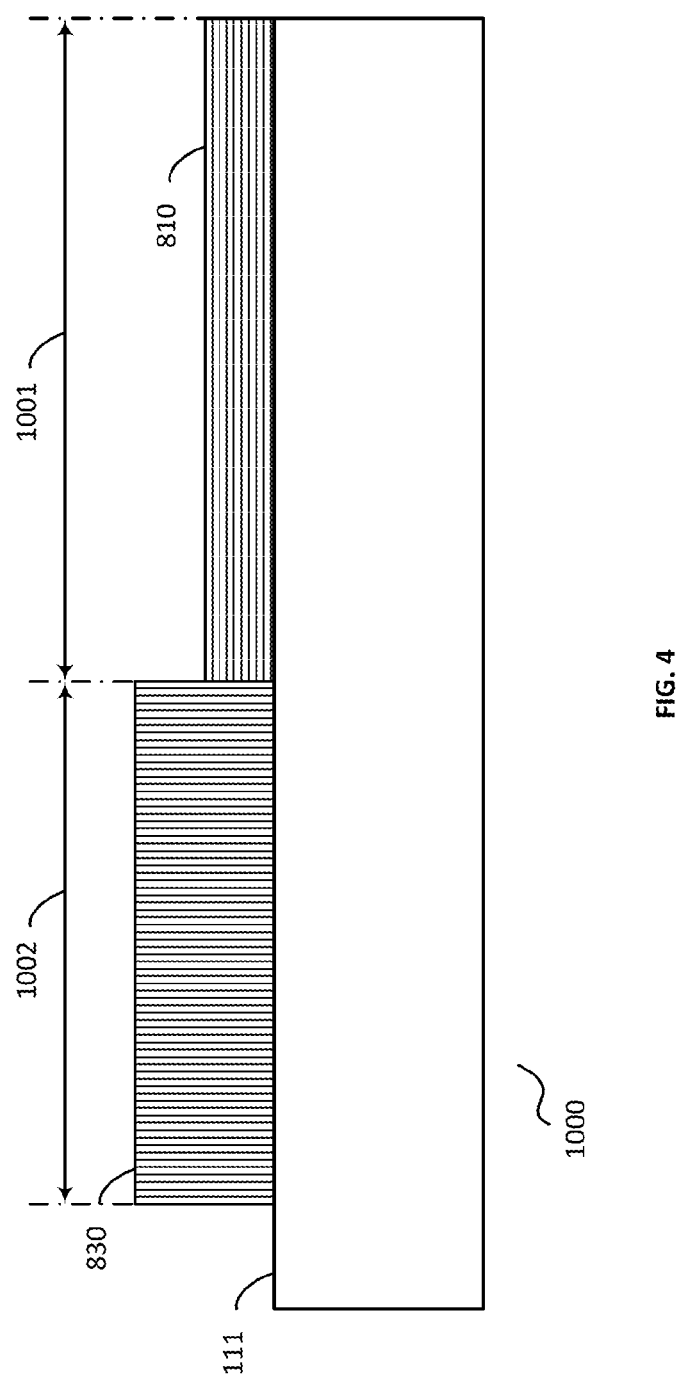
FIG. 4 is an example version of the device of FIG. 1, with additional example deposition steps according to an example in the present disclosure.

Turning now to FIG. 4, there is shown an example version 1000 of the device 100 shown in FIG. 1, but with several additional deposition steps that are described herein.

The device 1000 shows a lateral aspect of the exposed layer surface 111 of the underlying material. The lateral aspect comprises a first portion 1001 and a second portion 1002. In the first portion 1001, an NIC 810 is disposed on the exposed layer surface 111. However, in the second portion 1002, the exposed layer surface 111 is substantially devoid of the NIC 810.

After selective deposition of the NIC 810 across the first portion 1001, the conductive coating 830 is deposited over the device 1000, in some non-limiting examples, using an open mask and/or a mask-free deposition process, but remains substantially only within the second portion 1002, which is substantially devoid of NIC 810.

While the surface of the NIC 810 is described in some non-limiting examples as being substantially devoid of the material for forming the conductive coating 830, in some non-limiting examples, the surface of the NIC 810 is not substantially devoid of the material for forming the conductive coating 830, but nevertheless does not amount to a closed or coating film of the conductive coating 830.

Rather, in some non-limiting examples, some vapor monomers of the material(s) for forming the conductive coating 830 impinging on the surface of the NIC 810, may condense to form small clusters or islands thereon. However, substantial growth of such clusters or islands which, if left unimpeded, may lead to possible formation of a substantially closed coating film of the material(s) for forming the conductive coating on the surface of the NIC 810, is inhibited due to one or more properties and/or features of the NIC 810.

Thus, in some non-limiting examples, the surface of the NIC 810 may have a discontinuous coating (not shown) of the material of the conductive coating 830 deposited thereon.

In some non-limiting examples, such a discontinuous coating is a thin film coating comprising a plurality of discrete islands. In some non-limiting examples, at least some of the islands are disconnected from one another. In other words, the discontinuous coating may, in some non-limiting examples, comprise features that are physically separated from one another such that the discontinuous coating does not form a continuous layer that comprises a closed or coating film.

Accordingly, in some non-limiting examples, the surface of the NIC 810 is substantially devoid of a closed film of the conductive coating.

The NIC 810 provides, within the first portion 1001, a surface with a relatively low initial sticking probability $S_0$, for the conductive coating 830, and that is substantially less than the initial sticking probability $S_0$, for the conductive coating 830, of the exposed layer surface 111 of the underlying material of the device 1000 within the second portion 1002.

Thus, the first portion 1001 is substantially devoid of the conductive coating 830.

In this fashion, the NIC 810 may be selectively deposited, including using a shadow mask, to allow the conductive coating 830 to be deposited, including without limitation, using an open mask and/or a mask-free deposition process, so as to form a device feature, including without limitation, at least one of the first electrode 120, the second electrode 140, the auxiliary electrode 1750, a busbar 4150 and/or at least one layer thereof, and/or a conductive element electrically coupled thereto.

Auxiliary Electrode

In some non-limiting examples, the second electrode 140 may comprise a common electrode and an auxiliary electrode 1750 may be deposited in a pattern, in some non-limiting examples, above and/or in some non-limiting examples below the second electrode 140 and electrically coupled thereto. In some non-limiting examples, the pattern for such auxiliary electrode 1750 may be such that spaced-apart regions lie substantially within the lateral aspect(s) 420 of non-emissive region(s) 1920 surrounding the lateral aspect(s) 410 of emissive region(s) 1910 corresponding to (sub-) pixel(s). In some non-limiting examples, the pattern for such auxiliary electrodes 1750 may be such that the elongated spaced-apart regions thereof lie substantially within the lateral aspect(s) 410 of emissive region(s) 1910 corresponding to (sub-) pixel(s) and/or the lateral aspect(s) 420 of non-emissive region(s) 1920 surrounding them.

The auxiliary electrode 1750 is electrically conductive. In some non-limiting examples, the auxiliary electrode 1750 may be formed by at least one metal and/or metal oxide. Non-limiting examples of such metals include Cu, Al, molybdenum (Mo) and/or Ag. By way of non-limiting examples, the auxiliary electrode 1750 may comprise a multi-layer metallic structure, including without limitation, one formed by Mo/Al/Mo. Non-limiting examples of such metal oxides include ITO, ZnO, IZO and/or other oxides containing In and/or Zn. In some non-limiting examples, the auxiliary electrode 1750 may comprise a multi-layer structure formed by a combination of at least one metal and at least one metal oxide, including without limitation, Ag/ITO, Mo/ITO, ITO/Ag/ITO and/or ITO/Mo/ITO. In some non-limiting examples, the auxiliary electrode 1750 comprises a plurality of such electrically conductive materials.

Removal of Selective Coatings

In some non-limiting examples, the NIC 810 may be removed subsequent to deposition of the conductive coating 830, such that at least a part of a previously exposed layer surface 111 of an underlying material covered by the NIC 810 may become exposed once again. In some non-limiting examples, the NIC 810 may be selectively removed by etching and/or dissolving the NIC 810 and/or by employing plasma and/or solvent processing techniques that do not substantially affect or erode the conductive coating 830.

In some non-limiting examples, once an NIC 810 has been selectively deposited on a first portion of an exposed layer surface 111 of an underlying material, including without limitation, the substrate 110, a conductive coating 830 can be deposited on the exposed layer surface 111 of the underlying material, that is, on both the exposed layer surface 111 of NIC 810 where the NIC 810 has been previously deposited, as well as the exposed layer surface 111 of the substrate 110, where the NIC 810 has not been previously deposited.

Because of the nucleation-inhibiting properties of the first portion where the NIC 810 was disposed, the conductive coating 830 disposed thereon tends not to remain, resulting in a pattern of selective deposition of the conductive coating 830, that corresponds to a second portion, leaving the first portion substantially devoid of the conductive coating.

Thereafter, the NIC 810 is removed from the first portion of the exposed layer surface 111 of the substrate 110, such that the conductive coating 830 previously deposited remains on the substrate 110 and regions of the substrate 110 on which the NIC 810 had been previously deposited are now exposed or uncovered.

In some non-limiting examples, the removal of the NIC 810 may be effected by exposing the device to a solvent and/or a plasma that reacts with and/or etches away the NIC 810 without substantially impacting the conductive coating 830.

In some non-limiting examples, the TFT structure 200 and the first electrode 120 may positioned, in a cross-sectional aspect, below (sub-) pixel(s) corresponding thereto, and together with the auxiliary electrode 1750, lie beyond a transmissive region. As a result, these components do not attenuate or impede light from being transmitted through the transmissive region. In some non-limiting examples, such arrangement allows a viewer viewing the device from a typical viewing distance to see through the device, in some non-limiting examples, when all the (sub-) pixel(s) are not emitting, thus creating a transparent AMOLED device.

Those having ordinary skill in the relevant art will appreciate that in some non-limiting examples, the PDL(s) 440 may have a reduced thickness, including without limitation, by forming a well therein, which in some non-limiting examples is not dissimilar to the well defined for emissive region(s) 1910, to further facilitate light transmission through the transmissive region.

Partition and Recess

Figure 5:
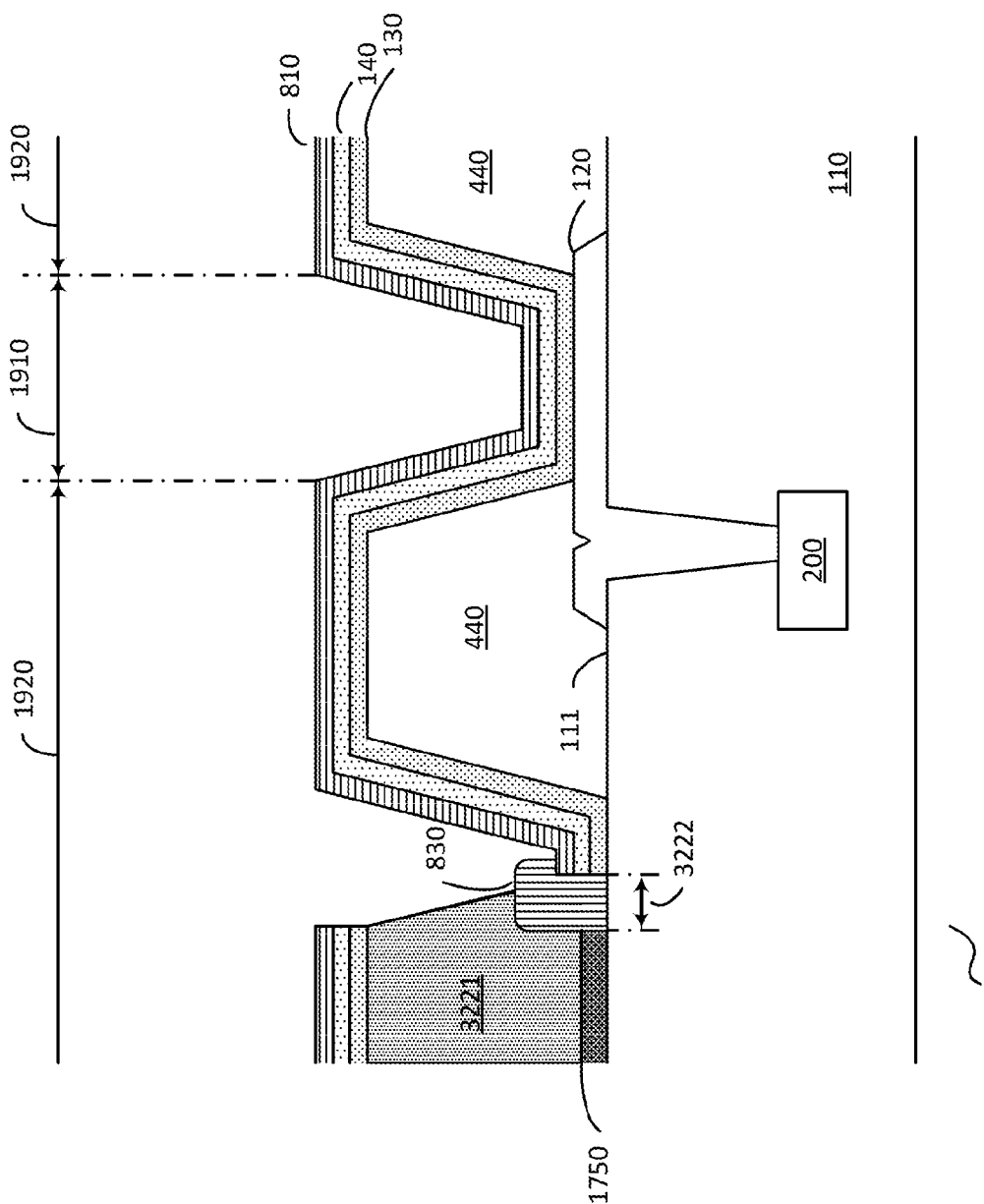
FIG. 5 is a schematic diagram illustrating an example cross-sectional view of an example version of the device of FIG. 1 having a partition and a sheltered region, such as a recess, in a non-emissive region thereof according to an example in the present disclosure.

Turning to FIG. 5, there is shown a cross-sectional view of an example version 3200 of the device 100. The device 3200 comprises a substrate 110 having a layer surface 111. The substrate 110 comprises at least one TFT structure 200. By way of non-limiting example, the at least one TFT structure 200 may be formed by depositing and patterning a series of thin films when fabricating the substrate 110, in some non-limiting examples, as described herein.

The device 3200 comprises, in a lateral aspect, an emissive region 1910 having an associated lateral aspect 410 and at least one adjacent non-emissive region 1920, each having an associated lateral aspect 420. The layer surface 111 of the substrate 110 in the emissive region 1910 is provided with a first electrode 120, that is electrically coupled to the at least one TFT structure 200. A PDL 440 is provided on the layer surface 111, such that the PDL 440 covers the layer surface 111 as well as at least one edge and/or perimeter of the first electrode 120. The PDL 440 may, in some non-limiting examples, be provided in the lateral aspect 420 of the non-emissive region 1920. The PDL 440 defines a valley-shaped configuration that provides an opening that generally corresponds to the lateral aspect 410 of the emissive region 1910 through which a layer surface of the first electrode 120 may be exposed. In some non-limiting examples, the device 3200 may comprise a plurality of such openings defined by the PDLs 400, each of which may correspond to a (sub-) pixel region of the device 3200.

As shown, in some non-limiting examples, a partition 3221 is provided on the layer surface 111 in the lateral aspect 420 of a non-emissive region 1920 and, as described herein, defines a sheltered region 3065, such as a recess 3222. In some non-limiting examples, the recess 3222 may be formed by an edge of a lower section 3323 (FIG. 6A) of the partition 3221 being recessed, staggered and/or offset with respect to an edge of an upper section 3324 (FIG. 6A) of the partition 3221 that overlaps and/or projects beyond the recess 3222.

In some non-limiting examples, the lateral aspect 410 of the emissive region 1910 comprises at least one semiconducting layer 130 disposed over the first electrode 120, a second electrode 140, disposed over the at least one semiconducting layer 130, and an NIC 810 disposed over the second electrode 140. In some non-limiting examples, the at least one semiconducting layer 130, the second electrode 140 and the NIC 810 may extend laterally to cover at least the lateral aspect 420 of a part of at least one adjacent non-emissive region 1920. In some non-limiting examples, as shown, the at least one semiconducting layer 130, the second electrode 140 and the NIC 810 may be disposed on at least a part of at least one PDL 440 and at least a part of the partition 3221. Thus, as shown, the lateral aspect 410 of the emissive region 1910, the lateral aspect 420 of a part of at least one adjacent non-emissive region 1920 and a part of at least one PDL 440 and at least a part of the partition 3221, together can make up a first portion, in which the second electrode 140 lies between the NIC 810 and the at least one semiconducting layer 130.

An auxiliary electrode 1750 is disposed proximate to and/or within the recess 3221 and a conductive coating 830 is arranged to electrically couple the auxiliary electrode 1650 to the second electrode 140. Thus, as shown, the recess 3221 may comprise a second portion, in which the conductive coating 830 is disposed on the layer surface 111.

A non-limiting example of a method for fabricating the device 3200 is now described.

In a stage, the method provides the substrate 110 and at least one TFT structure 200. In some non-limiting examples, at least some of the materials for forming the at least one semiconducting layer 130 may be deposited using an open-mask and/or mask-free deposition process, such that the materials are deposited in and/or across both the lateral aspect 410 of both the emissive region 1910 and/or the lateral aspect 420 of at least a part of at least one non-emissive region 1920. Those having ordinary skill in the relevant art will appreciate that in some non-limiting examples, it may be appropriate to deposit the at least one semiconducting layer 130 in such manner so as to reduce any reliance on patterned deposition, which in some non-limiting examples, is performed using an FMM In a stage, the method deposits the second electrode 140 over the at least one semiconducting layer 130. In some non-limiting examples, the second electrode 140 may be deposited using an open-mask and/or mask-free deposition process. In some non-limiting examples, the second electrode 140 may be deposited by subjecting an exposed layer surface 111 of the at least one semiconducting layer 130 disposed in the lateral aspect 410 of the emissive region 1910 and/or the lateral aspect 420 of at least a part of at least one of the non-emissive region 1920 to an evaporated flux of a material for forming the second electrode 140.

In a stage, the method deposits the NIC 810 over the second electrode 140. In some non-limiting examples, the NIC 810 may be deposited using an open-mask and/or mask-free deposition process. In some non-limiting examples, the NIC 810 may be deposited by subjecting an exposed layer surface 111 of the second electrode 140 disposed in the lateral aspect 410 of the emissive region 1910 and/or the lateral aspect 420 of at least a part of at least one of the non-emissive region 1920 to an evaporated flux of a material for forming the NIC 810.

As shown, the recess 3222 is substantially free of, or is uncovered by the NIC 810. In some non-limiting examples, this may be achieved by masking, by the partition 3221, a recess 3222, in a lateral aspect thereof, such that the evaporated flux of a material for forming the NIC 810 is substantially precluded from being incident onto such recess portion of the layer surface 111. Accordingly, in such example, the recess 3222 of the layer surface 111 is substantially devoid of the NIC 810. By way of non-limiting example, a laterally projecting part of the partition 3221 may define the recess 3222 at a base of the partition 3221. In such example, at least one surface of the partition 3221 that defines the recess 3222 may also be substantially devoid of the NIC 810.

In a stage, the method deposits the conductive coating 830, in some non-limiting examples, after providing the NIC 810, on the device 3200. In some non-limiting examples, the conductive coating 830 may be deposited using an open-mask and/or mask-free deposition process. In some non-limiting examples, the conductive coating 830 may be deposited by subjecting the device 3200 to an evaporated flux of a material for forming the conductive coating 830. By way of non-limiting example, a source (not shown) of conductive coating 830 material may be used to direct an evaporated flux of material for forming the conductive coating 830 towards the device 3200, such that the evaporated flux is incident on such surface. However, in some non-limiting examples, the surface of the NIC 810 disposed in the lateral aspect 410 of the emissive region 1910 and/or the lateral aspect 420 of at least a part of at least one of the non-emissive region 1920 exhibits a relatively low initial sticking coefficient $S_0$, for the conductive coating 830, the conductive coating 830 may selectively deposit onto a second portion, including without limitation, the recessed portion of the device 3200, where the MC 810 is not present.

In some non-limiting examples, at least a part of the evaporated flux of the material for forming the conductive coating 830 may be directed at a non-normal angle relative to a lateral plane of the layer surface 111. By way of non-limiting example, at least a part of the evaporated flux may be incident on the device 3200 at an angle of incidence that is, relative to such lateral plane of the layer surface 111, less than 90°, less than about 85°, less than about 80°, less than about 75°, less than about 70°, less than about 60°, and/or less than about 50°. By directing an evaporated flux of a material for forming the conductive coating 830, including at least a part thereof incident at a non-normal angle, at least one surface of and/or in the recess 3222 may be exposed to such evaporated flux.

In some non-limiting examples, a likelihood of such evaporated flux being precluded from being incident onto at least one surface of and/or in the recess 3222 due to the presence of the partition 3221, may be reduced since at least a part of such evaporated flux may be flowed at a non-normal angle of incidence.

In some non-limiting examples, at least a part of such evaporated flux may be non-collimated. In some non-limiting examples, at least a part of such evaporated flux may be generated by an evaporation source that is a point source, a linear source and/or a surface source.

In some non-limiting examples, the device 3200 may be displaced during deposition of the conductive coating 830. By way of non-limiting example, the device 3200 and/or the substrate 110 thereof and/or any layer(s) deposited thereon, may be subjected to a displacement that is angular, in a lateral aspect and/or in an aspect substantially parallel to the cross-sectional aspect.

In some non-limiting examples, the device 3200 may be rotated about an axis that substantially normal to the lateral plane of the layer surface 111 while being subjected to the evaporated flux.

In some non-limiting examples, at least a part of such evaporated flux may be directed toward the layer surface 111 of the device 3200 in a direction that is substantially normal to the lateral plane of the surface.

Without wishing to be bound by a particular theory, it is postulated that the material for forming the conductive coating 830 may nevertheless be deposited within the recess 3222 due to lateral migration and/or desorption of adatoms adsorbed onto the surface of the NIC 810. In some non-limiting examples, it is postulated that any adatoms adsorbed onto the surface of the NIC 810 may tend to migrate and/or desorb from such surface due to unfavorable thermodynamic properties of the surface for forming a stable nucleus. In some non-limiting examples, it is postulated that at least some of the adatoms migrating and/or desorbing off such surface may be re-deposited onto the surfaces in the recess 3222 to form the conductive coating 830.

In some non-limiting examples, the conductive coating 830 may be formed such that the conductive coating 830 is electrically coupled to both the auxiliary electrode 1750 and the second electrode 140. In some non-limiting examples, the conductive coating 830 is in physical contact with at least one of the auxiliary electrode 1750 and/or the second electrode 140. In some non-limiting examples, an intermediate layer may be present between the conductive coating 830 and at least one of the auxiliary electrode 1750 and/or the second electrode 140. However, in such example, such intermediate layer may not substantially preclude the conductive coating 830 from being electrically coupled to the at least one of the auxiliary electrode 1750 and/or the second electrode 140. In some non-limiting examples, such intermediate layer may be relatively thin and be such as to permit electrical coupling therethrough. In some non-limiting examples, a sheet resistance of the conductive coating 830 may be equal to and/or less than a sheet resistance of the second electrode 140.

As shown in FIG. 5, the recess 3222 is substantially devoid of the second electrode 140. In some non-limiting examples, during the deposition of the second electrode 140, the recess 3222 is masked, by the partition 3221, such that the evaporated flux of the material for forming the second electrode 140 is substantially precluded form being incident on at least one surface of and/or in the recess 3222. In some non-limiting examples, at least a part of the evaporated flux of the material for forming the second electrode 140 is incident on at least one surface of and/or in the recess 3222, such that the second electrode 140 extends to cover at least a part of the recess 3222.

In some non-limiting examples, the auxiliary electrode 1750, the conductive coating 830 and/or the partition 3221 may be selectively provided in certain region(s) of a display panel. In some non-limiting examples, any of these features may be provided at and/or proximate to one or more edges of such display panel for electrically coupling at least one element of the frontplane 10, including without limitation, the second electrode 140, to at least one element of the backplane 20. In some non-limiting example, providing such features at and/or proximate to such edges may facilitate supplying and distributing electrical current to the second electrode 140 from an auxiliary electrode 1750 located at and/or proximate to such edges. In some non-limiting examples, such configuration may facilitate reducing a bezel size of the display panel.

In some non-limiting examples, the auxiliary electrode 1750, the conductive coating 830 and/or the partition 3221 may be omitted from certain regions(s) of such display panel. In some non-limiting examples, such features may be omitted from parts of the display panel, including without limitation, where a relatively high pixel density is to be provided, other than at and/or proximate to at least one edge thereof.

Figure 6A:
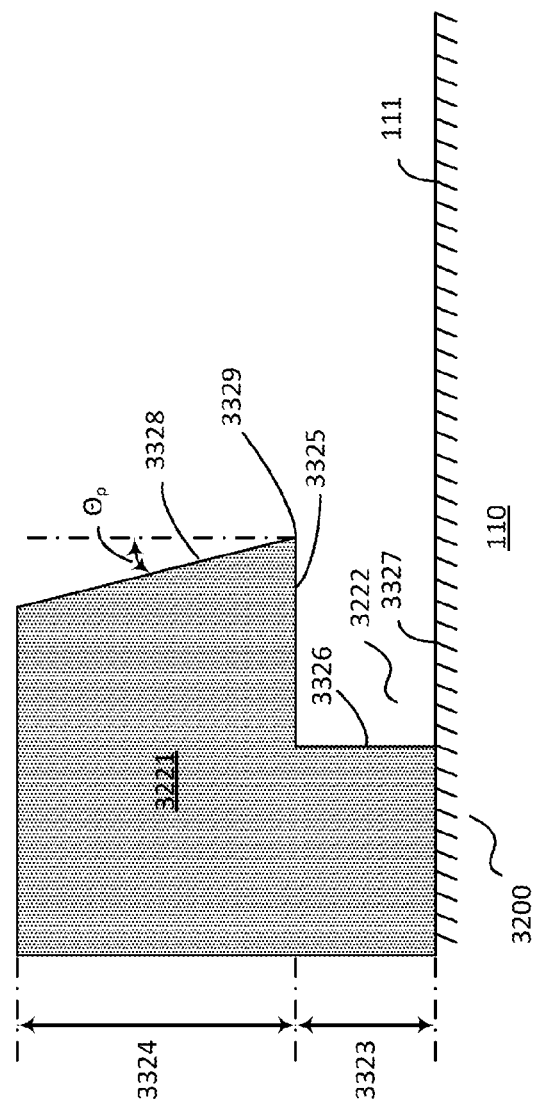
FIG. 6A is a schematic diagram that shows an example cross-sectional view of an example version of the device of FIG. 1 having a partition and a sheltered region, such as a recess, in a non-emissive region prior to deposition of a semiconducting layer thereon, according to an example in the present disclosure.

FIG. 6A shows a fragment of the device 3200 in a region proximal to the partition 3221 and at a stage prior to deposition of the at least one semiconducting layer 130. In some non-limiting examples, the partition 3221 comprises a lower section 3323 and an upper section 3324, with the upper section 3324 projecting over the lower section 3323, to form the recess 3222 where the lower section 3323 is laterally recessed relative to the upper section 3324. By way of non-limiting example, the recess 3222 may be formed such that it extends substantially laterally into the partition 3221. In some non-limiting examples, the recess 3221 may correspond to a space defined between a ceiling 3325 defined by the upper section 3324, a side 3326 of the lower section 3323 and a floor 3327 corresponding to the layer surface 111 of the substrate 110. In some non-limiting examples, the upper section 3324 comprises an angled section 3328. By way of non-limiting example, the angled section 3328 may be provided by a surface that is not substantially parallel to a lateral plane of the layer surface 111. By way of non-limiting example, the angled section may be tilted and/or offset from an axis that is substantially normal to the layer surface 111 by an angle $\theta_p$. A lip 3329 is also provided by the upper section 3324. In some non-limiting examples, the lip 3329 may be provided at or near an opening of the recess 3222. By way of non-limiting example, the lip 3329 may be provided at a junction of the angled section 3328 and the ceiling 3325. In some non-limiting examples, at least one of the upper section 3324, the side 3326 and the floor 3327 may be electrically conductive to form at least a part of the auxiliary electrode 1750.

In some non-limiting examples, the angle $\theta_p$, which represents the angle by which the angled section 3328 of the upper section 3324 is tilted and/or offset from the axis, may be less than or equal to about 60°. By way of non-limiting example, the angle may be less than or equal to about 50°, less than or equal to about 45°, less than or equal to about 40°, less than or equal to about 30°, less than or equal to about 25°, less than or equal to about 20°, less than or equal to about 15°, and/or less than or equal to about 10°. In some non-limiting examples, the angle may be between about 60° and about 25°, between about 60° and about 30° and/or between about 50° and about 30°. Without wishing to be bound by any particular theory, it may be postulated that providing an angled section 3328 may inhibit deposition of the material for forming the NIC 810 at or near the lip 3329, so as to facilitate the deposition of the material for forming the conductive coating 830 at or near the lip 3229.

Figure 6B:
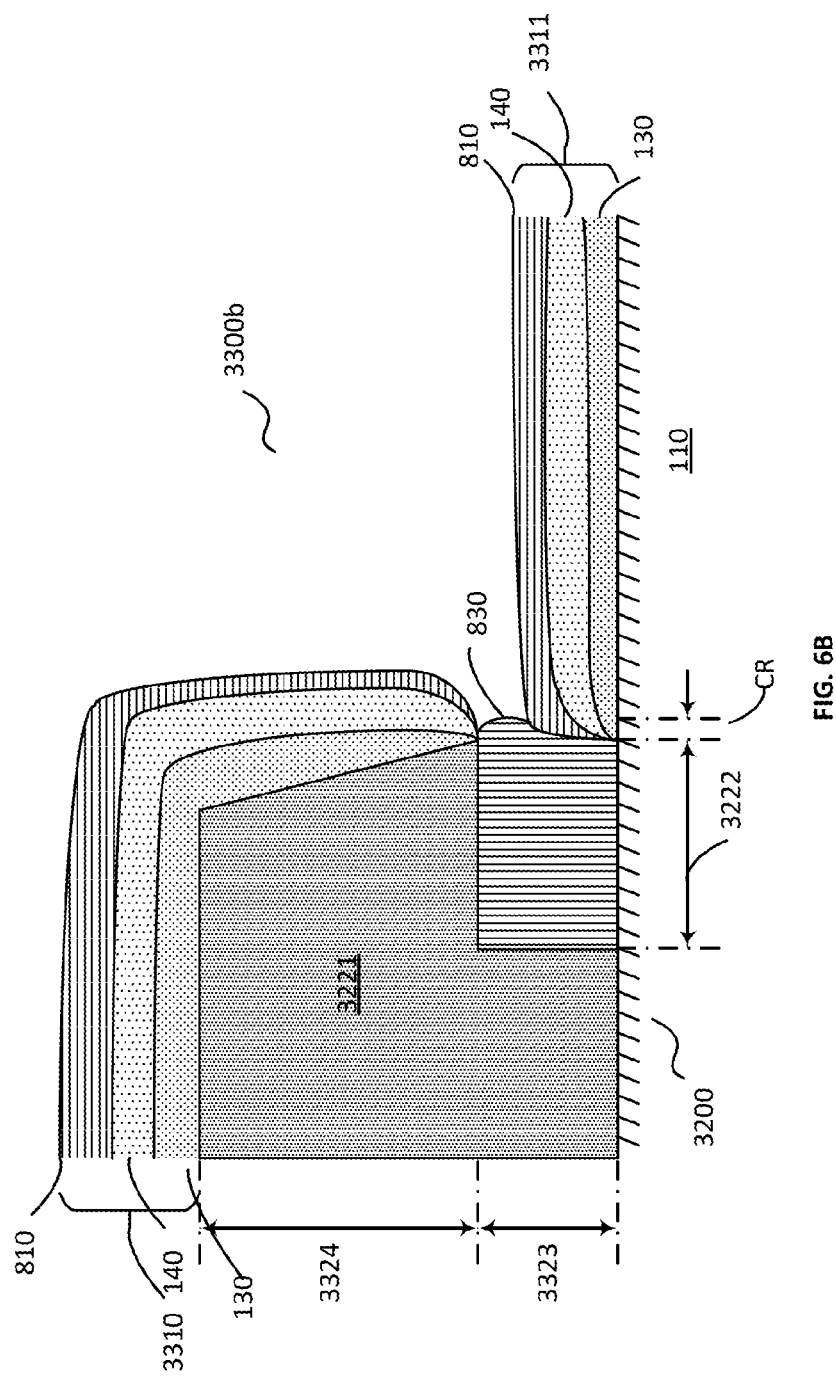
FIGS. 6B-6P are schematic diagrams that show various examples of interactions between the partition of FIG. 6A after deposition of a semiconducting layer, a second electrode and an NIC with a conductive coating deposited thereon, according to various examples in the present disclosure.
Figure 6C:
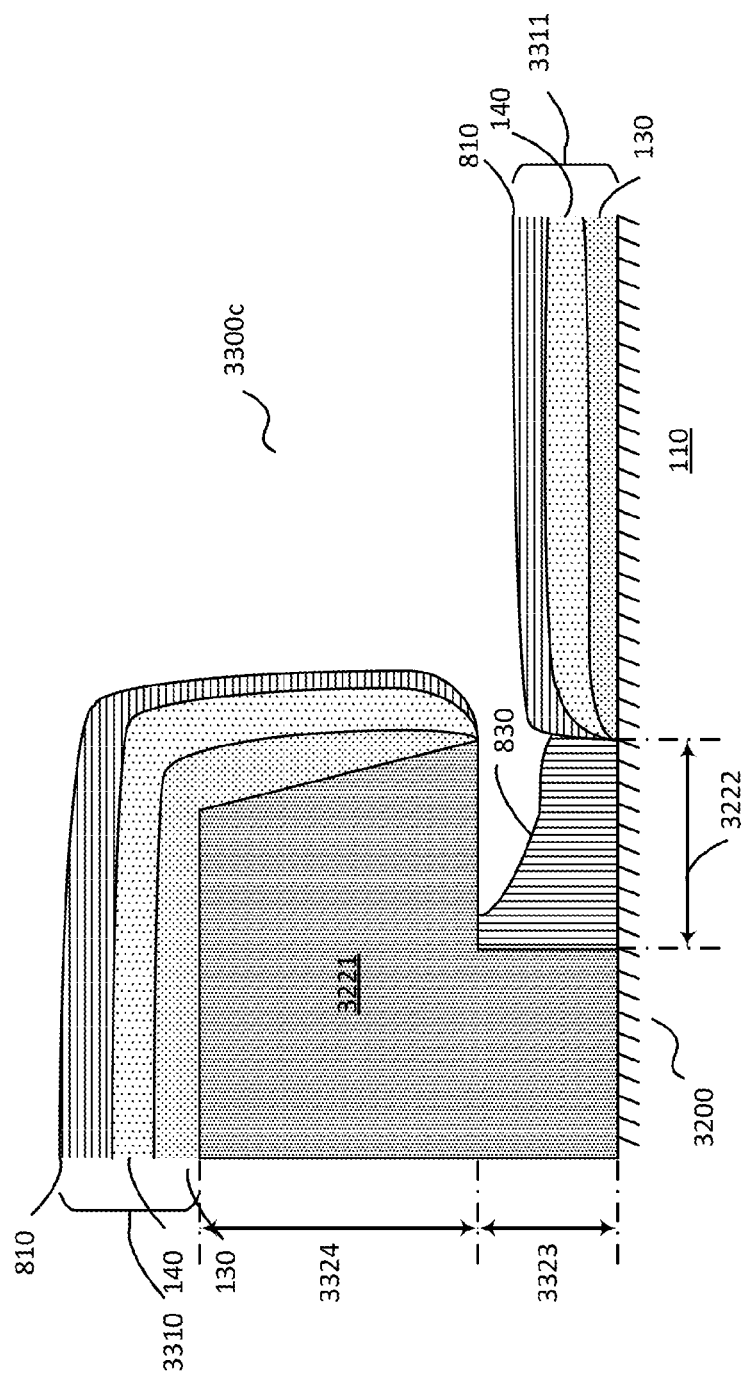
Figure 6D:
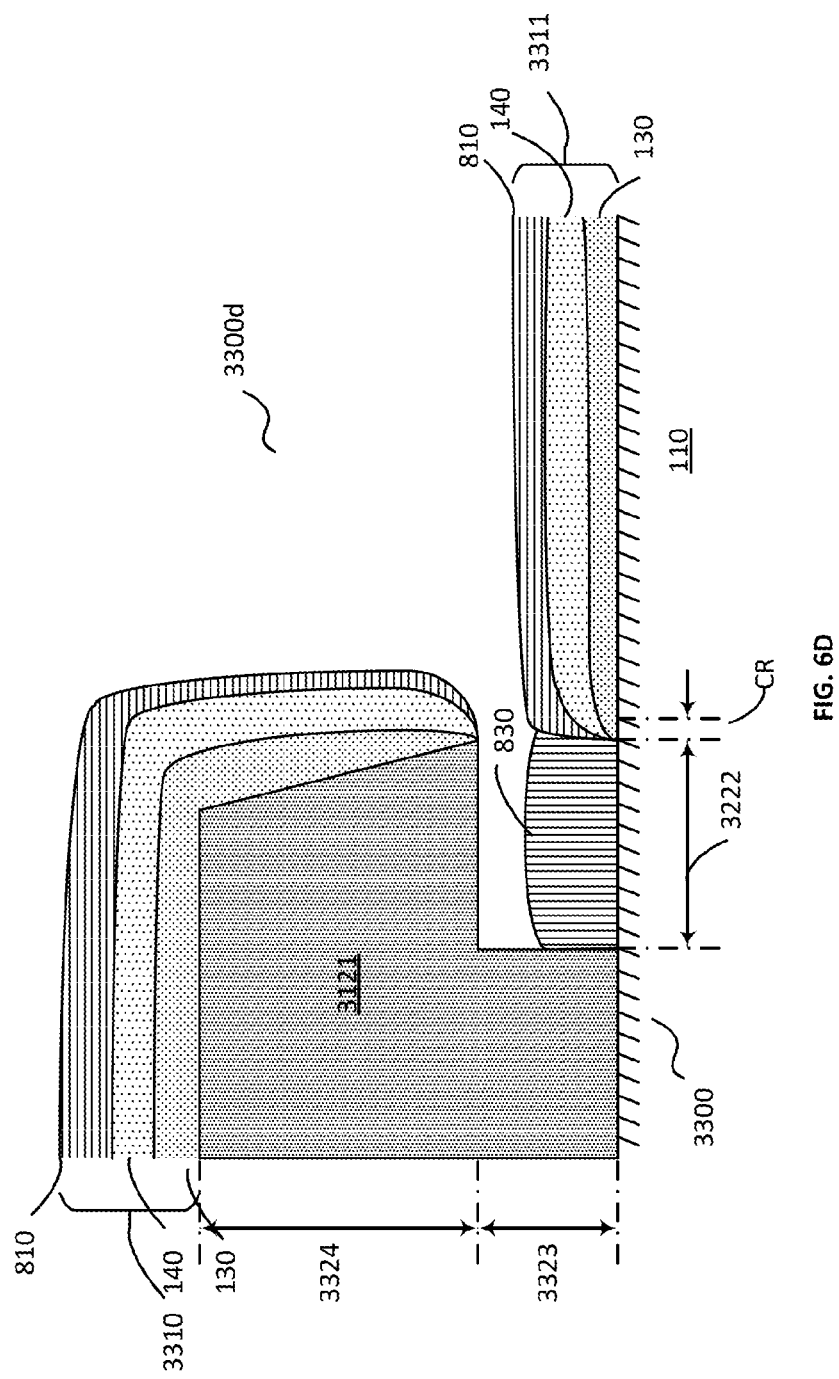
Figure 6E:
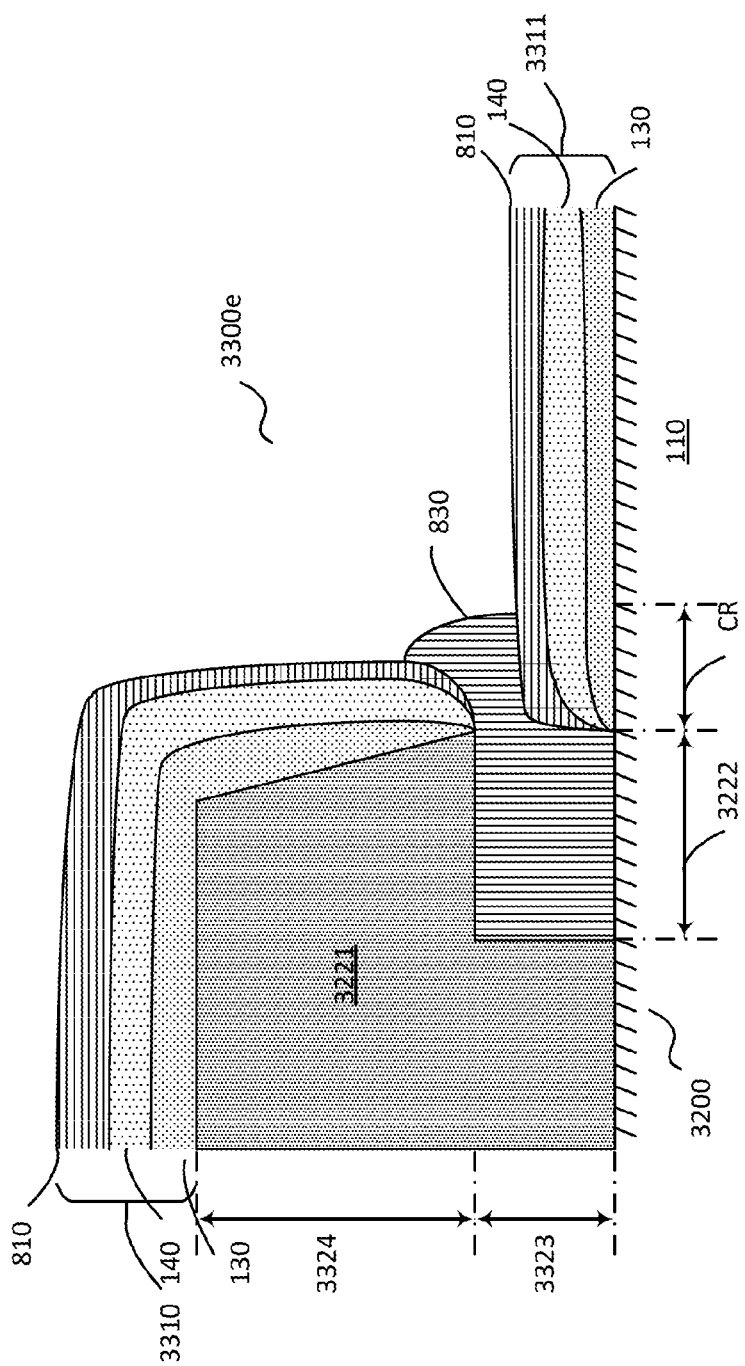
Figure 6F:
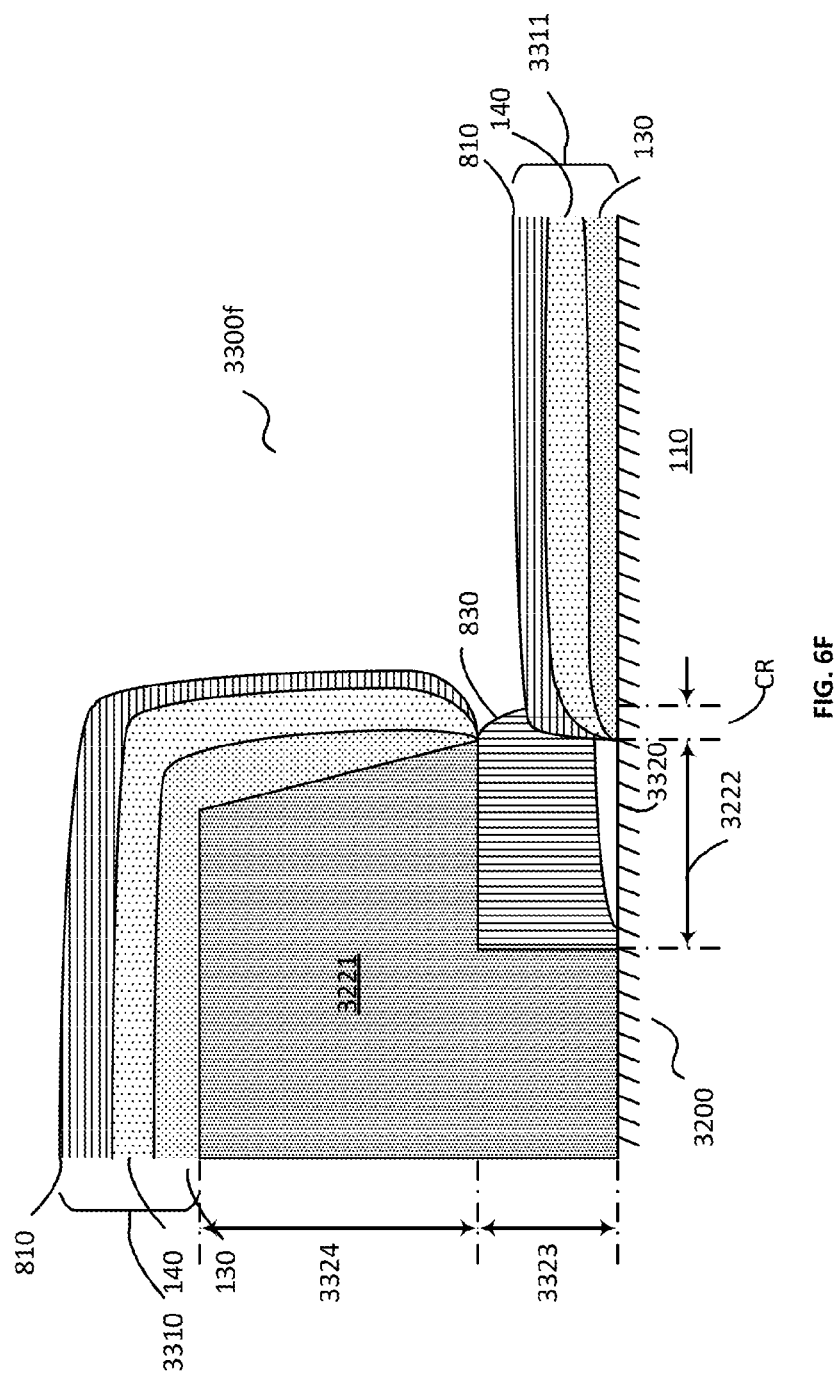
Figure 6G:
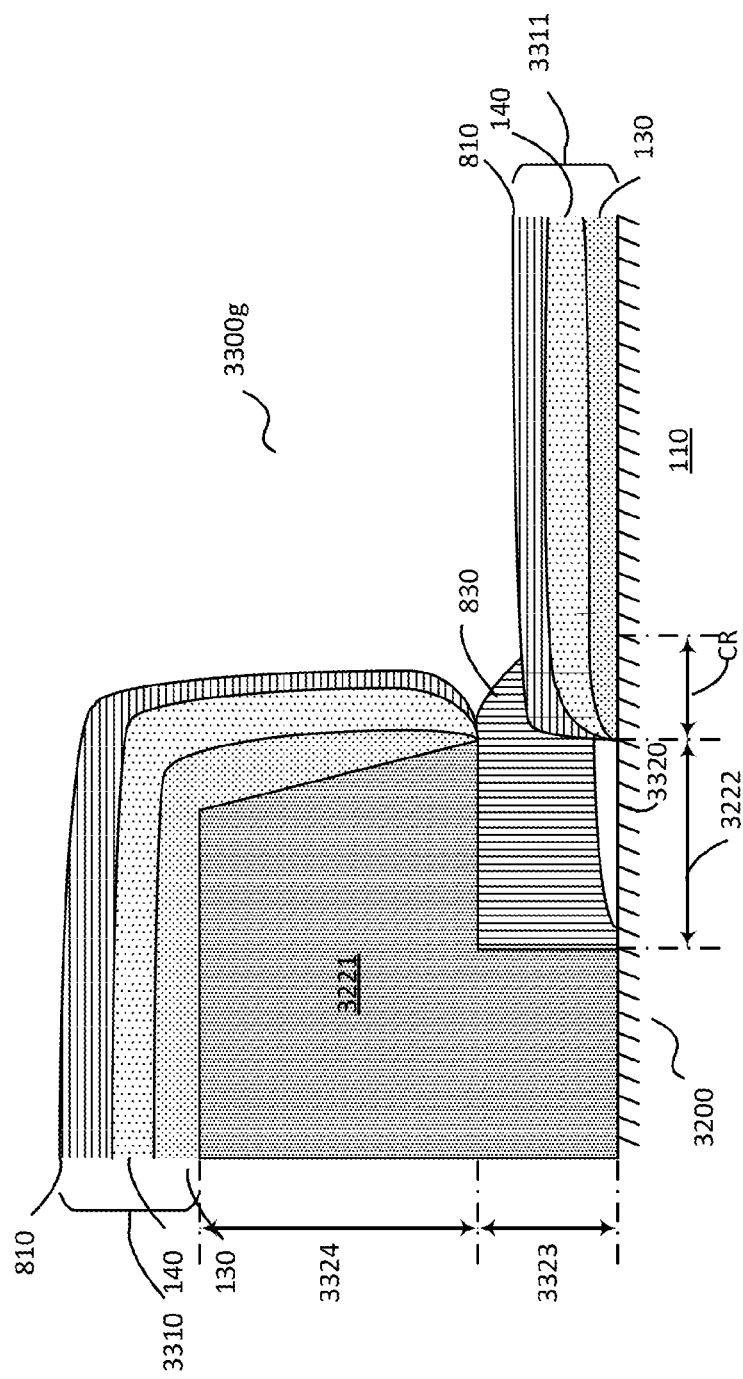
Figure 6H:
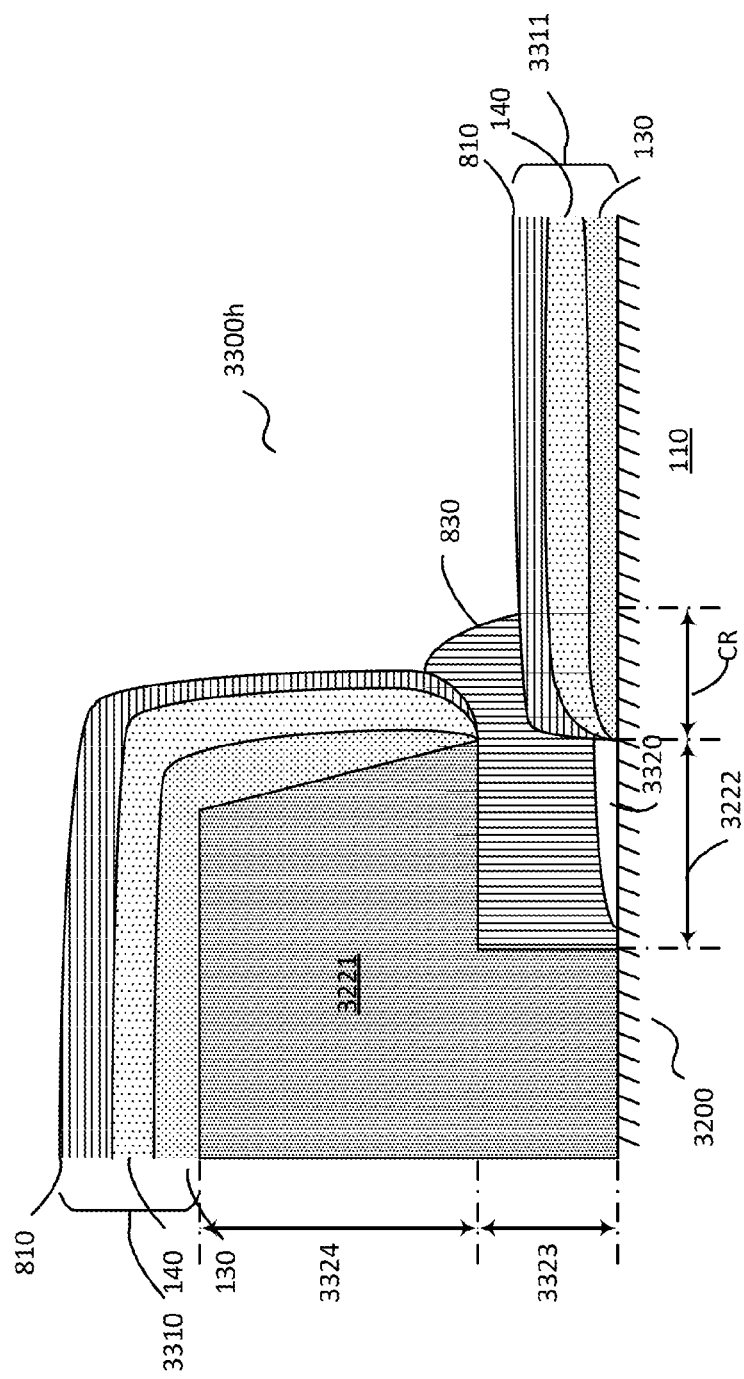
Figure 6I:
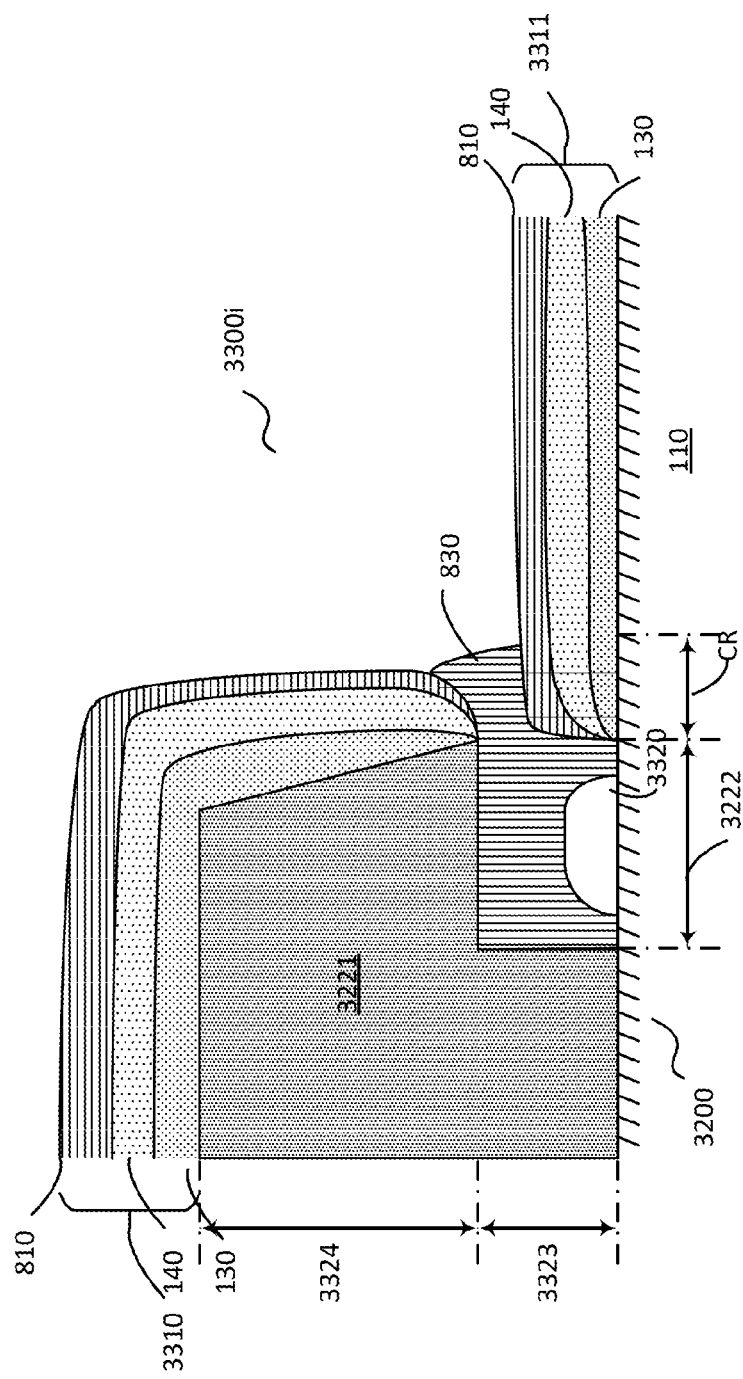
Figure 6J:
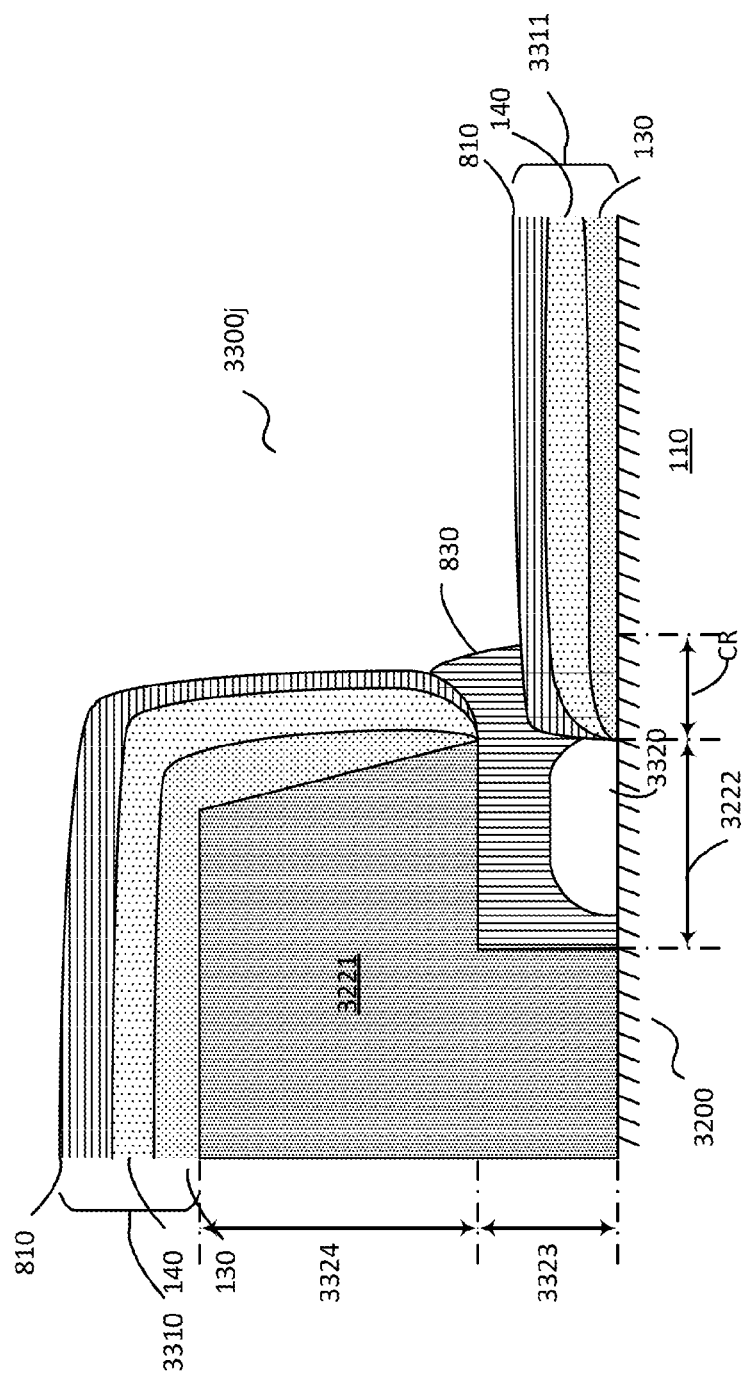
Figure 6K:
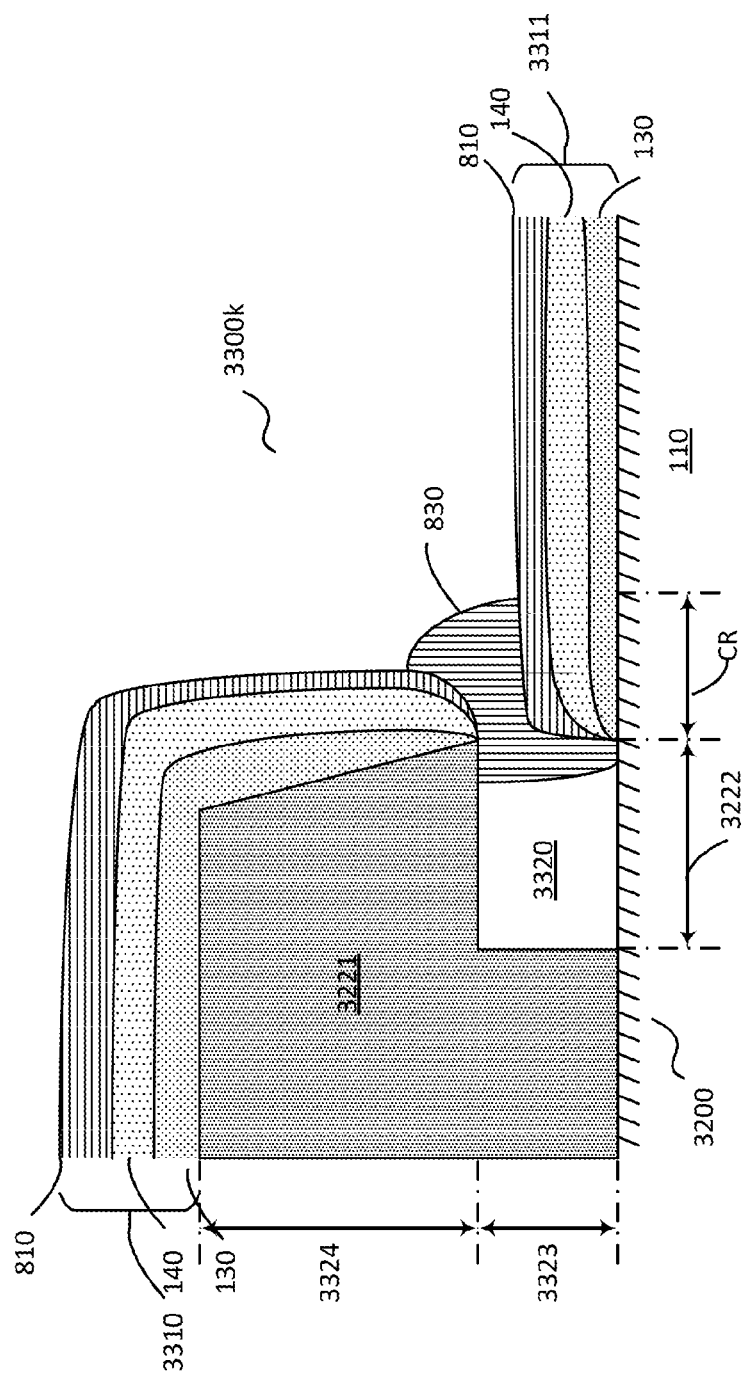
Figure 6L:
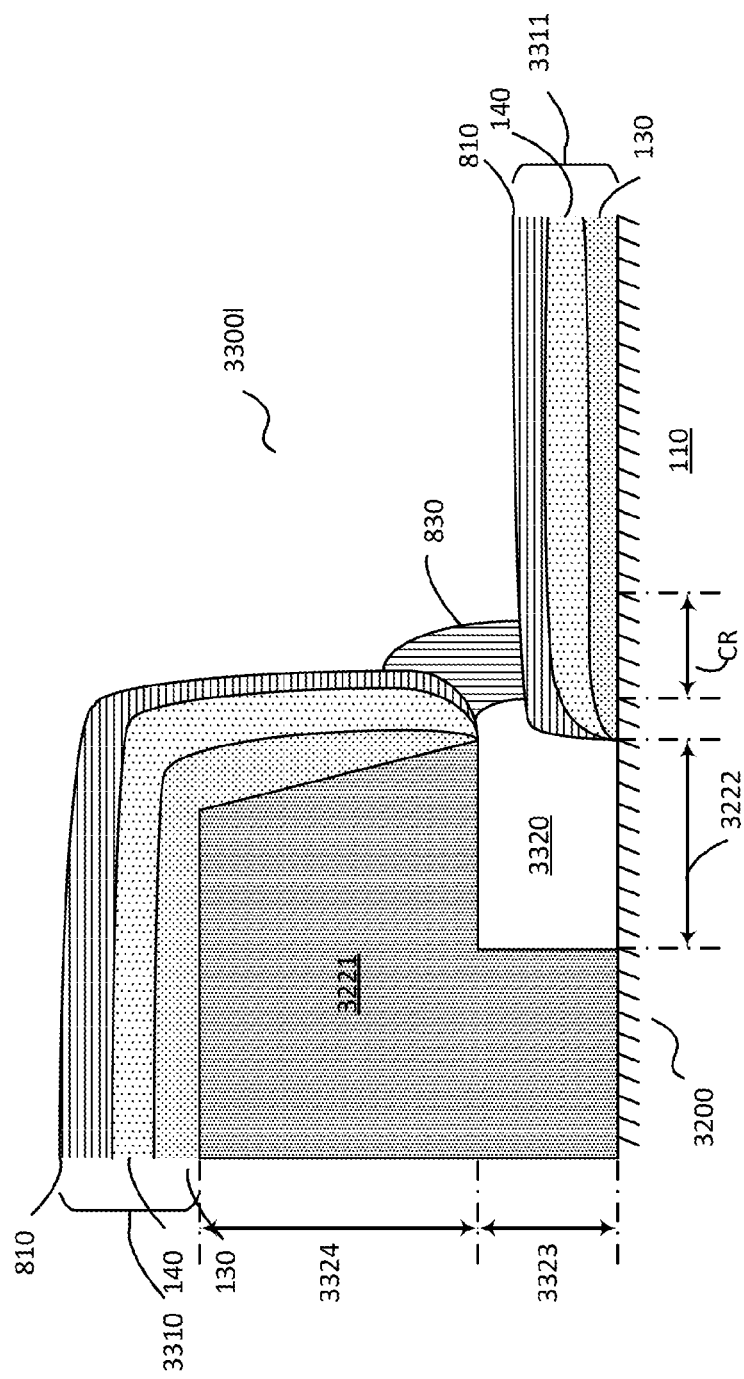
Figure 6M:
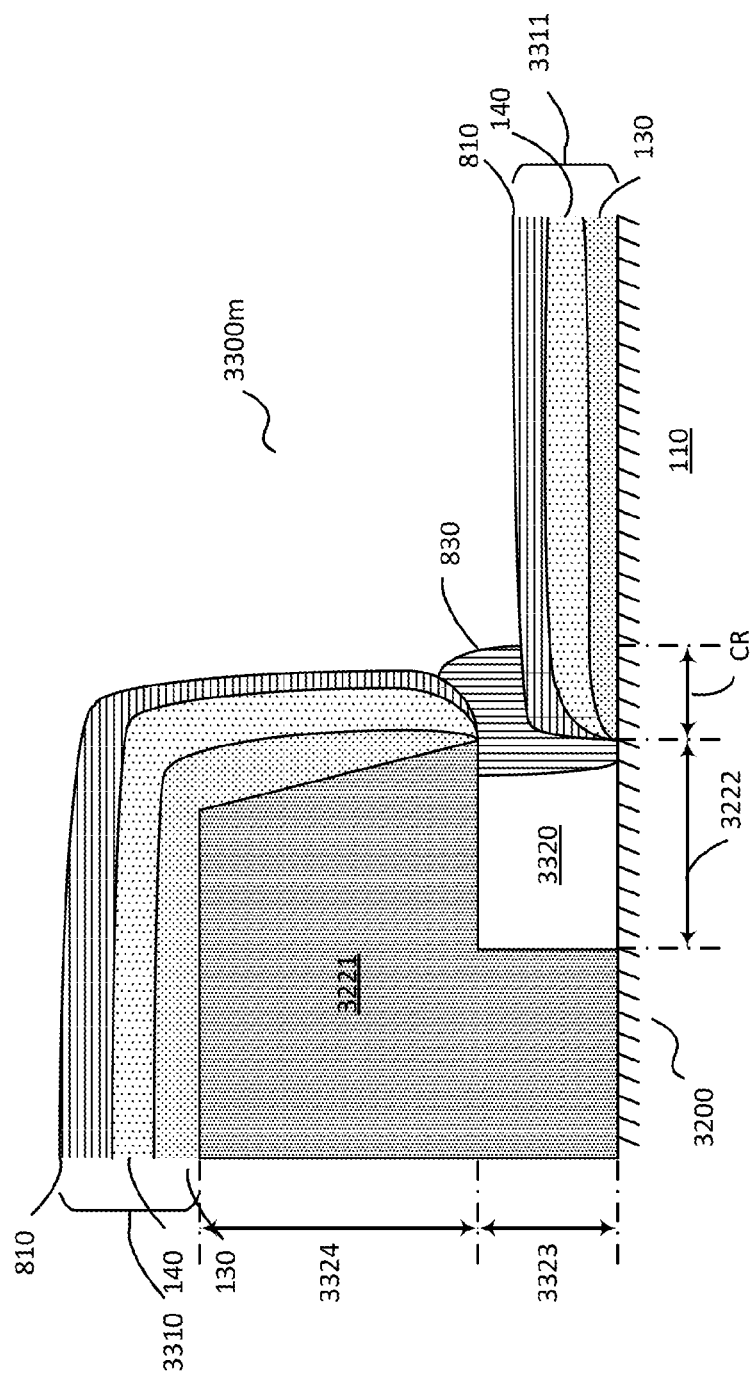
Figure 6N:
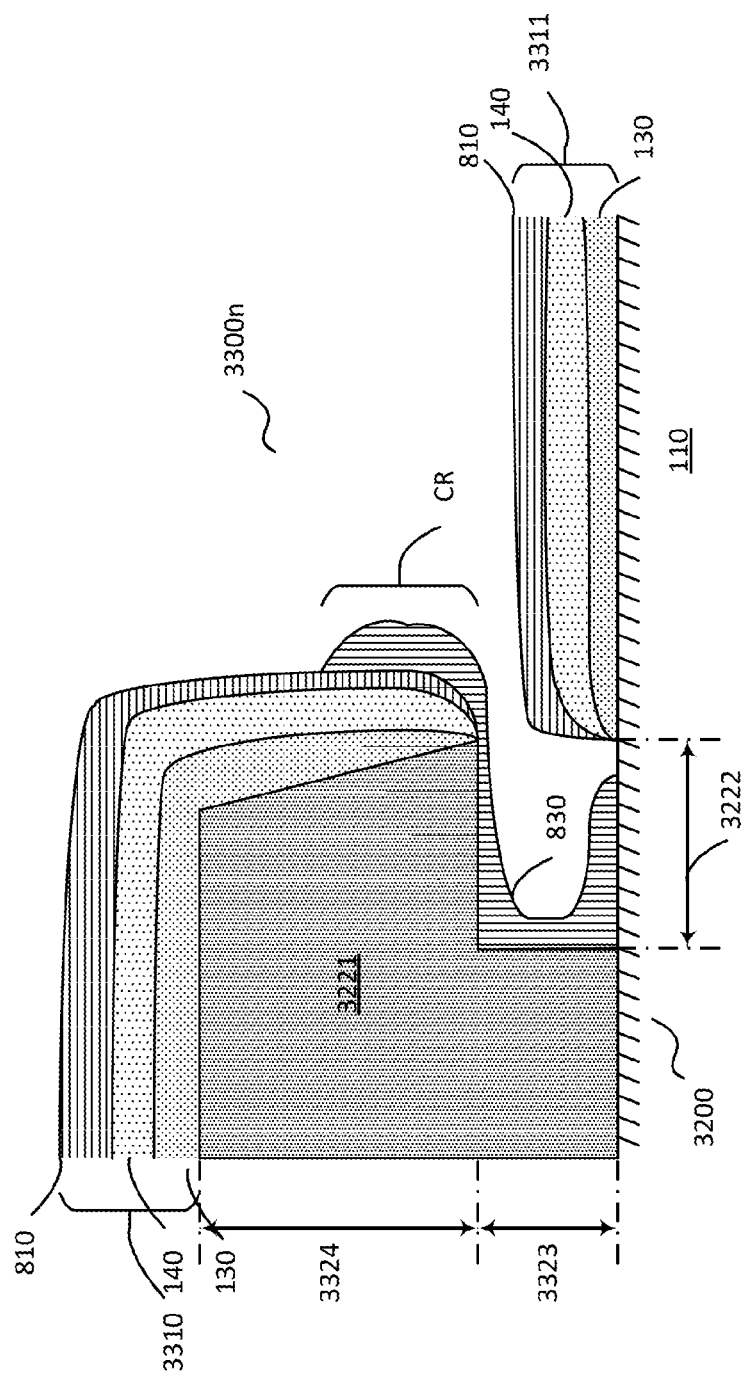
Figure 6O:
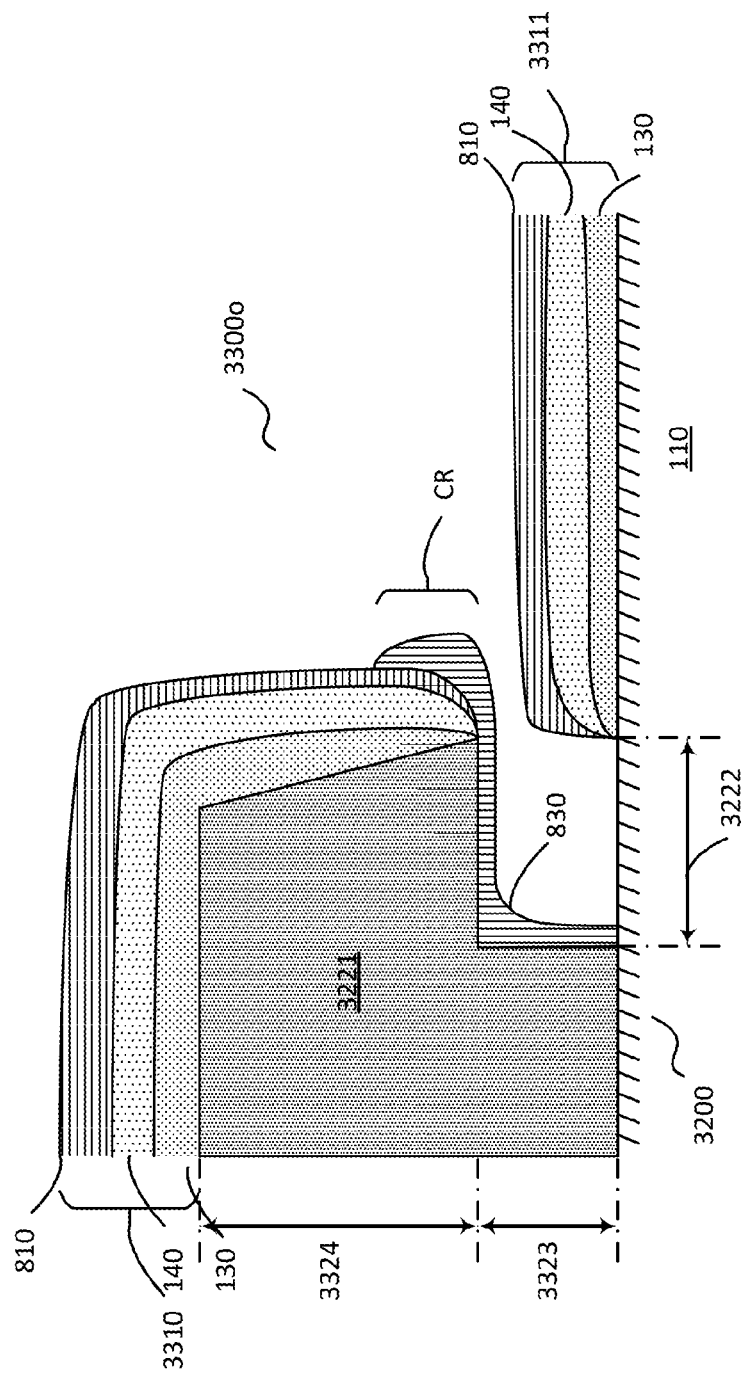
Figure 6P:
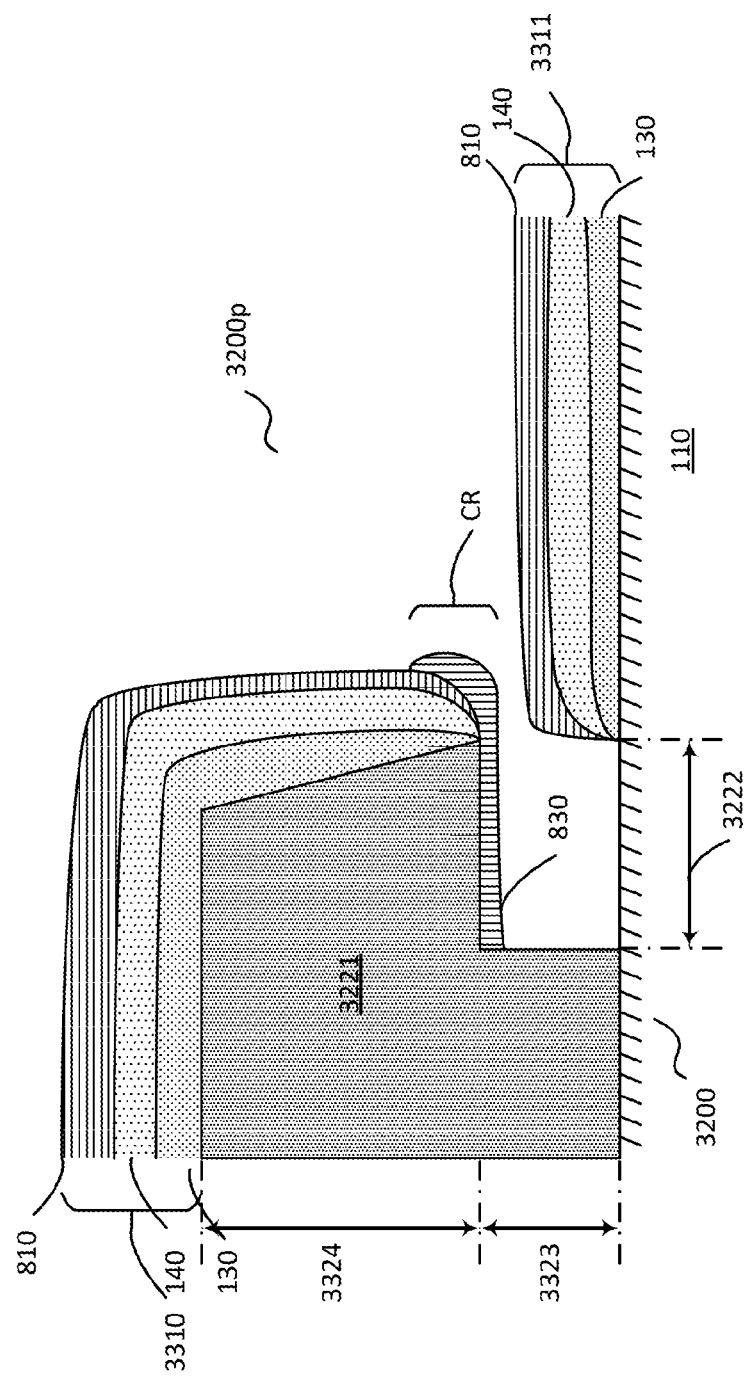

FIGS. 6B-6P show various non-limiting examples of the fragment of the device 3200 shown in FIG. 6A after the stage of depositing the conductive coating 830. In FIGS. 6B-6P, for purposes of simplicity of illustration, not all features of the partition 3221 and/or the recess 3222 as described in FIG. 6A may always be shown and the auxiliary electrode 1750 has been omitted, but it will be appreciated by those having ordinary skill in the relevant art, that such feature(s) and/or the auxiliary electrode 1750 may, in some non-limiting examples, nevertheless be present. It will be appreciated by those having ordinary skill in the relevant art that the auxiliary electrode 1750 may be present in any of the examples of FIGS. 6B-6P, in any form and/or position, including without limitation, those shown in any of the examples of FIGS. 7A-7G described herein.

In these figures, a partition device stack 3310 is shown comprising the at least one semiconducting layer 130, the second electrode 140 and the NIC 810 deposited on the upper section 3324.

In these figures, a device stack 3311 is shown comprising the at least one semiconducting layer 130, the second electrode 140 and the NIC 810 deposited on the substrate 100 beyond the partition 3221 and recess 3222. From comparison with FIG. 5, it may be seen that the device stack 3311 may, in some non-limiting examples, correspond to the semiconductor layer 130, second electrode 140 and the NIC 810 as it approaches the recess 3221 at and/or proximate to the lip 3329. In some non-limiting examples, the partition device stack 3310 may be formed when an open mask and/or mask-free deposition process is used to deposit various materials of the device stack 3311.

In a non-limiting example 3300*b* shown in FIG. 6B, the conductive coating 830 is substantially confined to and/or substantially fills the recess 3222. As such, in some non-limiting examples, the conductive coating 830 may be in physical contact with the ceiling 3325, the side 3326 and the floor 3327 and thus be electrically coupled to the auxiliary electrode 1750.

Without wishing to be bound by any particular theory, it may be postulated that substantially filling the recess 3222 may reduce a likelihood that any unwanted substances (including without limitation, gases) would be trapped within the recess 3222 during fabrication of the device 3200.

In some non-limiting examples, a coupling and/or contact region (CR) may correspond to a region of the device 3200 wherein the conductive coating 830 is in physical contact with the device stack 3311 in order to electrically couple the second electrode 140 with the conductive coating 830. In some non-limiting examples, the CR extends between about 50 nm and about 1500 nm from an edge of the device stack 3311 proximate to the partition 3221. By way of non-limiting examples, the CR may extend between about 50 nm and about 1000 nm, between about 100 nm and about 500 nm, between about 100 nm and about 350 nm, between about 100 nm and about 300 nm, between about 150 nm and about 300 nm, and/or between about 100 nm and about 200 nm. In some non-limiting examples, the CR may encroach on the device stack 3311 substantially laterally away from an edge thereof by such distance.

In some non-limiting examples, an edge of the device stack 3311 may be formed by the at least one semiconducting layer 130, the second electrode 140 and the NIC 810, wherein an edge of the second electrode 140 may be coated and/or covered by the NIC 810. In some non-limiting examples, the edge of the device stack 3311 may be formed in other configurations and/or arrangements. In some non-limiting examples, the edge of the NIC 810 may be recessed relative to the edge of the second electrode 140, such that the edge of the second electrode 140 may be exposed, such that the CR may include such exposed edge of the second electrode 140 in order that the second electrode 140 may be in physical contact with the conductive coating 830 to electrically couple them. In some non-limiting examples, the edges of the at least one semiconducting layer 130, the second electrode 140 and the NIC 810 may be aligned with one another, such that the edges of each layer are exposed. In some non-limiting examples, the edges of the second electrode 140 and of the NIC 810 may be recessed relative to the edge of the at least one semiconducting layer 130, such that the edge of the device stack 3311 is substantially provided by the semiconductor layer 130.

Additionally, as shown, in some non-limiting examples, within a small CR and arranged at and/or near the lip 3329 of the partition 3221, the conductive coating 830 extends to cover at least an edge of the NIC 810 within the device stack 3311 arranged closest to the partition 3221. In some non-limiting examples, the NIC 810 may comprise a semiconducting material and/or an insulating material.

While it has been described herein that direct deposition of the material for forming the conductive coating 830 on the surface of the NIC 810 is generally inhibited, in some non-limiting examples, it has been discovered that a part of the conductive coating 830 may nevertheless overlap at least a part of the NIC 810. By way of non-limiting example, during deposition of the conductive coating 830, the material for forming the conductive coating 830 may initial deposit within the recess 3221. Thereafter continuing to deposit the material for forming the conductive coating 830 may, in some non-limiting examples, cause the conductive coating 830 to extend laterally beyond the recess 3121 and overlap at least a part of the NIC 810 within the device stack 3311.

Those having ordinary skill in the relevant art will appreciate that while the conductive coating 830 has been shown as overlapping a part of the NIC 810, the lateral extent 410 of the emissive region 1910 remains substantially devoid of the material for forming the conductive coating 830. In some non-limiting examples, the conductive coating 830 may be arranged within the lateral extent 420 of at least a part of at least one non-emissive region 1920 of the device 3200, in some non-limiting examples, without substantially interfering with emission of photons from emissive region(s) 1910 of the device 3200.

In some non-limiting examples, the conductive coating 830 may nevertheless be electrically coupled to the second electrode 140 despite the interposition of the NIC 810 therebetween to reduce an effective sheet resistance of the second electrode 140.

In some non-limiting examples, the NIC 810 may be formed using an electrically conductive material and/or otherwise exhibit a level of charge mobility that allows current to tunnel and/or pass therethrough.

In some non-limiting examples, the NIC 810 may have a thickness that allows current to pass therethrough. In some non-limiting examples, the thickness of the NIC 810 may be between about 3 nm and about 65 nm, between about 3 nm and about 50 nm, between about 5 nm and about 50 nm, between about 5 nm and about 30 nm, and/or between about 5 nm and about 15 nm, between about 5 nm and about 10 nm. In some non-limiting examples, the NIC 810 may be provided with a relatively low thickness (in some non-limiting examples, a thin coating thickness), in order to reduce contact resistance that may be created due to the presence of the NIC 810 in the path of such electric current.

Without wishing to be bound by any particular theory, it may be postulated that substantially filling the recess 3221 may, in some non-limiting examples, enhance reliability of electrical coupling between the conductive coating 830 and at least one of the second electrode 140 and the auxiliary electrode 1750.

Further, as shown, in some non-limiting examples, the conductive coating 830 extends to cover at least a part of the NIC 810 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*c* shown in FIG. 6C, the conductive coating 830 is substantially confined to and/or partially fills the recess 3222. As such, in some non-limiting examples, the conductive coating 830 may be in physical contact with the side 3326, the floor 3327 and, in some non-limiting examples, at least a part of the ceiling 3325 and thus be electrically coupled to the auxiliary electrode 1750.

As shown, in some non-limiting examples, at least a part of the ceiling 3325 is substantially devoid of the conductive coating 830. In some non-limiting examples, such part is proximate to the lip 3329.

Additionally, as shown, in some non-limiting examples, within the small CR arranged at and/or near the lip 3329 of the partition 3221, the conductive coating 830 extends to cover at least an edge of the NIC 810 within the device stack 3311 arranged closest to the partition 3221. In some non-limiting examples, the conductive coating 830 may nevertheless be electrically coupled to the second electrode 140 despite the interposition of the NIC 810 therebetween.

In a non-limiting example 3300*d* shown in FIG. 6D, the conductive coating 830 is substantially confined to and/or partially fills the recess 3222. As such, in some non-limiting examples, the conductive coating 830 may be in physical contact with the floor 3327 and in some non-limiting examples, at least a part of the side 3326 and thus be electrically coupled to the auxiliary electrode 1750.

As shown, in some non-limiting examples, the ceiling 3325 is substantially devoid of the conductive coating 830.

Additionally, as shown, in some non-limiting examples, within the small CR arranged at and/or near the lip 3329 of the partition 3221, the conductive coating 830 extends to cover at least an edge of the NIC 810 within the device stack 3311 arranged closest to the partition 3221. In some non-limiting examples, the conductive coating 830 may nevertheless be electrically coupled to the second electrode 140 despite the interposition of the NIC 810 therebetween.

In a non-limiting example 3300*e* shown in FIG. 6E, the conductive coating 830 substantially fills the recess 3221. As such, in some non-limiting examples, the conductive coating 830 may be in physical contact with the ceiling 3325, the side 3326 and the floor 3327 and thus be electrically coupled to the auxiliary electrode 1750.

Additionally, as shown, in some non-limiting examples, within the CR, the conductive coating 830 extends to cover at least a part of the NIC 810 within the device stack 3311 in order to electrically couple the second electrode 140 with the conductive coating 830.

Further, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*f* shown in FIG. 6F, the conductive coating 830 is substantially confined to and/or partially fills the recess 3222. As such, in some non-limiting examples, the conductive coating 830 may be in physical contact with the ceiling 3325, the side 3326, and in some non-limiting examples, at least a part of the floor 3327 and thus be electrically coupled to the auxiliary electrode 1750.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and a part of the device stack 3311 and has a relatively thin profile.

In some non-limiting examples, the cavity 3320 may correspond to a volume that is between about 1% and about 30%, between about 5% and about 25%, between about 5% and about 20% and/or between about 5% and about 10% of a volume of the recess 3222.

Additionally, as shown, in some non-limiting examples, within the CR, the conductive coating 830 extends to cover at least a part of the NIC 810 within the device stack 3311 in order to electrically couple the second electrode 140 with the conductive coating 830.

In a non-limiting example 3300*g* shown in FIG. 6G, the conductive coating 830 partially fills the recess 3222. As such, in some non-limiting examples, the conductive coating 830 may be in physical contact with the ceiling 3325, the side 3326 and in some non-limiting examples, at least a part of the floor 3327 and thus be electrically coupled to the auxiliary electrode 1750.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and a part of the device stack 3311 and has a relatively thin profile.

In some non-limiting examples, the cavity 3320 may correspond to a volume that is between about 1% and about 30%, between about 5% and about 25%, between about 5% and about 20% and/or between about 5% and about 10% of a volume of the recess 3222.

Additionally, as shown, in some non-limiting examples, within the CR, the conductive coating 830 extends to cover at least a part of the NIC 810 within the device stack 3311 in order to electrically couple the second electrode 140 with the conductive coating 830.

In a non-limiting example 3300h shown in FIG. 6H, the conductive coating 830 partially fills the recess 3222. As such, in some non-limiting examples, the conductive coating 830 may be in physical contact with the ceiling 3325, the side 3326 and, in some non-limiting examples, at least a part of the floor 3327.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and a part of the device stack 3311 and has a relatively thin profile.

In some non-limiting examples, the cavity 3320 may correspond to a volume that is between about 1% and about 30%, between about 5% and about 25%, between about 5% and about 20% and/or between about 5% and about 10% of a volume of the recess 3222.

Additionally, as shown, in some non-limiting examples, within the CR, the conductive coating 830 extends to cover at least a part of the NIC 810 within the residual device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300i shown in FIG. 6I, the conductive coating 830 partially fills the recess 3222. As such, in some non-limiting examples, the conductive coating 830 may be in physical contact with the ceiling 3325, the side 3326 and, in some non-limiting examples, at least a part of the floor 3327.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and has a relatively thicker profile than the cavity 3320 shown in examples 3300f-3300h.

In some non-limiting examples, the cavity 3320 may correspond to a volume that is between about 10% and about 80%, between about 10% and about 70%, between about 20% and about 60%, between about 10% and about 30%, between about 25% and about 50%, between about 50% and about 80% and/or between about 70% and about 95% of a volume of the recess 3222.

Additionally, as shown, in some non-limiting examples, within the CR, the conductive coating 830 extends to cover at least a part of the NIC 810 within the device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300j shown in FIG. 6J, the conductive coating 830 partially fills the recess 3222. As such, in some non-limiting examples, the conductive coating 830 may be in physical contact with the ceiling 3325, the side 3326 and, in some non-limiting examples, at least a part of the floor 3327.

As shown, in some non-limiting examples, a cavity 3320 may be formed between the conductive coating 830 and the floor 3327. In some non-limiting examples, the cavity 3320 may correspond to a gap separating the conductive coating 830 from at least a part of the floor 3327, such that the conductive coating 830 is not in physical contact therealong.

As shown, in some non-limiting examples, the cavity 3320 engages a part of the floor 3327 and a [art of the device stack 3311 and has a relatively thicker profile than the cavity 3320 shown in examples 3300f-3300h.

In some non-limiting examples, the cavity 3320 may correspond to a volume that is between about 10% and about 80%, between about 10% and about 70%, between about 20% and about 60%, between about 10% and about 30%, between about 25% and about 50%, between about 50% and about 80% and/or between about 70% and about 95% of a volume of the recess 3222.

Additionally, as shown, in some non-limiting examples, within the CR, the conductive coating 830 extends to cover at least a part of the NIC 810 within the device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300k shown in FIG. 6K, the conductive coating 830 partially fills the recess 3222. As such, in some non-limiting examples, the conductive coating 830 may be in physical contact with, in some non-limiting examples, at least a part of the ceiling 3325 and, in some non-limiting examples, at least a part of the floor 3327.

As shown, in some non-limiting examples, a cavity 3320 may be formed between the conductive coating 830 and the side 3326, in some non-limiting examples, at least a part of the ceiling 3325 and in some non-limiting examples, at least a part of the floor 3327. In some non-limiting examples, the cavity 3320 may correspond to a gap separating the conductive coating 830 from the side 3326, in some non-limiting examples, at least a part of the ceiling 3325 and, in some non-limiting examples, at least a part of the floor 3327, such that the conductive coating 830 is not in physical contact therealong.

As shown, in some non-limiting examples, the cavity 3320 occupies substantially all of the recess 3222.

In some non-limiting examples, the cavity 3320 may correspond to a volume that is between about 10% and about 80%, between about 10% and about 70%, between about 20% and about 60%, between about 10% and about 30%, between about 25% and about 50%, between about 50% and about 80% and/or between about 70% and about 95% of a volume of the recess 3222.

Additionally, as shown, in some non-limiting examples, within the CR, the conductive coating 830 extends to cover at least a part of the NIC 810 within the residual device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*l* shown in FIG. 6L, the conductive coating 830 partially fills the recess 3222.

As shown, in some non-limiting examples, a cavity 3320 may be formed between the conductive coating 830 and the side 3326, the floor 3327 and the ceiling 3325. In some non-limiting examples, the cavity 3320 may correspond to a gap separating the conductive coating 830 from the side 3326, the floor 3327 and the ceiling 3325, such that the conductive coating 830 is not in physical contact therealong.

As shown, in some non-limiting examples, the cavity 3320 substantially occupies the recess 3222.

In some non-limiting examples, the cavity 3320 may correspond to a volume that is greater than about 80% of a volume of the recess 3222.

Additionally, as shown, in some non-limiting examples, within the CR, the conductive coating 830 extends to cover at least a part of the NIC 810 within the device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*m* shown in FIG. 6M, the conductive coating 830 is substantially confined to and/or partially fills the recess 3222. As such, in some non-limiting examples, the conductive coating 830 may be in physical contact with, in some non-limiting examples, at least a part of the ceiling 3325 and in some non-limiting examples, at least a part of the floor 3327.

As shown, in some non-limiting examples, a cavity 3320 may be formed between the conductive coating 830 and the side 3326, in some non-limiting examples, at least a part of the ceiling 3325 and in some non-limiting examples, at least a part of the floor 3327. In some non-limiting examples, the cavity 3320 may correspond to a gap separating the conductive coating 830 from the side, in some non-limiting examples, at least a part of the ceiling 3325 and, in some non-limiting examples, at least a part of the floor 3327, such that the conductive coating 830 is not in physical contact therealong.

As shown, in some non-limiting examples, the cavity 3320 occupies substantially the recess 3222.

In some non-limiting examples, the cavity 3320 may correspond to a volume that is between about 10% and about 80%, between about 10% and about 70%, between about 20% and about 60%, between about 10% and about 30%, between about 25% and about 50%, between about 50% and about 80% and/or between about 70% and about 95% of a volume of the recess 3222.

Additionally, as shown, in some non-limiting examples, within the CR, the conductive coating 830 extends to cover at least a part of the NIC 810 within the device stack 3311. In some non-limiting examples, the conductive coating 830 may nevertheless be electrically coupled to the second electrode 140 despite the interposition of the NIC 810 therebetween.

Further, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*n* shown in FIG. 6N, the conductive coating 830 partially fills the recess 3222. As such, in some non-limiting examples, the conductive coating 830 may be in physical contact with the ceiling 3325, the side 3326 and, in some non-limiting examples, at least a part of the floor 3327.

Additionally, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300*o* shown in FIG. 6O, the conductive coating 830 partially fills the recess 3222. As such, in some non-limiting examples, the conductive coating

830 may be in physical contact with the ceiling 3325, the side 3326 and, in some non-limiting examples, at least a part of the floor 3327.

Additionally, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

In a non-limiting example 3300p shown in FIG. 33P, the conductive coating 830 partially fills the recess 3222. As such, in some non-limiting examples, the conductive coating 830 may be in physical contact with the ceiling 3325, in some non-limiting examples, at least a part of the side 3326.

Additionally, as shown, in some non-limiting examples, the conductive coating 830 extends to cover at least a part of the NIC 810 of the partition device stack 3310 disposed on the upper section 3324 of the partition 3221. In some non-limiting examples, a part of the NIC 810 at and/or proximate to the lip 3329 may be covered by the conductive coating 830. In some non-limiting examples, the conductive coating 830 may nevertheless be electrically coupled to the second electrode 140 despite the interposition of the NIC 810 therebetween.

FIGS. 7A-7G show various non-limiting examples of different locations of the auxiliary electrode 1750 throughout the fragment of the device 3200 shown in FIG. 6A, again at a stage prior to deposition of the at least one semiconducting layer 130. Accordingly, in FIGS. 7A-7G, the at least one semiconducting layer 130, the second electrode 140 and the NIC 810, whether or not as part of the residual device stack 3311, and the conductive coating 830 are not shown. Nevertheless, it will be appreciated by those having ordinary skill in the relevant art, that such feature(s) and/or layer(s) may be present, after deposition, in any of the examples of FIGS. 7A-7G, in any form and/or position, including without limitation, those shown in any of the examples of FIGS. 6B-6P.

Figure 7A:
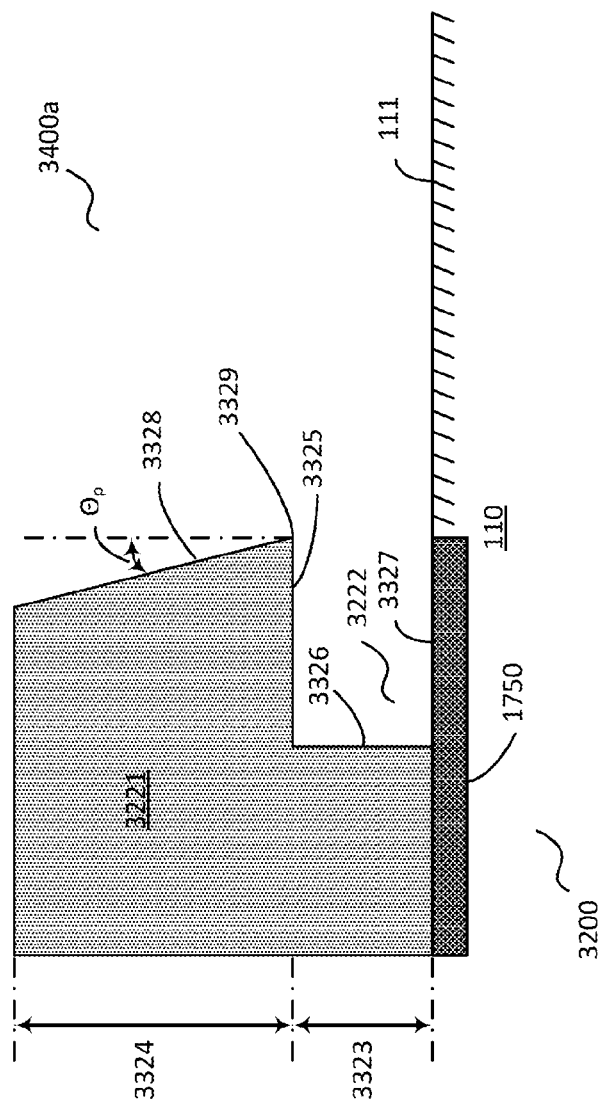
FIGS. 7A-7G are schematic diagrams that show various examples of an auxiliary electrode within the device of FIG. 6A, according to various examples in the present disclosure.

In a non-limiting example 3400a shown in FIG. 7A, the auxiliary electrode 1750 is arranged adjacent to and/or within the substrate 110 such that a surface of the auxiliary electrode 1750 is exposed in the recess 3222. As shown, in some non-limiting examples, such surface of the auxiliary electrode 1750 is provided in and/or may form and/or provide at least a part of the floor 3327. By way of non-limiting example, the auxiliary electrode 1750 may be arranged to be disposed adjacent to the partition 3221. In some non-limiting examples, the auxiliary electrode 1750 may be formed of at least one electrically conductive material. In some non-limiting examples, the partition 3221 may be formed of at least one substantially insulating material including without limitation, photoresist. In some non-limiting examples, various features of the device 3200, including without limitation, the partition 3221 and/or the auxiliary electrode 1750, may be formed using techniques including without limitation, photolithography.

Figure 7B:
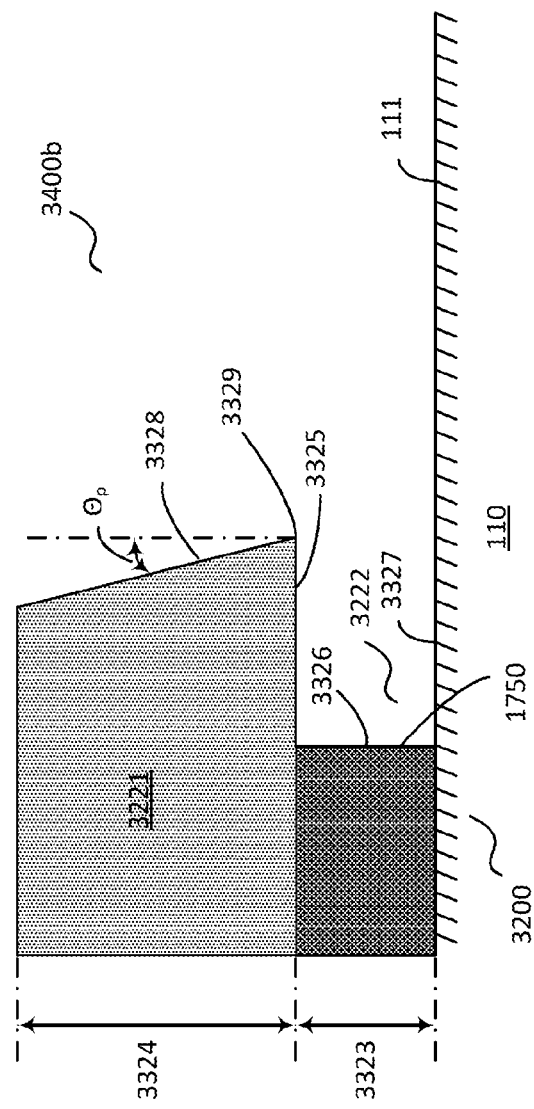

In a non-limiting example 3400b shown in FIG. 7B, the auxiliary electrode 1750 is formed integrally with and/or as part of the partition 3221 such that a surface of the auxiliary electrode 1750 is exposed in the recess 3222. As shown, in some non-limiting examples, such surface of the auxiliary electrode 1750 is provided in and/or may form and/or provide at least a part of the side 3326. By way of non-limiting example, the auxiliary electrode 1750 may be arranged to correspond to the lower section 3323. In some non-limiting examples, the auxiliary electrode 1750 may be formed of at least one electrically conductive material. In some non-limiting examples, the upper section 3324 may be formed of at least one substantially insulating material including without limitation, photoresist. In some non-limiting examples, various features of the device 3200, including without limitation, the upper section 3324 and/or the auxiliary electrode 1750, may be formed using techniques including without limitation, photolithography.

Figure 7C:
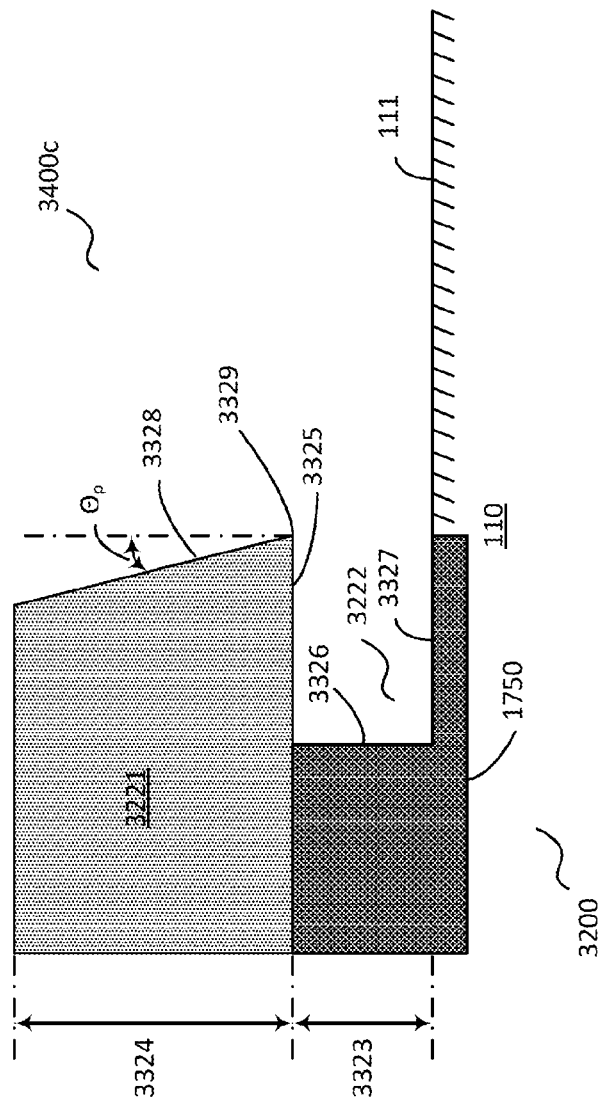

In a non-limiting example 3400c shown in FIG. 7C, the auxiliary electrode 1750 is arranged both adjacent to and/or within the substrate 110 and integrally with and/or as part of the partition 3221 such that a surface of the auxiliary electrode 1750 is exposed in the recess 3222. As shown, in some non-limiting examples, such surface of the auxiliary electrode 1750 is provided in and/or may form and/or provide at least a part of the side 3326 and/or at least a part of the floor 3327. By way of non-limiting example, the auxiliary electrode 1750 may be arranged to be disposed adjacent to the partition 3221 and/or to correspond to the lower section 3323. In some non-limiting examples, the part of the auxiliary electrode 1750 disposed adjacent to the partition 3221 may be electrically coupled and/or in physical contact with the part thereof that corresponds to the lower section 3323. In some non-limiting examples, such parts may be formed continuously and/or integrally with one another. In some non-limiting examples, the auxiliary electrode 1750 may be formed of at least one electrically conductive material. In some non-limiting examples, the parts thereof may be formed of different materials. In some non-limiting examples, the partition 3221 and/or the upper section 3324 thereof may be formed of at least one substantially insulating material including without limitation, photoresist. In some non-limiting examples, various features of the device 3200, including without limitation, the partition 3221, the upper section 3324 and/or the auxiliary electrode 1750, may be formed using techniques including without limitation, photolithography.

Figure 7D:
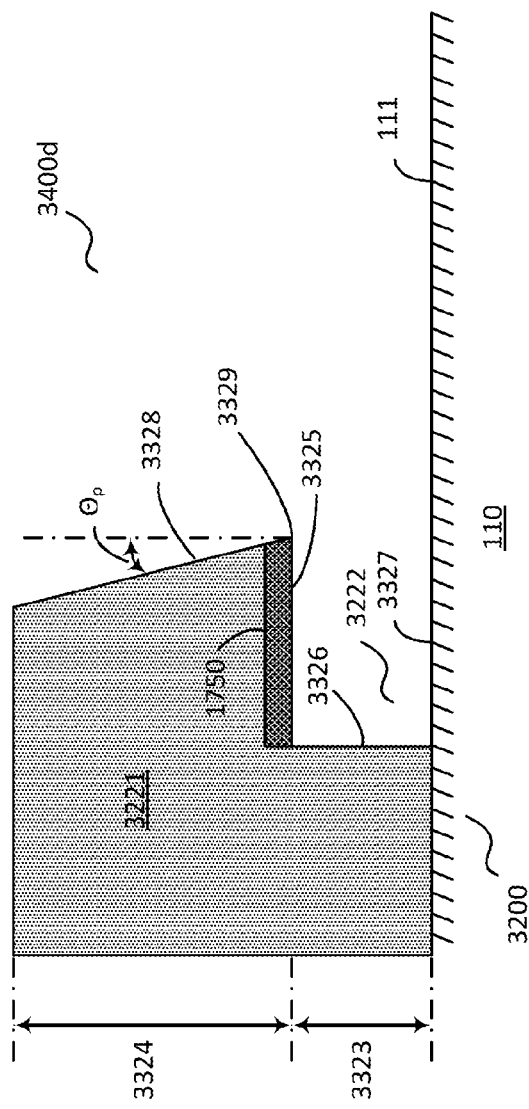

In a non-limiting example 3400d shown in FIG. 7D, the auxiliary electrode 1750 is arranged adjacent to and/or within the upper section 3324 such that a surface of the auxiliary electrode 1750 is exposed within the recess 3222. As shown, in some non-limiting examples, such surface of the auxiliary electrode 1750 is provided in and/or may form and/or provide at least a part of the ceiling 3325. By way of non-limiting example, the auxiliary electrode 1750 may be arranged to be disposed adjacent to the upper section 3324. In some non-limiting examples, the auxiliary electrode 1750 may be formed of at least one electrically conductive material. In some non-limiting examples, the partition 3221 may be formed of at least one substantially insulating material including without limitation, photoresist. In some non-limiting examples, various features of the device 3200, including without limitation, the partition 3221 and/or the auxiliary electrode 1670, may be formed using techniques including without limitation, photolithography.

Figure 7E:
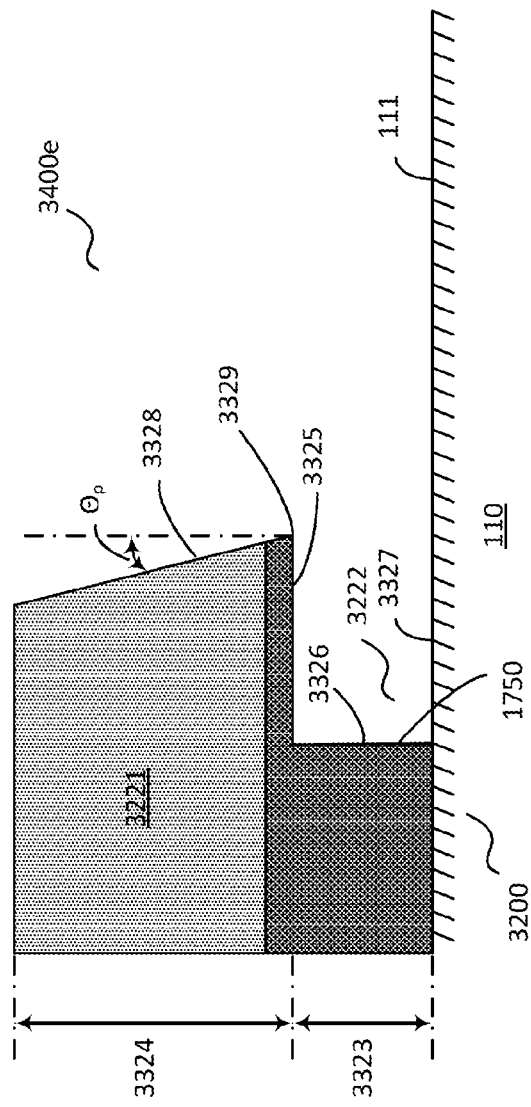

In a non-limiting example 3400e shown in FIG. 7E, the auxiliary electrode 1750 is arranged both adjacent to and/or within the upper section 3324 and integrally with and/or as part of the partition 3221 such that a surface of the auxiliary electrode 1750 is exposed in the recess 3222. As shown, in some non-limiting examples, such surface of the auxiliary electrode 1750 is provided in and/or may form and/or provide at least a part of the ceiling 3325 and/or at least a part of the side 3326. By way of non-limiting example, the auxiliary electrode 1750 may be arranged to be disposed adjacent to the upper section 3324 and/or to correspond to the lower section 3323. In some non-limiting examples, the part of the auxiliary electrode 1750 disposed adjacent to the upper section 3324 may be electrically coupled and/or in physical contact with the part thereof that corresponds to the lower section 3323. In some non-limiting examples, such part may be formed continuously and/or integrally with one another. In some non-limiting examples, the auxiliary electrode 1750 may be formed of at least one electrically conductive material. In some non-limiting examples, the parts thereof may be formed of different materials. In some non-limiting examples, the upper section 3324 may be formed of at least one substantially insulating material including without limitation, photoresist. In some non-limiting examples, various features of the device 3200, including without limitation, the upper section 3324 and/or the auxiliary electrode 1750, may be formed using techniques including without limitation, photolithography.

Figure 7F:
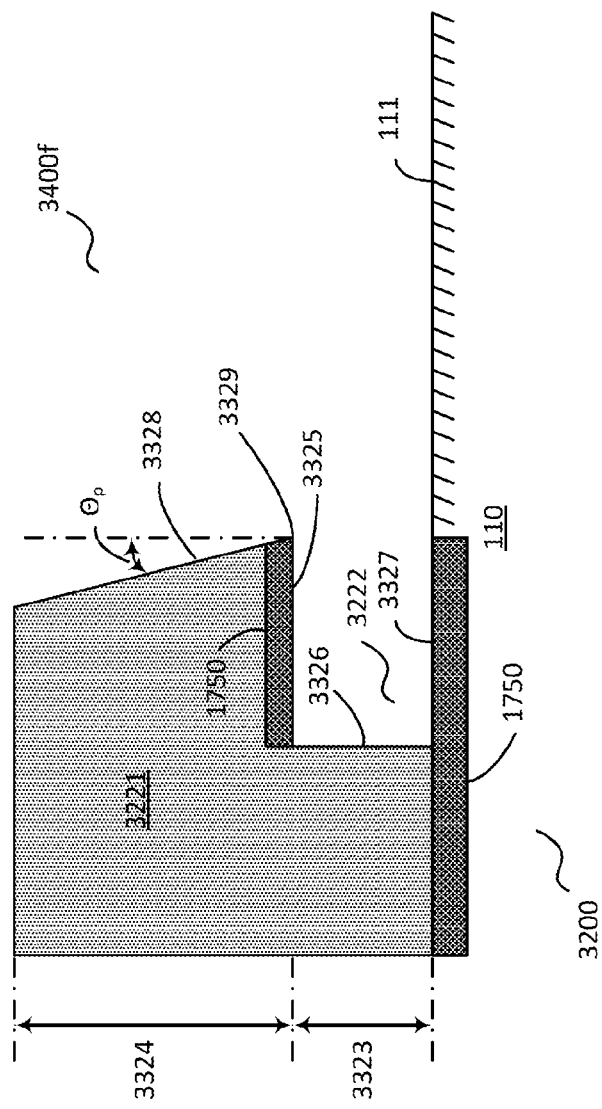

In a non-limiting example 3400f shown in FIG. 7F, the auxiliary electrode 1750 is arranged both adjacent to and/or within the substrate 110 and adjacent to and/or within the upper section 3324 such that a surface of the auxiliary electrode 1750 is exposed within the recess 3222. As shown, in some non-limiting examples, such surface of the auxiliary electrode 1750 is provided in and/or may form and/or provide at least a part of the ceiling 3325 and/or at least a part of the floor 3327. By way of non-limiting example, the auxiliary electrode 1750 may be arranged to be disposed adjacent to the partition 3221 and/or adjacent to the upper section 3324 thereof. In some non-limiting examples, the part of the auxiliary electrode 1750 disposed adjacent to the partition may be electrically coupled to the part thereof that corresponds to the ceiling 3325. In some non-limiting examples, the auxiliary electrode 1750 may be formed of at least one electrically conductive material. In some non-limiting examples, the part thereof may be formed of different materials. In some non-limiting examples, the partition 3221 and/or the upper section 3324 thereof may be formed of at least one substantially insulating material including without limitation, photoresist. In some non-limiting examples, various features of the device 3200, including without limitation, the partition 3221, the upper section 3324 and/or the auxiliary electrode 1750, may be formed using techniques including without limitation, photolithography.

Figure 7G:
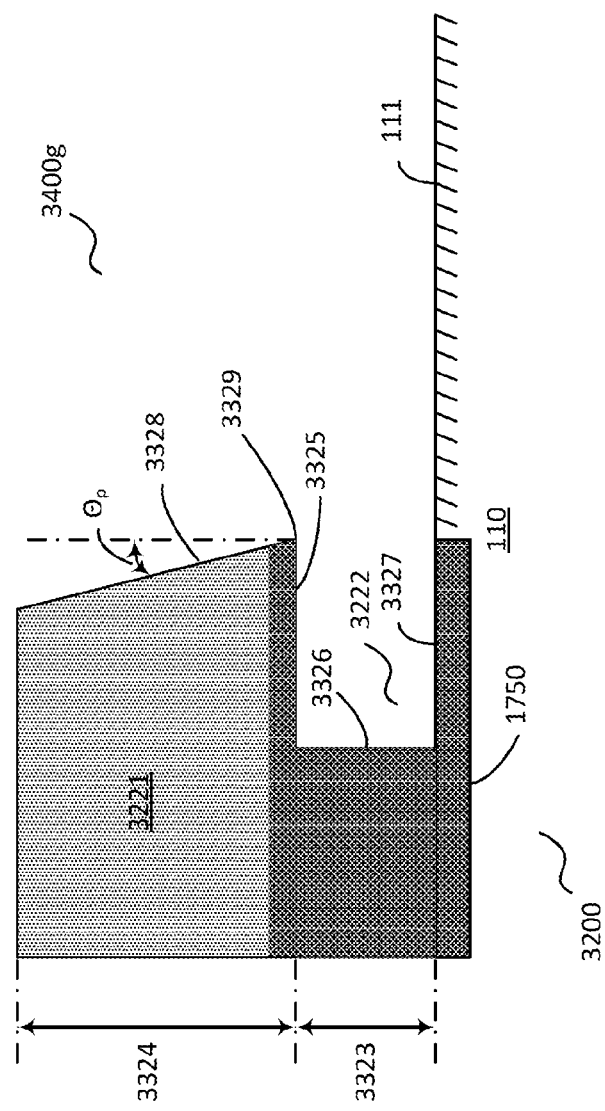

In a non-limiting example 3400g shown in FIG. 7G the auxiliary electrode 1750 is arranged both adjacent to and/or within the substrate 110, integrally with and/or as part of the partition 3221 and/or adjacent to and/or within the upper section 3324 such that a surface of the auxiliary electrode 1750 is exposed within the recess 3222. As shown, in some non-limiting examples, such surface of the auxiliary electrode 1750 is provided in and/or may form and/or provide at least a part of the ceiling 3325, at least a part of the side 3326 and/or at least a part of the floor 3327. By way of non-limiting example, the auxiliary electrode 1750 may be arranged to be disposed adjacent to the partition 3221, to correspond to the lower section 3323 and/or adjacent to the upper section 3324 thereof. In some non-limiting examples, the part of the auxiliary electrode 1750 disposed adjacent to the partition 3221 may be electrically coupled to at least one of the parts thereof that correspond to the lower section 3323 and/or to the ceiling 3325. In some non-limiting examples, the part of the auxiliary electrode 1750 that corresponds to the lower section 3323 may be electrically coupled to at least one of the parts thereof disposed adjacent to the partition 3221 and/or to the ceiling 3325. In some non-limiting examples, the part of the auxiliary electrode 1750 that corresponds to the ceiling 3325 may be electrically coupled to at least one of the parts thereof disposed adjacent to the partition and/or to the lower section 3323. In some non-limiting examples, the part of the auxiliary electrode 1750 that corresponds to the lower section 3323 may be in physical contact with at least one of the parts thereof disposed adjacent to the partition 3221 and/or that corresponds to the upper section 3324. In some non-limiting examples, the auxiliary electrode 1750 may be formed of at least one electrically conductive material. In some non-limiting examples, the parts thereof may be formed of different materials. In some non-limiting examples, the partition 3221, the lower section 3323 and/or the upper section 3324 thereof may be formed of at least one substantially insulating material including without limitation, photoresist. In some non-limiting examples, various features of the device 3200, including without limitation, the partition 3221, the lower section 3323 and/or the upper section 3324 thereof and/or the auxiliary electrode 1750, may be formed using techniques including without limitation, photolithography.

In some non-limiting examples, various features described in relation to FIGS. 6B-6P may be combined with various features described in relation to FIGS. 7A-7GH. In some non-limiting examples, the device stack 3311 and the conductive coating 830 according to any one of FIGS. 6B, 6C, 6E, 6F, 6G, 6H, 6I and/or 6J may be combined with the partition 3221 and the auxiliary electrode 1750 according to any one of FIGS. 7A-7G. In some non-limiting examples, any one of FIGS. 6K-6M may be independently combined with any one of FIGS. 7D-7G. In some non-limiting examples, any one of FIGS. 6C-6D may be combined with any one of FIGS. 7A, 7C, 7F and/or 7G.

Aperture in Non-Emissive Region

Figure 8A:
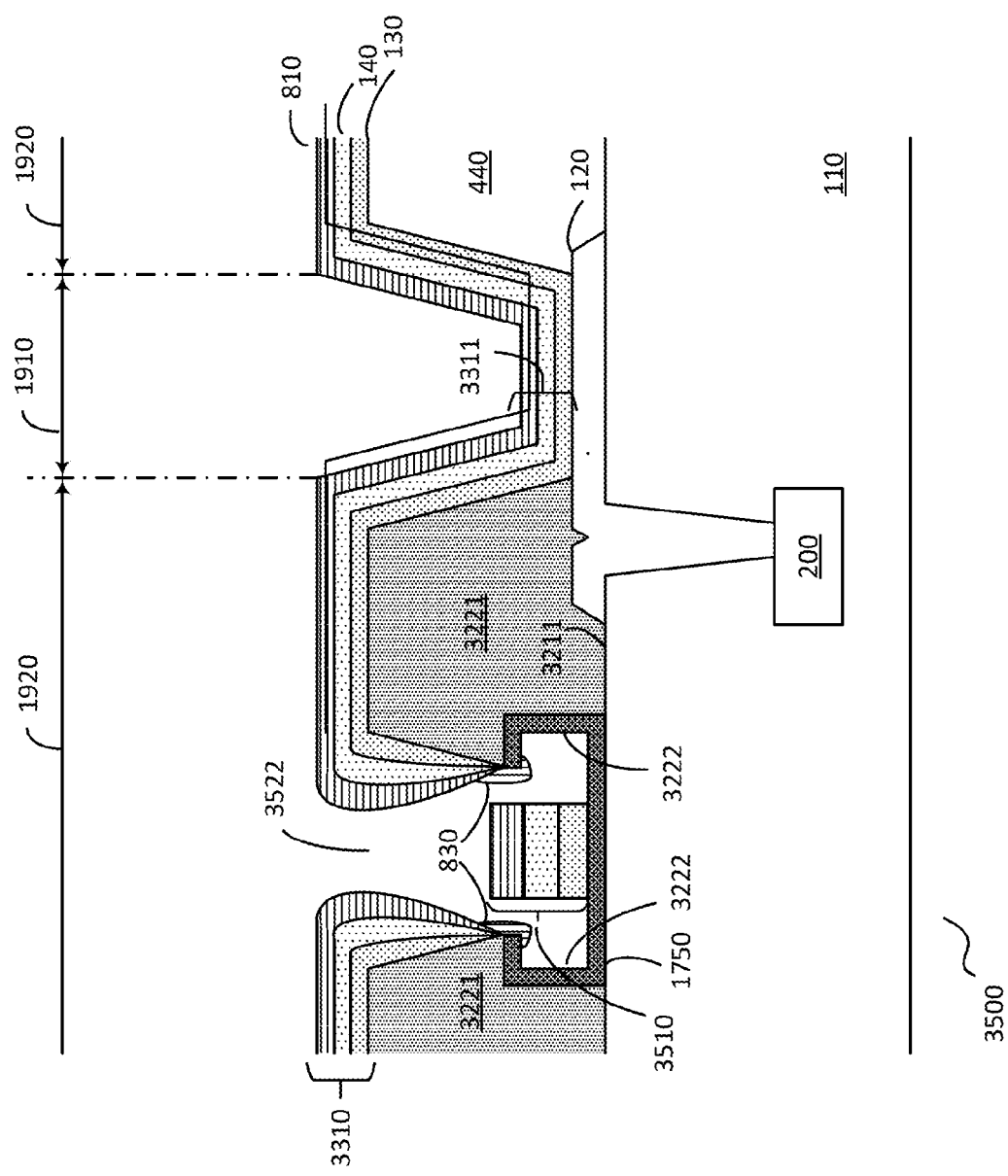
FIGS. 8A-8B are schematic diagrams that show example cross-sectional views of an example version of the device of FIG. 1 having a partition and a sheltered region, such as an aperture, in a non-emissive region, according to various examples in the present disclosure.

Turning now to FIG. 8A, there is shown a cross-sectional view of an example version 3500 of the device 100. The device 3500 differs from the device 3200 in that at least one partition 3221 in the non-emissive region 1920 defines a sheltered region 3065, such as an aperture 3522, therebetween. In some non-limiting examples, the at least one partition 3221 may be seen to comprise a pair of partitions 3221 in a facing arrangement. In some non-limiting examples, the at least one partition 3221 may be seen to have a substantially annular shape with an opening therewithin. As shown, in some non-limiting examples, the at least one partition 3221 may function as a PDL 440 that covers at least an edge of the first electrode 120 and that defines at least one emissive region 1910. In some non-limiting examples, the at least one partition 3221 may be provided separately from a PDL 440.

A sheltered region 3065, such as the recess 3222, is defined by the at least one partition 3221. In some non-limiting examples, the recess 3222 may be provided in a part of the aperture 3522 proximal to the substrate 110. In some non-limiting examples, the aperture 3522 may be substantially elliptical when viewed in plan view. In some non-limiting examples, the recess 3222 may be substantially annular when viewed in plan view and surround the aperture 3522.

In some non-limiting examples, the recess 3222 may be substantially devoid of materials for forming each of the layers of the device stack 3311 and/or of the partition device stack 3310. As may be seen in the figure, in some examples, the device stack 3311 may form part of the same structure as the partition device stack 3310.

In some non-limiting examples, an aperture device stack 3510 may be disposed within the aperture 3522. In some non-limiting examples, evaporated materials for forming each of the layers of the device stack 3311 (and/or partition device stack 3310) may be deposited within the aperture 3522 to form the aperture device stack 3510 therein.

In some non-limiting examples, the auxiliary electrode 1750 is arranged such that at least a part thereof is disposed within the recess 3222. By way of non-limiting example, the auxiliary electrode 1750 may be disposed relative to the recess 3222 by any one of the examples shown in FIGS. 37A-37G. As shown, in some non-limiting examples, the auxiliary electrode 1750 is arranged within the aperture 3522, such that the aperture device stack 3510 is deposited onto a surface of the auxiliary electrode 1750.

A conductive coating 830 is disposed within the aperture 3522 for electrically coupling the electrode 140 to the auxiliary electrode 1750. By way of non-limiting example, at least a part of the conductive coating 830 is disposed within the recess 3222. By way of non-limiting example, the conductive coating 830 may be disposed relative to the recess 3222 by any one of the examples shown in FIGS. 6A-6P. By way of non-limiting example, the arrangement shown in FIG. 8A may be seen to be a combination of the example shown in FIG. 6P in combination with the example shown in FIG. 7C.

Figure 8B:
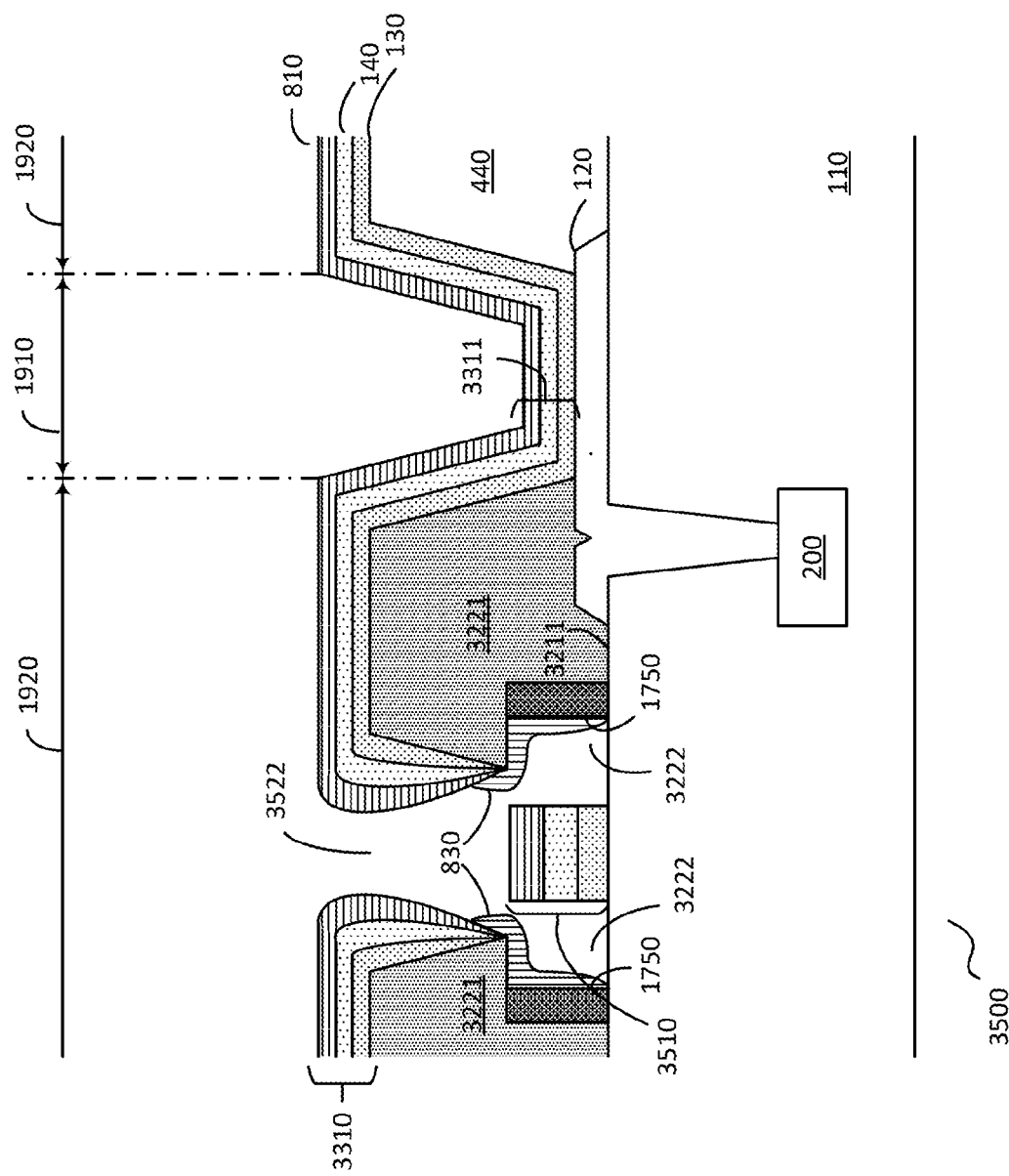

Turning now to FIG. 8B, there is shown a cross-sectional view of a further example of the device 3500. As shown, the auxiliary electrode 1750 is arranged to form at least a part of the side 3326. As such, the auxiliary electrode 1750 may be substantially annular when viewed in plan view and surround the aperture 3522. As shown, in some non-limiting examples, the aperture device stack 3510 is deposited onto an exposed layer surface 111 of the substrate 110.

By way of non-limiting examples, the arrangement shown in FIG. 8B may be seen to be a combination of the example shown in FIG. 6O in combination with the example shown in FIG. 7B.

EXAMPLES

The following examples for illustrative purposes only and are not intended to limit the generality of the present disclosure in any fashion.

Example 1

A patterned glass sample was fabricated by depositing a layer of ITO on a glass substrate 110, followed by a layer of Mo and a layer of photoresist. The deposition of these layers was followed by selective removal and etching of photoresist and Mo layers to form partition structures, in which each partition 3221 is formed to include a lower section 3323 formed by Mo and an upper section 3324 formed by the photoresist. Specifically, the lower section 3323 of the partition 3221 formed by Mo was approximately 350 nm thick, and the recess 3222 extended laterally by approximately 1300 nm. The patterned glass sample was then treated to deposit an approximately 200 nm thick semiconducting layer 130, followed by an approximately 20 nm thick layer of Mg:Ag to form the second electrode 140. An approximately 5 nm thick layer of NIC 810 was deposited over the second electrode 140. Then the entire sample was exposed to an Mg vapor flux until a reference thickness of 1000 nm was achieved.

Figure 9:
FIGS. 9-11, 12A-12B, and 13A-13B are micrographs taken by scanning electron microscope of example devices fabricated according to various examples in the present disclosure.

FIG. 9 is a cross-sectional image taken by SEM of the sample according to Example 1. As shown, the ITO layer 3620 is provided over the substrate 110 and the lower section 3323 and the upper section 3324 of the partition 3221 are provided. The device stack 3311 including the at least one semiconducting layer 130, the second electrode 140 and the NIC 810 are provided over the ITO layer 3620. The conductive coating 830 is formed by deposition of Mg. Specifically, the conductive coating 830 extends outside the recess 3222 to overlap with a subset of the device stack 3311 arranged proximal to the partition 3221. In this way, the conductive coating 830 is electrically coupled with the second electrode 140 of the device stack 3311 as well as the lower section 3323 of the partition 3221 and/or the ITO layer 3620.

Example 2

A patterned glass sample with a similar structure to that described in Example 1 was prepared, except that the Mo and photoresist layers were deposited on top of another photoresist layer 3720 instead of the ITO layer 3620. The partition 3221 formed in this way had a lower section 3323 formed by Mo of approximately 400 nm thickness, and a recess 3222 extending laterally by approximately 1300 nm. The patterned glass sample was then treated to deposit an approximately 200 nm thick semiconducting layer 130, followed by an approximately 15 nm thick layer of Mg:Ag to form the second electrode 140. An approximately 5 nm thick layer of NIC 810 was deposited over the second electrode 140. The entire sample was exposed to an Mg vapor flux until a reference thickness of 300 nm was achieved.

Figure 10:
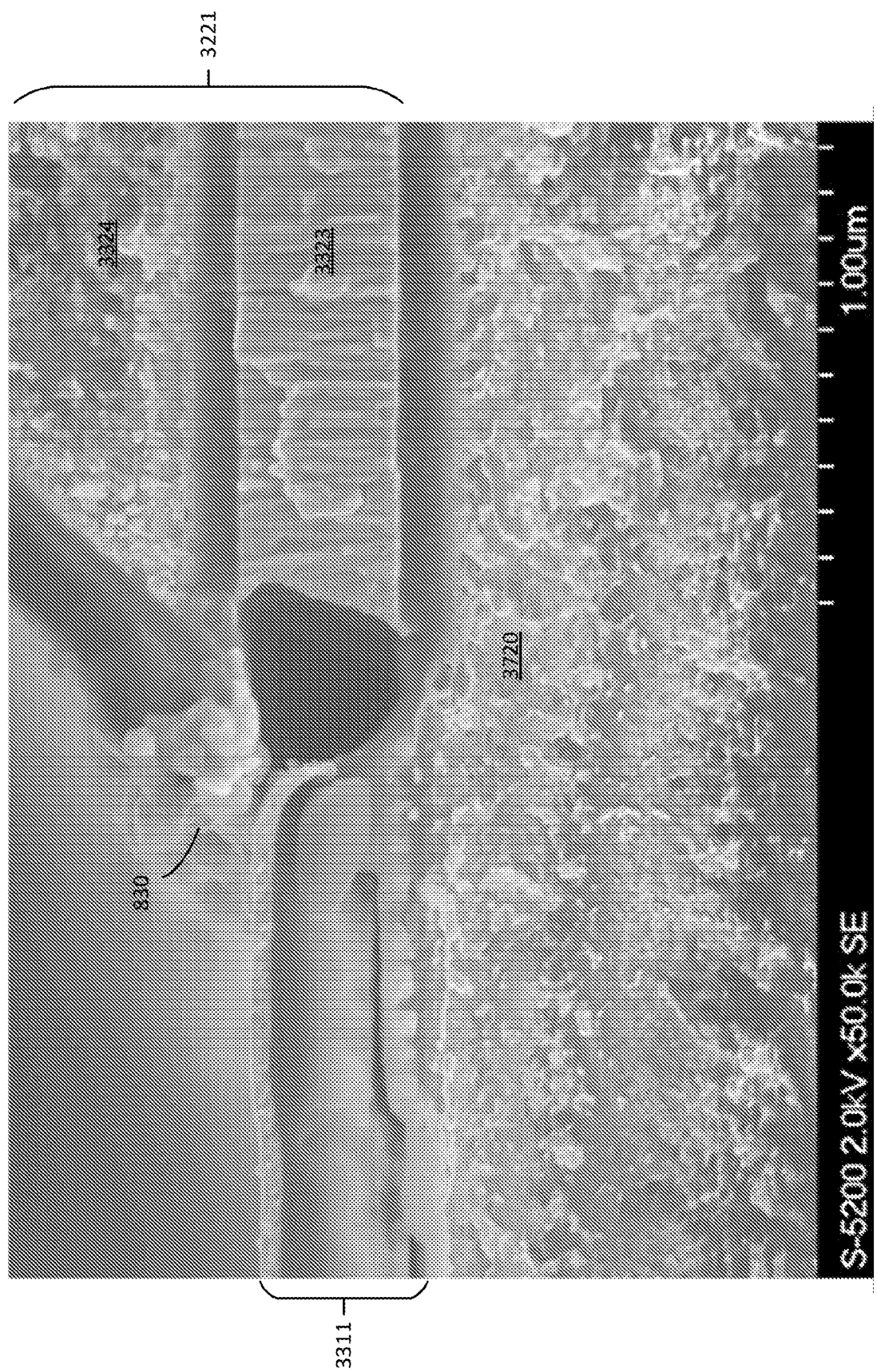

FIG. 10 is a cross-sectional image taken by SEM of the sample according to Example 2. As shown, the photoresist layer 3720 is provided over the glass substrate 110 and the lower section 3323 and the upper section 3324 of the partition 3221 are provided thereon. The device stack 3311 including the at least one semiconducting layer 130, the second electrode 140 and the NIC 810 are provided over the photoresist layer 3720. The conductive coating 830 is formed by deposition of Mg. Specifically, the conductive coating 830 is deposited over the lip 3329 and regions near and/or around the lip 3329 of the partition 3221. A subset of the conductive coating 830 extends beyond the recess 3222 to overlap with the device stack 3311 arranged proximate to the partition 3221. Another subset of the conductive coating 830 is disposed within the recess 3222 to cover the ceiling 3325 and extends laterally toward the lower section 3323 of the partition 3221. In this way, the conductive coating 830 is electrically coupled to the second electrode 140 of the device stack 3311 as well as the lower section 3323 of the partition 3221.

Example 3

A patterned glass sample with a similar structure to that described in Example 2 was prepared, except that an ITO layer 3824 was provided over the Mo layer to form a partition 3221 having a lower section 3323 formed by Mo and an upper section 3324 formed by ITO. The lower section 3323 of the partition 3221 had a thickness of approximately 400 nm and a recess extended laterally by approximately 300 nm. The patterned glass sample was then treated to deposit an approximately 200 nm thick semiconducting layer 130, followed by an approximately 20 nm thick layer of Mg:Ag to form the second electrode 140. An approximately 2 nm thick layer of NIC 810 was deposited over the second electrode 140. The entire sample was exposed to an Mg vapor flux until a reference thickness of 400 nm was achieved.

Figure 11:

FIG. 11 is a cross-sectional image taken by SEM of the sample according to Example 3. As shown, the photoresist layer 3720 is provided over the glass substrate 110 and the lower section 3323 and the upper section 3324 of the partition 3221 are provided thereon. The device stack 3311 including the at least one semiconducting layer 130, the second electrode 140 and the NIC 810 are provided over the photoresist layer 3720. The conductive coating 830 is formed by deposition of Mg. Specifically, the conductive coating 830 is deposited over the lip 3329 and regions near and/or around the lip 3329 of the partition 3221. A subset of the conductive coating 830 extends beyond the recess 3222 to overlap with the device stack 3311 arranged proximate to the partition 3221. Another subset of the conductive coating 830 is disposed within the recess 3222 to cover the ceiling 3325 and extend laterally toward the lower section 3323 of the partition 3221. In this way, the conductive coating 830 is electrically coupled to the second electrode 140 of the device stack 3311 as well as at least the upper section 3324 of the partition 3221, which is electrically conductive.

Example 4

A patterned glass sample with a similar structure to that described in FIG. 8B was prepared. Specifically, the partition 3221 comprises a lower section 3323 formed by an approximately 360 nm thick layer of Mo and an upper section 3324 formed by photoresist. The recess 3222 was provided by offsetting the side 3326 of the lower section 3323 with respect to the lip 3329 formed by the upper section 3324 by approximately 200-300 nm. The patterned glass sample was then treated to deposit an approximately 240 nm thick semiconducting layer 130, followed by an approximately 2 nm thick layer of Yb and an approximately 14 nm thick layer of Mg:Ag to form the second electrode 140. An approximately 3 nm thick layer of NIC 810 was deposited after the second electrode 140. The entire sample was exposed to an Mg vapor flux until a reference thickness of 200 nm was achieved.

Figure 12A:
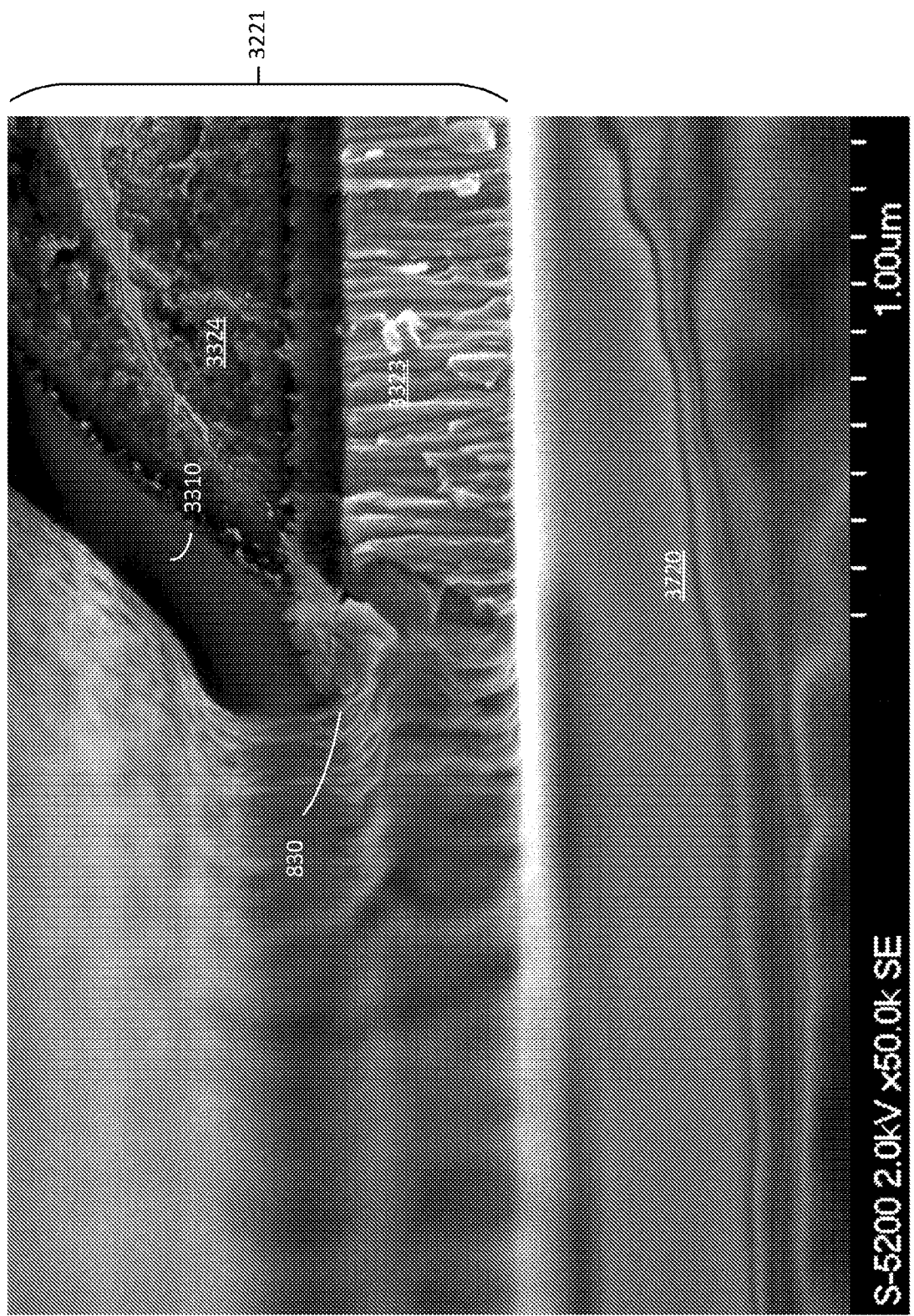
Figure 12B:
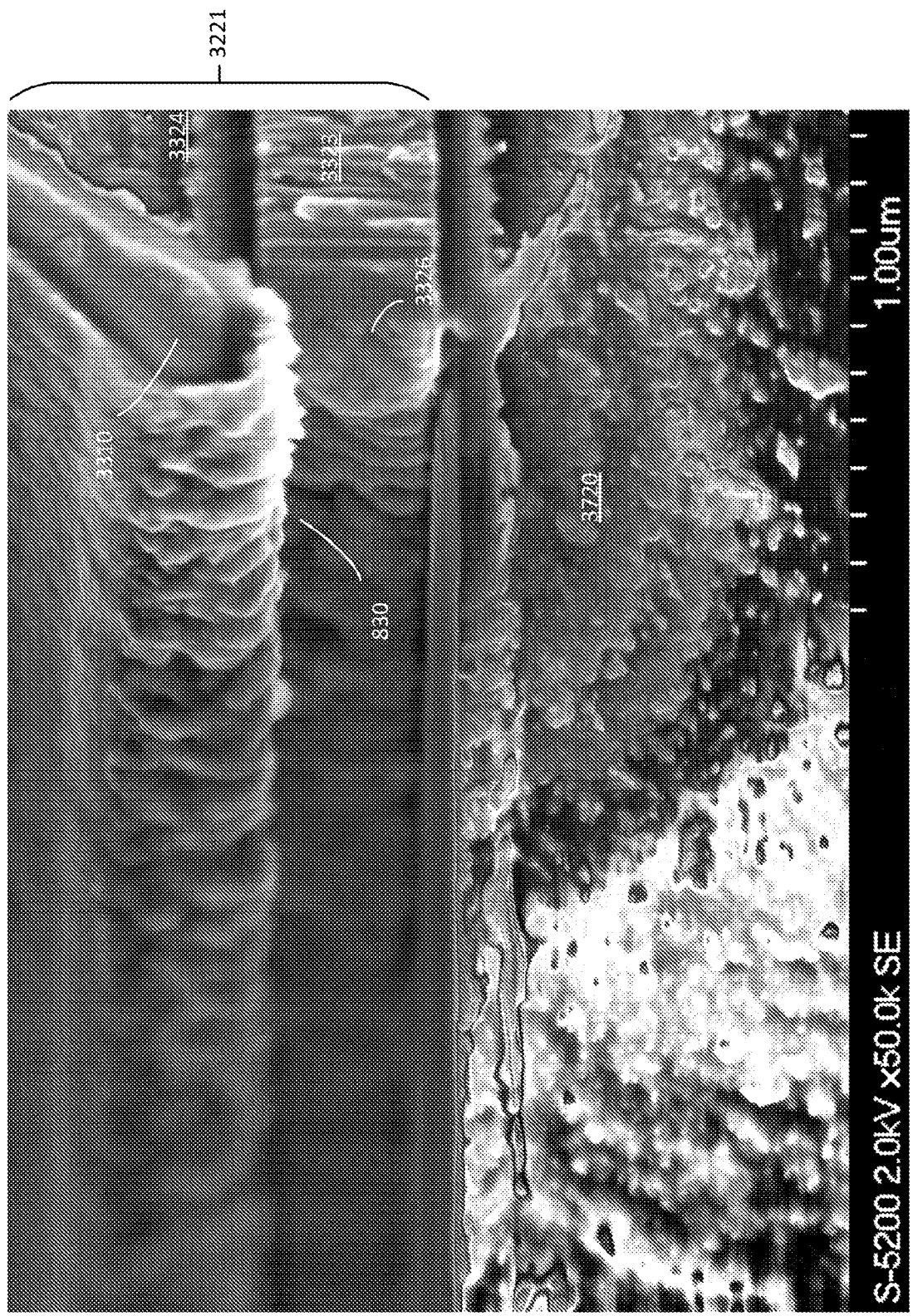

FIGS. 12A and 12B are cross-sectional images taken by SEM of the sample according to Example 4. As shown, the photoresist layer 3720 is provided over the glass substrate 110 and the lower section 3323 and the upper section 3324 of the partition 3221 are provided thereon. The partition device stack 3310 including the at least one semiconducting layer 130, the second electrode 140 and the NIC 810 are deposited on top of the upper section 3324 of the partition 3221. The conductive coating 830 is formed by deposition of Mg. Specifically, the conductive coating 830 is deposited on and/or over the lip 3329 and regions near and/or around the lip 3329 of the partition 3221. A subset of the conductive coating 830 extends beyond the recess 3222 to overlap with the device stack 3310 arranged proximate to the partition 3221. Another subset of the conductive coating 830 is disposed within the recess 3222 to cover the ceiling 3325 and extend laterally toward the lower section 3323 of the partition 3221. The conductive coating 830 further covers the side 3326. In this way, the conductive coating 830 is electrically coupled to the second electrode 140 of the device stack 3311 (not identified in the figures) as well as the lower section 3323 of the partition 3221, which is electrically conductive and may act as an auxiliary electrode 1750.

Example 5

Figure 13A:
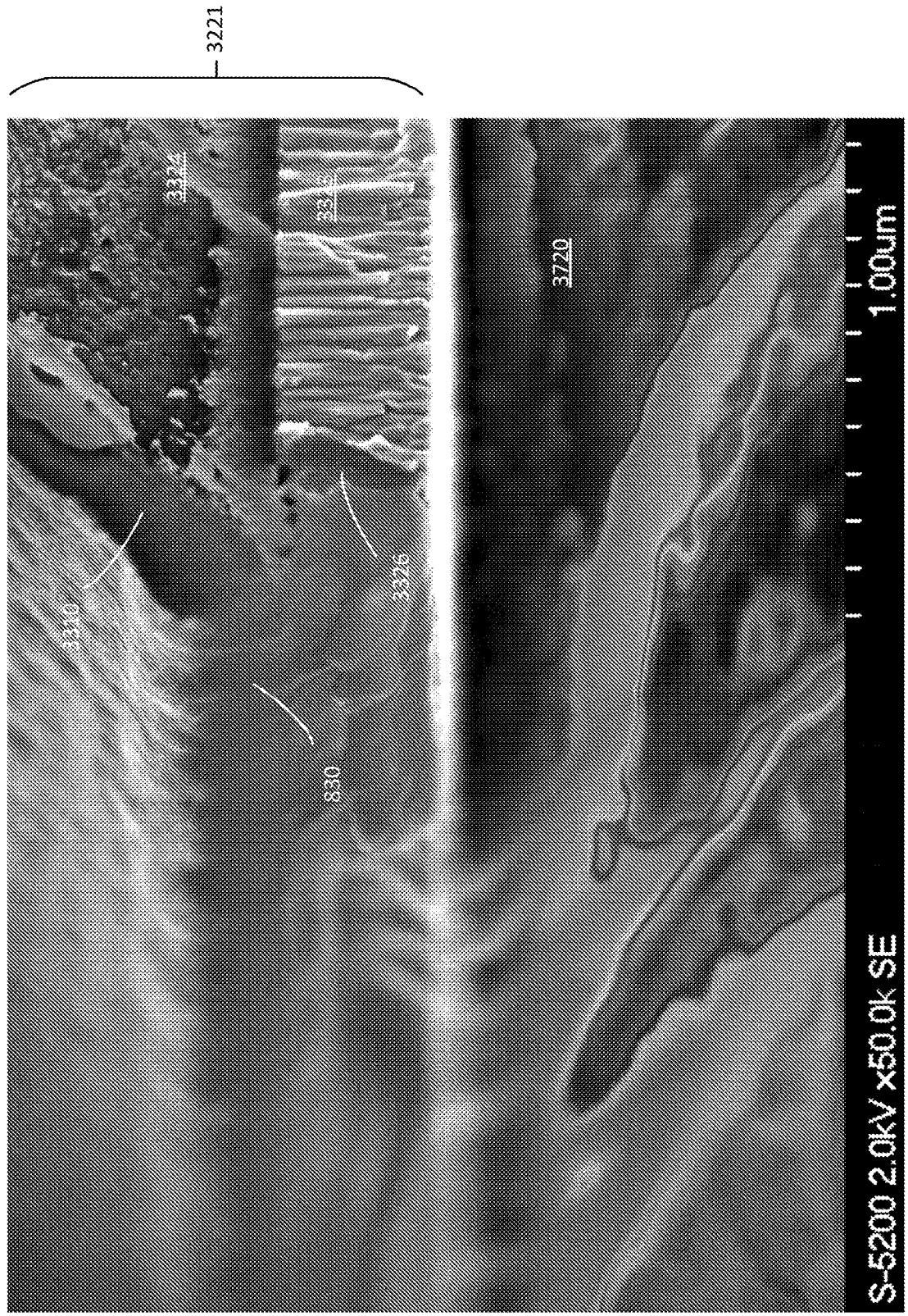
Figure 13B:

A sample similar to that of Example 4 was fabricated and analyzed. FIGS. 13A and 13B are cross-sectional images taken by SEM of the sample according to Example 5. As shown, the conductive coating 830 substantially fills the recess 3222 formed by the lateral offset between the upper section 3324 and the lower section 3323 of the partition 3221. More specifically, the ceiling 3325 (not identified in the figures), which is provided by a surface of the upper section 3324, is substantially coated by the conductive coating 830. Additionally, the side 3326 formed by the lower section 3323 is also substantially coated by the conductive coating 830. In this way, the conductive coating 830 is electrically coupled to the second electrode 140 of the partition device stack 3310, as well as the lower section 3323 of the partition 3221, which is electrically conductive and may act as an auxiliary electrode 1750.

In FIG. 13B, the device stack 3311 may also be seen.

Busbar(s)

In some non-limiting examples, a busbar 4150 that may act as an additional auxiliary electrode 1750 may be provided to further lower an effective sheet resistance of the second electrode 140. In some non-limiting examples, the busbar 4150 may be electrically coupled to the auxiliary electrode 1750, which may, in some non-limiting examples, be electrically coupled to the second electrode 140 by the conductive coating 830. In some non-limiting examples, such busbar 4150 may be provided in and/or adjacent to the substrate 110.

Figure 14A:
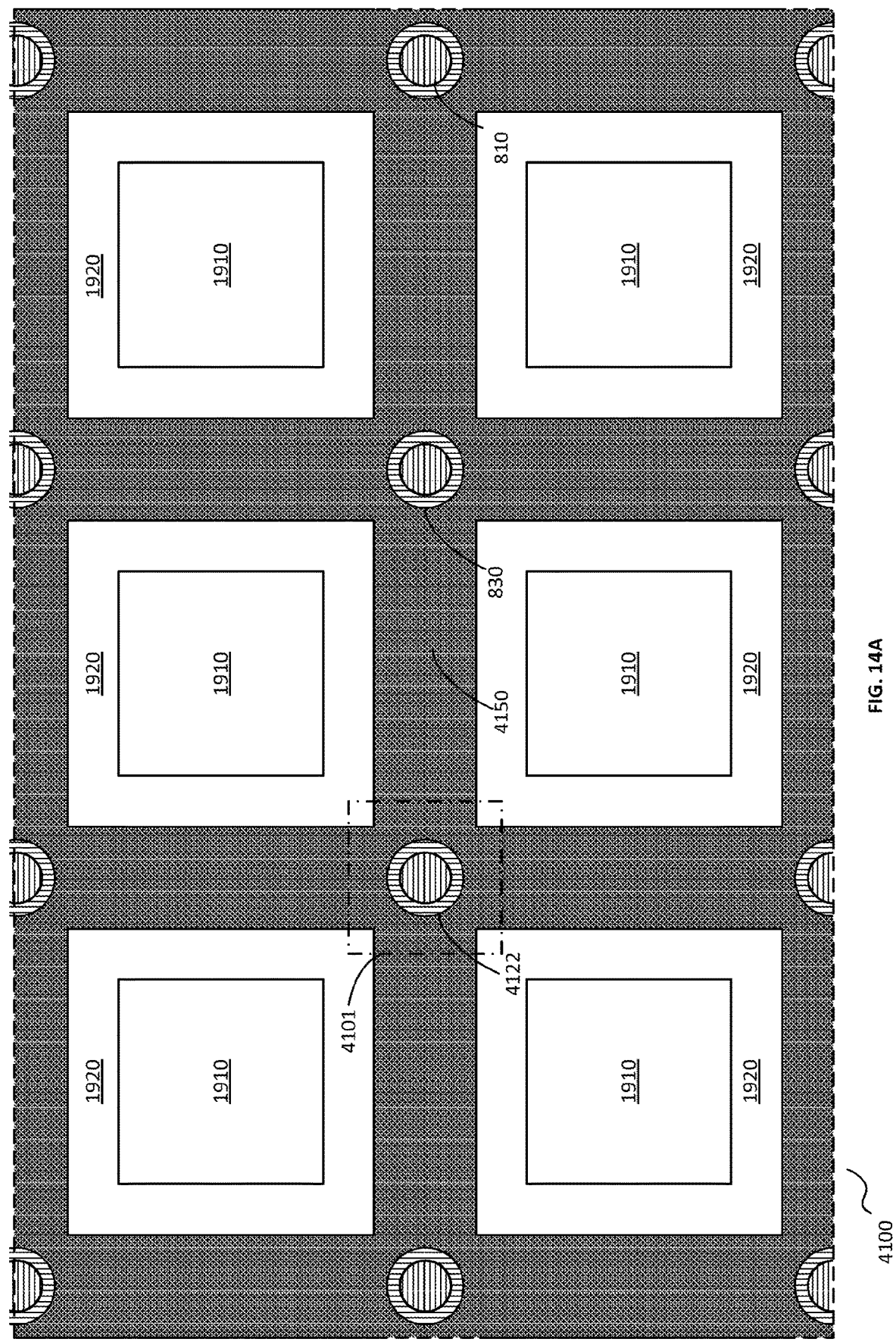
FIG. 14A is a schematic diagram illustrating, in plan view, an example arrangement of emissive regions and busbars running along surrounding non-emissive regions in an example version of the device of FIG. 1, according to an example in the present disclosure.

FIG. 14A shows, in plan view, in an example version 4100 of the device 100, a plurality of emissive regions 1910, each corresponding to a (sub-) pixel 340/264x. In some non-limiting examples, as shown, each emissive region 1910 has a substantially rectangular configuration. In some non-limiting examples, as shown, the emissive regions 1910 are aligned in a regularly spaced-apart pattern. Those having ordinary skill in the relevant art will appreciate that at least one of the configuration and pattern may be varied from that shown. Each emissive region 1910 is surrounded by at least one non-emissive region 1920.

At least one busbar 4150 disposed in and/or adjacent to the substrate 110, in some non-limiting examples, as shown, within the lateral aspect(s) 420 of the non-emissive region(s) 1920. In some non-limiting examples, as shown, the busbar(s) 4150 extend in a first lateral direction between adjacent emissive regions 1910. In some non-limiting examples, as shown, the busbar(s) 4150 also extend in a second lateral direction between adjacent emissive regions 1910, where the second lateral direction is substantially normal to the first lateral direction.

At least one sheltered region 3065 such as an aperture 4122, is formed within at least one non-emissive region 1920 to expose at least a part of at least one busbar 4150. In some non-limiting examples, as shown, the at least one aperture 4122 is located at an intersection of at least one busbar 4150 extending in the first lateral direction with at least one busbar 4150 extending in the second lateral direction.

Figure 14B:
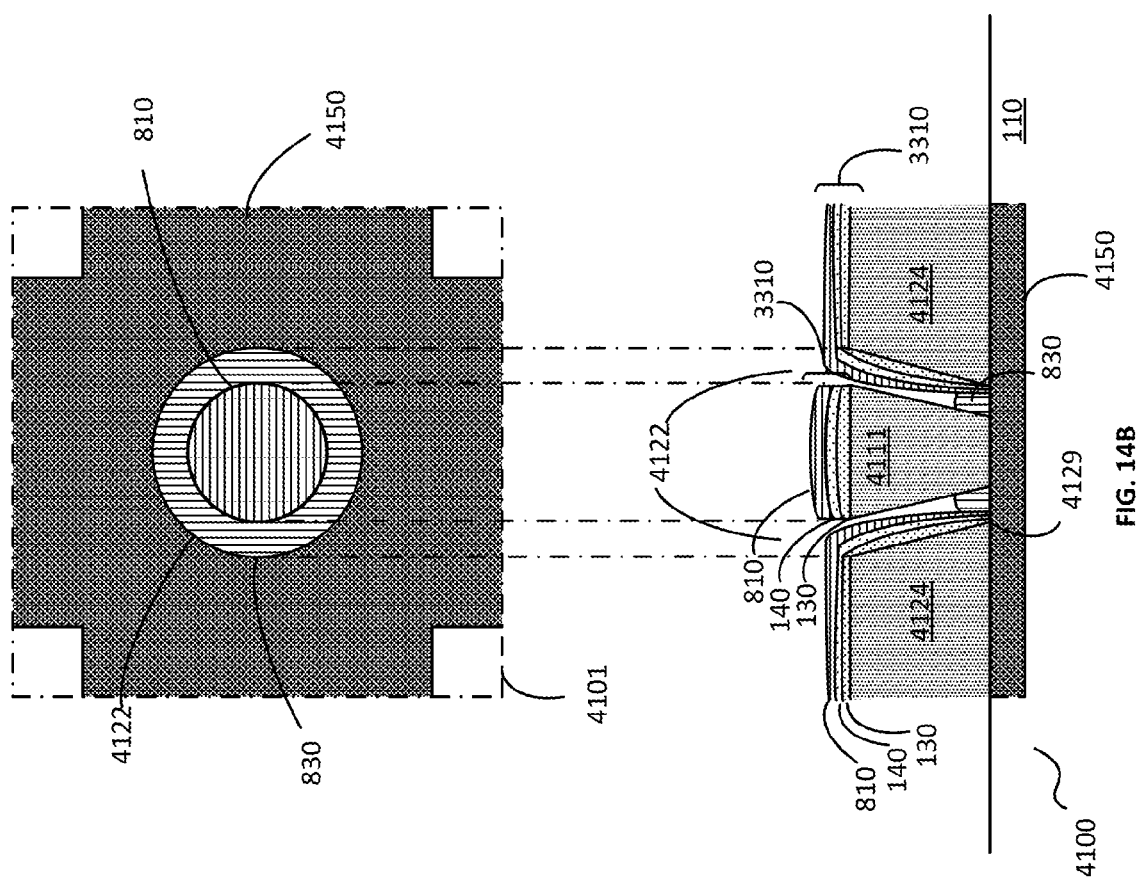
FIG. 14B is a schematic diagram illustrating a segment of a part of FIG. 14A, with a corresponding cross-sectional view, of at least one partition and a sheltered region, such as an aperture, by which the busbars may be electrically coupled to a second electrode in a device stack in an example version of the device of FIG. 1, according to an example in the present disclosure.

Turning now to FIG. 14B, there is shown a fragment of the device 4100 corresponding to a region 4101 encompassing an aperture 4122 at an intersection of busbars 4150 extending in each of the first and second lateral directions, in both plan view and in a cross-sectional view.

As shown, the aperture 4122 is formed by two facing angled sections 4124 similar to the angled section 3324 of partition 3221. In some non-limiting examples, as shown, the angled section 4124 does not have a lower section akin to lower section 3323 of partition 3221. Thus, in some non-limiting examples, as shown, the aperture 4122 does not have a recess 3222. Rather, the angled sections 4124 are disposed directly on the substrate 110.

Each of the angled sections 4124 have disposed thereon a device stack 3310. Additionally, the aperture 4122 has a partition device stack 3310 disposed between the angled sections 4124. In some non-limiting examples, as shown, the partition device stack 3310 is disposed on an undercut part 4111 disposed on the substrate 110 and spaced apart from the angled sections 4124. In some non-limiting examples, as shown, the undercut part 4111 raises the partition device stack 3310 to a level substantially comparable to a level of the partition device stacks 3311 on each of the angled sections 4124. Those having ordinary skill in the relevant art will appreciate that in some non-limiting examples, at least one of the partition device stacks 3310 shown on the angled section(s) 4124 may form part of the same structure as a device stack 3311 (not shown in the figure).

Thus, in some non-limiting examples, as shown, the profiles of the facing angled sections 4124 and the undercut part 4111 therebetween define an aperture 4122 that has a shape that may be described as a regular truncated annular conic section.

The busbar(s) 4150 are embedded within, disposed on and/or adjacent to the substrate 110.

Those having ordinary skill in the relevant art will appreciate that the at least one aperture(s) 4122 defined by the facing angled sections 4124 and/or the undercut part 4111 may be formed by selective deposition of material, including without limitation, photoresist while forming the PDL(s) 440. In some non-limiting examples, the deposited material, including without photoresist may be selectively removed after deposition and/or by etching, ablating and/or otherwise removing the deposited material.

After formation of the at least one aperture(s) 4122 and constituent facing angled sections 4124 and/or undercut part(s) 4111 thereof, the partition device stack(s) 3310 may be formed by deposition of the at least one semiconducting layer 130, the second electrode 140 and the NIC 810. In some non-limiting examples, as shown, the partition device stack(s) 3310 may extend substantially along the angled section 4124 to a lip 4129 thereof that is proximate to the exposed layer surface 111 of the busbar 4150.

In some non-limiting examples, at least one semiconducting layer 130, the second electrode 140 and/or the NIC 810 may be deposited using an open-mask and/or a mask-free deposition process. Nevertheless, during deposition of the at least one semiconducting layer 130, the second electrode 140 and/or the NIC 810, the angled configuration of the aperture 4122 may, in some non-limiting examples, be such that the aperture 4122 remains substantially devoid of these layers.

In some non-limiting examples, whether or not because the angled configuration of the at least one aperture 4122 allows deposition of at least one of these layers, the deposition of at least one of the semiconducting layer(s) 130, the second electrode 140 and/or the NIC 810 may employ a shadow mask, in some non-limiting examples, to ensure that at least the aperture 4122 remains substantially devoid of these layers.

After deposition of the NIC 810, the conductive coating 830 is deposited over the device 4100. In some non-limiting examples, the conductive coating 830 may be deposited using an open-mask and/or mask-free deposition process. In some non-limiting examples, the conductive coating 830 may be deposited by subjecting the device 4100 to an evaporated flux of a material for forming the conductive coating 830. By way of non-limiting example, a source (not shown) of conductive coating 830 material may be used to direct an evaporated flux of material for forming the conductive coating 830 towards the device 4100, such that the evaporated flux is incident on such surface. However, in some non-limiting examples, the surface of the NIC 810 disposed in the lateral aspect 410 of the emissive region 1910 and/or the lateral aspect 420 of at least a part of at least one of the non-emissive region 1920 exhibits a relatively low initial sticking coefficient $S_0$, the conductive coating 830 may selectively deposit onto a part, including without limitation, the aperture 4122 of the device 4100, where the NIC 810 is not present.

In some non-limiting examples, at least a part of the evaporated flux of the material for forming the conductive coating 830 may be directed at a non-normal angle relative to a lateral plane of the layer surface 111. By way of non-limiting example, at least a part of the evaporated flux may be incident on the device 4100 at an angle of incidence that is, relative to such lateral plane of the surface 4111, less than 90°, less than about 85°, less than about 80°, less than about 75°, less than about 70°, less than about 60°, and/or less than about 50°. By directing an evaporated flux of a material for forming the conductive coating 830, including at least a part thereof incident at a non-normal angle, at least one surface of and/or in the recess 4122 may be exposed to such evaporated flux.

In some non-limiting examples, a likelihood of such evaporated flux being precluded from being incident onto at least one surface of and/or in the recess 4122 due to the presence of the angled sections 4124, may be reduced since at least a subset of such evaporated flux may be flowed at a non-normal angle of incidence.

In some non-limiting examples, at least a subset of such evaporated flux may be non-collimated. In some non-limiting examples, at least a subset of such evaporated flux may be generated by an evaporation source that is a point source, a linear source and/or a surface source.

In some non-limiting examples, the device 4100 may be displaced during deposition of the conductive coating 830. By way of non-limiting example, the device 4100 and/or the substrate 110 thereof and/or any layer(s) deposited thereon, may be subjected to a displacement that is angular, in a lateral aspect and/or in an aspect substantially parallel to the cross-sectional aspect.

In some non-limiting examples, the device 4100 may be rotated about an axis that substantially normal to the lateral plane of the surface while being subjected to the evaporated flux.

In some non-limiting examples, at least a part of such evaporated flux may be directed toward the layer surface 111 of the device 4100 in a direction that is substantially normal to the lateral plane of the surface.

Without wishing to be bound by a particular theory, it is postulated that the material for forming the conductive coating 830 may nevertheless be deposited within the recess 4122 due to lateral migration and/or desorption of adatoms adsorbed onto the surface of the NIC 810. In some non-limiting examples, it is postulated that any adatoms adsorbed onto the surface of the NIC 810 may tend to migrate and/or desorb from such surface due to unfavorable thermodynamic properties of the surface for forming a stable nucleus. In some non-limiting examples, it is postulated that at least some of the adatoms migrating and/or desorbing off such surface may be re-deposited onto the surfaces in the recess 4122 to form the conductive coating 830.

As a result of the foregoing, the conductive coating 830 will tend to be deposited on the surface of the busbar 4150 that is exposed within the aperture 4122 and be electrically coupled thereto. Additionally, the conductive coating 830 will be electrically coupled to the second electrode 140 within the device stacks 3310 at and/or proximate to the lip 4129.

Those having ordinary skill in the relevant art will appreciate that, in some non-limiting examples, there may be a lower section 3323 below one or both angled sections 4124, so as to define a recess 3222 therein. If present, in some non-limiting examples, an auxiliary electrode 1750 may engage the recess 4122 in a manner such as described in any one of FIGS. 7A-7G, such that the conductive coating 830, by being deposited within such recess 4122, may also be electrically coupled to the auxiliary electrode 1750.

Those having ordinary skill in the relevant art will appreciate that while various examples have been illustrated and described with reference to a device 4100 having angled sections 4124, various features described herein may be combined with other devices and/or structures. In some non-limiting examples, the process, materials and/or features described herein may be used in conjunction with devices, including those having an "undercut" feature, such as are described, without limitation, in at least one of U.S. Pat. No. 9,024,307, United States Patent Application Publication No. 2015/0144902, U.S. Pat. Nos. 10,090,370, 9,859,520, 9,954,039, United States Patent Application Publication No. 2017/0125495, U.S. Pat. No. 9,570,471, United States Patent Application Publication No. 2018/0123078, U.S. Pat. No. 9,478,591 and/or European Patent Application Publication No. 3240036.

In the present disclosure, the terms "overlap" and/or "overlapping" may refer generally to two or more layers and/or structures arranged to intersect a cross-sectional axis extending substantially normally away from a surface onto which such layers and/or structures may be disposed.

Where features or aspects of the present disclosure are described in terms of Markush groups, it will be appreciated by those having ordinary skill in the relevant art that the present disclosure is also thereby described in terms of any individual member of sub-group of members of such Markush group.

TERMINOLOGY

References in the singular form include the plural and vice versa, unless otherwise noted.

As used herein, relational terms, such as "first" and "second", and numbering devices such as "a", "b" and the like, may be used solely to distinguish one entity or element from another entity or element, without necessarily requiring or implying any physical or logical relationship or order between such entities or elements.

The terms "including" and "comprising" are used expansively and in an open-ended fashion, and thus should be interpreted to mean "including, but not limited to". The terms "example" and "exemplary" are used simply to identify instances for illustrative purposes and should not be interpreted as limiting the scope of the invention to the stated instances. In particular, the term "exemplary" should not be interpreted to denote or confer any laudatory, beneficial or other quality to the expression with which it is used, whether in terms of design, performance or otherwise.

The terms "couple" and "communicate" in any form are intended to mean either a direct connection or indirect connection through some interface, device, intermediate component or connection, whether optically, electrically, mechanically, chemically, or otherwise.

The terms "on" or "over" when used in reference to a first component relative to another component, and/or "covering" or which "covers" another component, may encompass situations where the first component is direct on (including without limitation, in physical contact with) the other component, as well as cases where one or more intervening components are positioned between the first component and the other component.

Directional terms such as "upward", "downward", "left" and "right" are used to refer to directions in the drawings to which reference is made unless otherwise stated. Similarly, words such as "inward" and "outward" are used to refer to directions toward and away from, respectively, the geometric center of the device, area or volume or designated parts thereof. Moreover, all dimensions described herein are intended solely to be by way of example of purposes of illustrating certain embodiments and are not intended to limit the scope of the disclosure to any embodiments that may depart from such dimensions as may be specified.

As used herein, the terms "substantially", "substantial", "approximately" and/or "about" are used to denote and account for small variations. When used in conjunction with an event or circumstance, such terms can refer to instances in which the event or circumstance occurs precisely, as well as instances in which the event or circumstance occurs to a close approximation. By way of non-limiting example, when used in conjunction with a numerical value, such terms may refer to a range of variation of less than or equal to ±10% of such numerical value, such as less than or equal to ±5%, less than or equal to ±4%, less than or equal to ±3%, less than or equal to ±2%, less than or equal to ±1%, less than or equal to ±0.5%, less than or equal to ±0.1%, and/or less than equal to ±0.05%.

As used herein, the phrase "consisting substantially of" will be understood to include those elements specifically recited and any additional elements that do not materially affect the basic and novel characteristics of the described technology, while the phrase "consisting of" without the use of any modifier, excludes any element not specifically recited.

As will be understood by those having ordinary skill in the relevant art, for any and all purposes, particularly in terms of providing a written description, all ranges disclosed herein also encompass any and all possible sub-ranges and/or combinations of sub-ranges thereof. Any listed range may be easily recognized as sufficiently describing and/or enabling the same range being broken down at least into equal fractions thereof, including without limitation, halves, thirds, quarters, fifths, tenths etc. As a non-limiting example, each range discussed herein may be readily be broken down into a lower third, middle third and/or upper third, etc.

As will also be understood by those having ordinary skill in the relevant art, all language and/or terminology such as "up to", "at least", "greater than", "less than", and the like, may include and/or refer the recited range(s) and may also refer to ranges that may be subsequently broken down into sub-ranges as discussed herein.

As will be understood by those having ordinary skill in the relevant art, a range includes each individual member of the recited range.

General

The purpose of the Abstract is to enable the relevant patent office or the public generally, and specifically, persons of ordinary skill in the art who are not familiar with patent or legal terms or phraseology, to quickly determine from a cursory inspection, the nature of the technical disclosure.

The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are considered to be merely illustrative of the scope of the present disclosure.

It should be appreciated that the present disclosure, which is described by the claims and not by the implementation details provided, and which can be modified by varying, omitting, adding or replacing and/or in the absence of any element(s) and/or limitation(s) with alternatives and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in one or more of the above-described examples, whether or not described an illustrated as discrete or separate, may be combined or integrated in another system without departing from the scope of the present disclosure, to create alternative examples comprised of a combination or sub-combination of features that may not be explicitly described above, or certain features may be omitted, or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects and examples of the disclosure, as well as specific examples thereof, are intended to encompass both structural and functional equivalents thereof and to cover and embrace all suitable changes in technology. Additionally, it is intended that such equivalents include both currently-known equivalents as well as equivalents developed in the future, i.e., any elements developed that perform the same function, regardless of structure.

Accordingly, the specification and the examples disclosed therein are to be considered illustrative only, with a true scope of the disclosure being disclosed by the following numbered claims:

What is claimed is:

1. An opto-electronic device having a plurality of layers, comprising:
    a nucleation-inhibiting coating (NIC) disposed on a first layer surface in a first portion of a lateral aspect thereof, the first portion comprising a first electrode, a second electrode and a semiconducting layer between the first electrode and the second electrode, wherein the second electrode lies between the NIC and the semiconducting layer in the first portion;
    a conductive coating disposed on a second layer surface in a second portion of the lateral aspect thereof;
    wherein an initial sticking probability for forming the conductive coating onto a surface of the NIC in the first portion is substantially less than the initial sticking probability for forming the conductive coating onto the second layer surface in the second portion, such that the first portion is substantially devoid of a closed film of the conductive coating; and
    wherein the conductive coating is electrically coupled to the second electrode and to a third electrode in a sheltered region of a partition in the opto-electronic device.

2. The opto-electronic device of claim 1, wherein the first portion comprises at least one emissive region.

3. The opto-electronic device of claim 1, wherein the second portion comprises at least a part of a non-emissive region.

4. The opto-electronic device of claim 1, wherein the sheltered region is substantially devoid of the NIC.

5. The opto-electronic device of claim 1, wherein the sheltered region comprises a recess defined by the partition.

6. The opto-electronic device of claim 5, wherein the recess extends substantially laterally within the partition.

7. The opto-electronic device of claim 5, wherein the recess has a ceiling, a side and a floor.

8. The opto-electronic device of claim 7, wherein the third electrode is provided on at least one of the ceiling, the side, the floor and any combination of any of these.

9. The opto-electronic device of claim 7, wherein at least one of the ceiling and the side are defined by the partition.

10. The opto-electronic device of claim 5, wherein the conductive coating is disposed within the recess.

11. The opto-electronic device of claim 5, wherein the partition comprises a lower section and an upper section.

12. The opto-electronic device of claim 11, wherein the lower section is laterally recessed relative to the upper section to form the recess.

13. The opto-electronic device of claim 11, wherein the lower section comprises the third electrode.

14. The opto-electronic device of claim 1, wherein the third electrode is integrally formed within the partition.

15. The opto-electronic device of claim 1, wherein the conductive coating is in physical contact with the third electrode.

16. The opto-electronic device of claim 1, wherein the conductive coating is electrically coupled to the second electrode in a coupling region (CR).

17. The opto-electronic device of claim 16, wherein the NIC is disposed between the conductive coating and the second electrode in the CR.

18. The opto-electronic device of claim 1, wherein the sheltered region comprises an aperture defined by the partition.

19. The opto-electronic device of claim 18, wherein the aperture opens into a recess defined by the partition.

20. The opto-electronic device of claim 18, wherein the aperture is angled relative to an axis extending normally away from a surface of the device.

21. The opto-electronic device of claim 18, wherein the aperture has an annular conic profile.

22. The opto-electronic device of claim 18, wherein the aperture exposes a surface of the third electrode.

23. The opto-electronic device of claim 22, wherein the third electrode is provided on a substrate of the device.

24. The opto-electronic device of claim 22, wherein the third electrode is integrally formed within a substrate of the device.

25. The opto-electronic device of claim 22, further comprising an undercut portion that overlaps a layer surface of the third electrode in a cross-sectional aspect.

26. The opto-electronic device of claim 1, wherein the third electrode is an auxiliary electrode electrically coupled to a busbar.

27. The opto-electronic device of claim 1, further comprising:
- a further NIC disposed on a third layer surface of the opto-electronic device in a third portion of a lateral aspect thereof; and
- a further conductive coating disposed on a fourth layer surface of the opto-electronic device in a fourth portion of the lateral aspect thereof.

28. The opto-electronic device of claim 27, wherein the third portion comprises at least one emissive region.

29. The opto-electronic device of claim 28, wherein the fourth portion comprises at least a part of a non-emissive region.

30. The opto-electronic device of claim 27, wherein the fourth portion comprises at least one emissive region.

31. The opto-electronic device of claim 30, wherein the third portion comprises at least a part of a non-emissive region.

32. The opto-electronic device of claim 31, wherein the third portion is substantially light-transmissive therethrough.

33. The opto-electronic device of claim 27, further comprising a fourth electrode, a fifth electrode and a further semiconducting layer between the fourth electrode and the fifth electrode, wherein the fifth electrode extends between the further NIC and the further semiconducting layer in the third portion.

* * * * *